(12) United States Patent
Juengling

(10) Patent No.: US 8,537,608 B2
(45) Date of Patent: *Sep. 17, 2013

(54) DATA CELLS WITH DRIVERS AND METHODS OF MAKING AND OPERATING THE SAME

(75) Inventor: Werner Juengling, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/612,361

(22) Filed: Sep. 12, 2012

(65) Prior Publication Data

US 2013/0005102 A1    Jan. 3, 2013

Related U.S. Application Data

(60) Continuation of application No. 13/108,156, filed on May 16, 2011, which is a division of application No. 12/062,354, filed on Apr. 3, 2008, now Pat. No. 7,969,776.

(51) Int. Cl.
*G11C 11/34* (2006.01)

(52) U.S. Cl.
USPC .............. 365/174; 365/149; 365/189.011; 257/E21.158; 438/585

(58) Field of Classification Search
USPC ... 365/149, 189.011; 438/585; 257/E21.158
See application file for complete search history.

(56) References Cited

U.S. PATENT DOCUMENTS

| | | | |
|---|---|---|---|
| 3,885,861 A | 5/1975 | Farnsworth et al. | |
| 5,160,987 A | 11/1992 | Pricer et al. | |
| 5,196,910 A | 3/1993 | Moriuchi et al. | |
| 5,386,132 A | 1/1995 | Wong | |
| 5,661,061 A | 8/1997 | Usuami et al. | |
| 5,821,513 A | 10/1998 | O'Hagan et al. | |
| 5,858,829 A | 1/1999 | Chen | |
| 5,925,918 A | 7/1999 | Wu et al. | |
| 5,949,057 A | 9/1999 | Feng | |
| 6,008,513 A | 12/1999 | Chen | |
| 6,043,562 A | 3/2000 | Keeth | |
| 6,081,008 A | 6/2000 | Rostoker | |

(Continued)

FOREIGN PATENT DOCUMENTS

DE    19946719    4/2001
JP    2006054431   2/2006

(Continued)

OTHER PUBLICATIONS

Ahn et al., "An Experimental 256Mb Non-Volatile DRAM with Cell Plate Boosted Programming Technique", IEEE International Solid-State Circuits Conference, ISSCC 2004/Session 2/Non-Volatile Memory/2.2, 2004.

Chan et al., "Notch Elimination in Polycide Gate Stack Etching for Advanced DRAM Technology", Center for Technol. Dev., Worldwide Semicond. Manuf. Corp., Hsinchu, http://ieeexplore.ieee.org/xpl/freeabs_all.jsp?tp=&arnumber=883094&isnumber=19090.

(Continued)

*Primary Examiner* — Fernando Hidalgo
(74) *Attorney, Agent, or Firm* — Wells St. John, P.S.

(57) ABSTRACT

Disclosed are methods and devices, among which is a device that includes a first semiconductor fin having a first gate, a second semiconductor fin adjacent the first semiconductor fin and having a second gate, and a third gate extending between the first semiconductor fin and the second semiconductor fin. In some embodiments, the third gate may not be electrically connected to the first gate or the second gate.

18 Claims, 61 Drawing Sheets

(56) References Cited

U.S. PATENT DOCUMENTS

| | | | |
|---|---|---|---|
| 6,100,129 A | 8/2000 | Tu et al. | |
| 6,130,551 A | 10/2000 | Agrawal et al. | |
| 6,216,257 B1 | 4/2001 | Agrawal et al. | |
| 6,258,656 B1 | 7/2001 | Lange et al. | |
| 6,258,659 B1 | 7/2001 | Gruening et al. | |
| 6,268,243 B1 | 7/2001 | Park | |
| 6,282,113 B1 | 8/2001 | DeBrosse | |
| 6,316,309 B1 | 11/2001 | Holmes et al. | |
| 6,380,759 B1 | 4/2002 | Agrawal et al. | |
| 6,432,769 B1 | 8/2002 | Fukuda et al. | |
| 6,440,792 B1 | 8/2002 | Shiao et al. | |
| 6,504,755 B1 | 1/2003 | Katayama et al. | |
| 6,689,660 B1 | 2/2004 | Noble et al. | |
| 6,845,033 B2 | 1/2005 | Kirihata et al. | |
| 6,897,107 B2 | 5/2005 | Divakaruni et al. | |
| 6,927,462 B2 | 8/2005 | Goodwin et al. | |
| 6,967,147 B1 | 11/2005 | Tews et al. | |
| 6,998,666 B2 | 2/2006 | Beintner et al. | |
| 7,091,543 B2 | 8/2006 | Tzeng et al. | |
| 7,098,105 B2 | 8/2006 | Juengling | |
| 7,099,216 B2 | 8/2006 | Luk et al. | |
| 7,132,333 B2 | 11/2006 | Schloesser et al. | |
| 7,151,023 B1 | 12/2006 | Nayfeh et al. | |
| 7,190,060 B1 | 3/2007 | Chiang | |
| 7,195,995 B2 | 3/2007 | Mouli | |
| 7,205,606 B2 | 4/2007 | Tran | |
| 7,345,937 B2 | 3/2008 | Yoon et al. | |
| 7,742,324 B2 | 6/2010 | Juengling | |
| 7,808,042 B2 | 10/2010 | Juengling | |
| 7,879,659 B2 | 2/2011 | Wilson et al. | |
| 2001/0003034 A1 | 6/2001 | Furukawa et al. | |
| 2001/0046753 A1* | 11/2001 | Gonzalez et al. | 438/424 |
| 2002/0155656 A1 | 10/2002 | Hayano et al. | |
| 2003/0117865 A1 | 6/2003 | Hofmann et al. | |
| 2003/0168676 A1 | 9/2003 | Itabashi et al. | |
| 2003/0198073 A1 | 10/2003 | Keeth | |
| 2004/0027848 A1 | 2/2004 | Wald et al. | |
| 2004/0043592 A1 | 3/2004 | Goodwin et al. | |
| 2004/0062069 A1 | 4/2004 | Keeth | |
| 2004/0125636 A1 | 7/2004 | Kurjanowicz et al. | |
| 2004/0202027 A1 | 10/2004 | Kuzmenka et al. | |
| 2005/0024936 A1* | 2/2005 | Forbes | 365/185.01 |
| 2005/0094453 A1* | 5/2005 | Forbes | 365/205 |
| 2005/0133852 A1 | 6/2005 | Shau | |
| 2005/0139884 A1 | 6/2005 | Lane | |
| 2005/0151206 A1 | 7/2005 | von Schwerin | |
| 2005/0196918 A1 | 9/2005 | von Schwerin | |
| 2005/0245024 A1 | 11/2005 | von Schwerin | |
| 2005/0280102 A1 | 12/2005 | Oh et al. | |
| 2006/0006446 A1 | 1/2006 | von Schwerin | |
| 2006/0028861 A1 | 2/2006 | Han et al. | |
| 2006/0057814 A1 | 3/2006 | Weis | |
| 2006/0073662 A1 | 4/2006 | Jang et al. | |
| 2006/0076602 A1 | 4/2006 | Harter et al. | |
| 2006/0084195 A1 | 4/2006 | Lyu | |
| 2006/0131637 A1 | 6/2006 | Kakoschke et al. | |
| 2006/0131651 A1 | 6/2006 | Sato et al. | |
| 2006/0220134 A1 | 10/2006 | Huo et al. | |
| 2006/0244106 A1 | 11/2006 | Morikado | |
| 2006/0245238 A1 | 11/2006 | Turner | |
| 2006/0246607 A1 | 11/2006 | Fazan et al. | |
| 2006/0258109 A1 | 11/2006 | Juengling | |
| 2006/0270151 A1 | 11/2006 | Lee | |
| 2006/0273415 A1 | 12/2006 | Kim | |
| 2006/0281249 A1* | 12/2006 | Yilmaz et al. | 438/243 |
| 2006/0281250 A1 | 12/2006 | Schloesser | |
| 2007/0010058 A1 | 1/2007 | Juengling | |
| 2007/0023805 A1 | 2/2007 | Wells et al. | |
| 2007/0052040 A1 | 3/2007 | von Schwerin | |
| 2007/0104010 A1 | 5/2007 | Hardy et al. | |
| 2007/0111455 A1 | 5/2007 | Kim et al. | |
| 2007/0121414 A1 | 5/2007 | Butler | |
| 2007/0134878 A1 | 6/2007 | Brask et al. | |
| 2007/0145450 A1 | 6/2007 | Wang et al. | |
| 2007/0166933 A1 | 7/2007 | Song et al. | |
| 2007/0170522 A1 | 7/2007 | Lee et al. | |
| 2007/0176221 A1 | 8/2007 | Nakamura | |
| 2007/0176222 A1 | 8/2007 | Ikemasu et al. | |
| 2007/0176253 A1 | 8/2007 | Wang et al. | |
| 2007/0190736 A1 | 8/2007 | Liu et al. | |
| 2007/0262375 A1 | 11/2007 | Juengling | |
| 2008/0064160 A1* | 3/2008 | Kim et al. | 438/233 |
| 2008/0242034 A1 | 10/2008 | Mokhlesi et al. | |
| 2008/0296702 A1* | 12/2008 | Lee et al. | 257/401 |
| 2009/0146243 A1 | 6/2009 | Lee | |
| 2009/0206400 A1 | 8/2009 | Juengling | |
| 2009/0206443 A1 | 8/2009 | Juengling | |
| 2009/0224357 A1 | 9/2009 | Juengling | |
| 2009/0237996 A1 | 9/2009 | Juengling | |
| 2009/0238010 A1 | 9/2009 | Juengling | |
| 2009/0251946 A1 | 10/2009 | Juengling | |
| 2009/0294842 A1 | 12/2009 | Juengling | |

FOREIGN PATENT DOCUMENTS

| | | |
|---|---|---|
| JP | 2006313911 | 11/2006 |
| KR | 19930005234 | 6/1993 |
| KR | 20020018071 | 3/2002 |
| TW | 380316 | 1/2000 |
| TW | 388125 | 4/2000 |
| TW | 098109791 | 6/2012 |
| WO | WO9728532 | 8/1997 |
| WO | WO0161738 | 8/2001 |
| WO | WO0231878 | 4/2002 |
| WO | WO0249100 | 6/2002 |
| WO | WO2004038770 | 5/2004 |
| WO | PCT/US2090/036180 | 10/2009 |
| WO | PCT/US2009/036180 | 10/2010 |

OTHER PUBLICATIONS

Claeys, "technological Challenges of Advanced CMOS processing and their impact on design aspects", Proceedings of the 17th international conference on VLSI design (VLSID '04); 1063-9667/04; IEEE computer society; Lueven, Belgium.

Curanovic, "Development of a fully-depleted thin-body FinFET process", Dept of microelectronic engineering, college of engineering; Rochester Institute of technology; rochester, New York; Nov. 2003.

Endoh et al., New three-Dimensional Memory Array Architecture for Future Ultrahigh-Density DRAM, Res. Int. of electrical Communication, Tohoku University, Sendai, Solid State Circuits, IEEE Jouranl, Apr. 1999, vol. 34, Issue 4, pp. 476-483.

Fishburn et al., "A 78nm 6F2 DRAM Technology for Multigigabit Densities", Micron Technology, Inc., Boise, Idaho, 2 pages.

Gili, "Fabrication of Vertical MOSFETs with reduced Parasitics and Suppression of Short Channel Effects", Dept. of Electronics and computer science, Microelectronics Group, University of Southampton, Jun. 2004.

Ikeda et al., High-Speed DRAM Architecture Development, NEC Corp, Sagamihara, Solid State Circuits, IEEE Journal, May 1999, vol. 34, Issue 5, pp. 685-692, http://ieeexploreieee.org/xpls/abs_all.jsp?arnumber=760380&isnumber=16453.

Katsumata et al., "Fin-Array-FET on bulk silicon for sub-100nm Trench Capacitor DRAM", 2003 Symposium on VLSI Technology Digest of Technical Papers, Jun. 2003, 2 pages.

Park et al., "Fabrication of Body-Tied FinFETs (Oega MOSFETs) Using Bulk Si Wafers", 2003 Symposium on VLSI Technology Digest of Technical Papers, Jun. 2003, 2 pages.

Park et al., Fully Integrated Advanced Bulk FinFETs Architecture Featuring Partially-Insulating Technique for DRAM Cell Application of 40nm Generation and Beyond.

Prince, Ph.D., "Trends in scaled and nanotechnology memories", Memory Strategies International; Leander, Texas; 2005.

Sturm et al., "Increased Transconductance in Fully-Depleted Ultra-Thin Silicon-on-INsulator MOSFETs", 6 pages.

Takashima et al., "A cell transistor scalable DRAM array Architecture", Memory LSI Res. & Dev. Center, Toshiba Corp, Yokohama, Solid-State Circuits, IEEE Journal, May 2002, vol. 37, Issue 5, pp. 587-591.

Yu et al., "A Two-Step Spacer Etch for High-Aspect-Ration Gate Stack Process", IBM Microelectronics, http://www.mrs.org/s_mrs/s_mrs/sec_subscribe.asp?CID=2353&DID=113693&ation=detail.

* cited by examiner

US 8,537,608 B2

DATA CELLS WITH DRIVERS AND METHODS OF MAKING AND OPERATING THE SAME

RELATED PARENT DATA

This patent resulted from a continuation of U.S. patent application Ser. No. 13/108156, filed May 16, 2011, entitled "Data Cells with Drivers and Methods of Making and Operating the Same" naming Werner Juengling as inventor, which is a divisional application of U.S. patent application Ser. No. 12/062,354, filed Apr. 3, 2008, entitled "Data Cells with Drivers and Methods of Making and Operating the Same" naming Werner Juengling as inventor, the disclosures of which are incorporated by reference.

FIELD OF INVENTION

Embodiments of the invention relate generally to electronic devices and, more specifically, in certain embodiments, to electronic devices having data cells with drivers.

DESCRIPTION OF RELATED ART

Many types of electronic devices have a plurality of data cells. Typically, the data cells each include a data element (e.g., a memory element, an imaging element, or other device configured to output data, such as various kinds of sensors) and, in some instances, an access device, such as a transistor or diode. Generally, the access device controls access to the data element, and the data element outputs signals indicative of stored or sensed data.

In some electronic devices, the signals from the data elements are too weak to be reliably sensed. Typically, the data elements are made relatively small to increase the functionality of electronic devices and lower their cost. One consequence of this practice, though, is that some data elements output signals that are relatively weak, e.g., of low intensity. As a result, it can be difficult to use the signals for useful purposes, such as indicating a digital value (e.g., 0, 1, 00, 01, etc.) or an analog value that is stored or sensed by a data element.

BRIEF DESCRIPTION OF THE DRAWINGS

FIGS. 30-38 illustrate a process for forming a data element connected to the access device and the driver of FIGS. 1-30;

DETAILED DESCRIPTION

Figure 1:
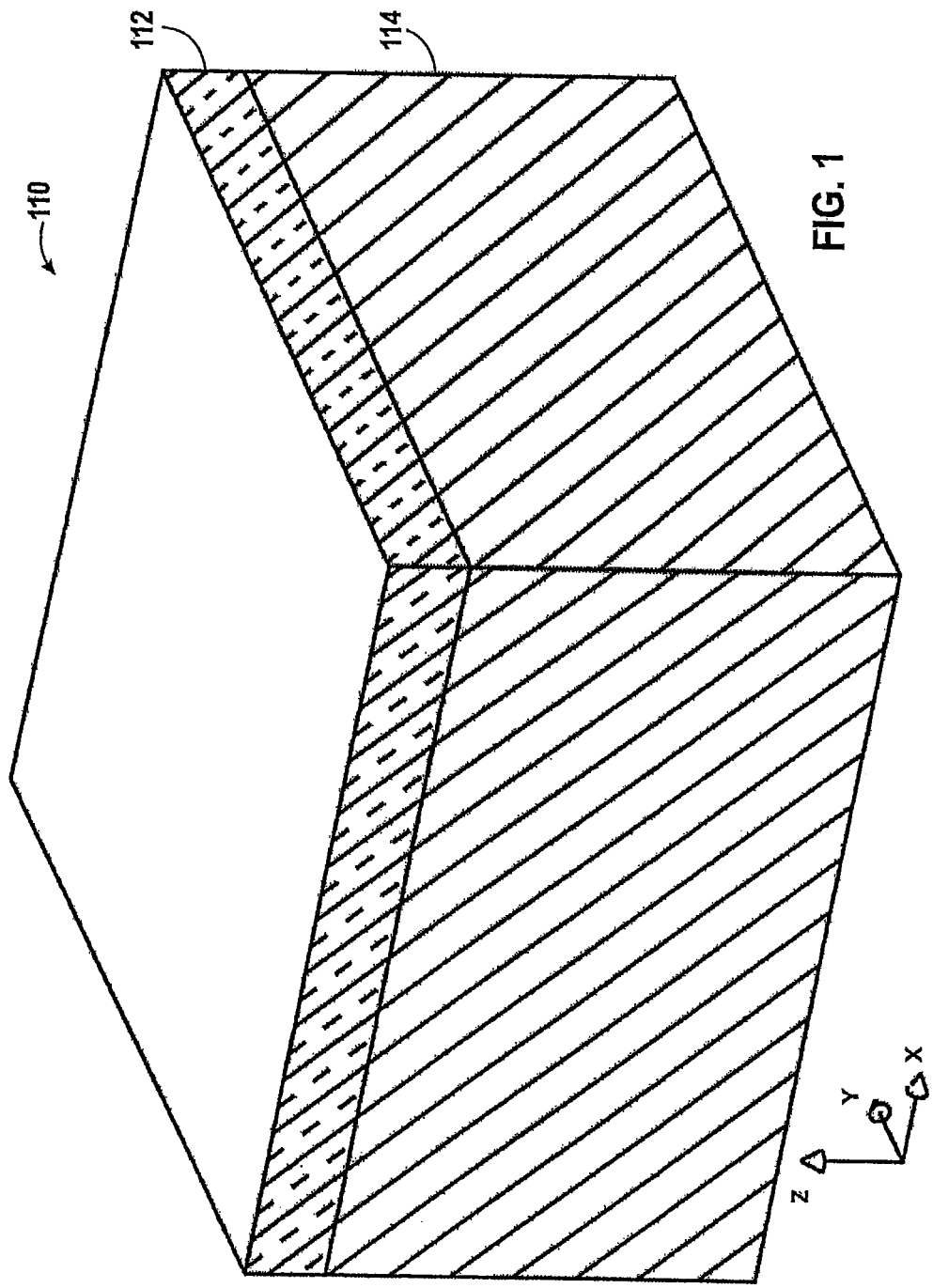
FIGS. 1-29 illustrate steps in a process for forming an access device and a driver in accordance with an embodiment of the present technique.

FIG. 1 illustrates a first step in a process for forming an access device and a driver. The process may begin with providing a substrate 110. The substrate 110 may include semi-conductive materials such as single-crystal or poly-crystalline silicon, gallium arsenide, indium phosphide, or other materials with semiconductor properties. Alternately, or additionally, the substrate 110 may include a non-semiconductor body on which an electronic device may be constructed, e.g., a body such as a plastic or ceramic work surface. The term "substrate" encompasses these structures in a variety of stages of manufacture, including an unprocessed whole wafer, a partially-processed whole wafer, a fully-processed whole wafer, a portion of a diced wafer, or a portion of a diced wafer in a packaged electronic device.

The substrate 110 may include an upper doped region 112 and a lower doped region 114. The depth of the upper doped region 112 may be generally uniform over a substantial area of the substrate 110, and the upper doped region 112 may be doped differently from the lower doped region 114. For example, the upper-doped region 112 may include an n+ material and the lower-doped region 114 may include a p− material or vise versa.

Figure 2:
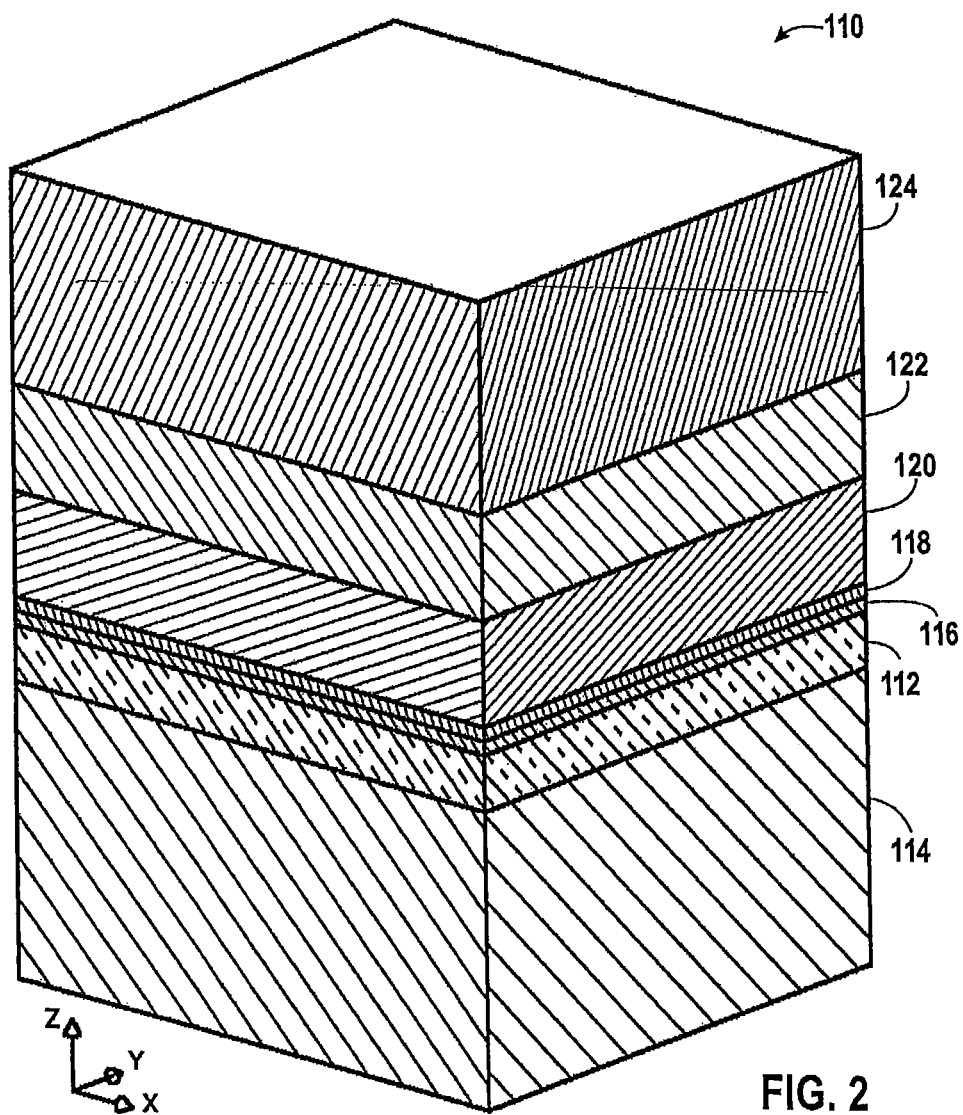

Next, several films may be formed on the substrate 110, as illustrated by FIG. 2. A pad oxide 116 may be formed directly on the upper doped region 112. The pad oxide 116 may have a thickness less than 300 Å, e.g., generally near 80 Å. A stop body (e.g., a layer) 118 may be formed on the pad oxide 116. The stop body 118 may include a nitride and it may have a thickness less than 300 Å, e.g., generally near 95 Å, but like the other structures described herein, the stop body 118 is not limited to these dimensions or materials. A sacrificial body 120 may be formed on the stop body 118. The sacrificial body 120 may be made of polysilicon and it may have a thickness between 500 Å and 2,000 Å, e.g., generally near 1000 Å. A lower masking body 122 may be formed on the sacrificial body 120. The lower masking body 122 may be made of an oxide and it may have a thickness between 500 Å and 2,000 Å, e.g., generally near 1000 Å. Finally, an upper masking body 124 may be formed on the lower masking body 122. The upper masking body 124 may be made of carbon, and it may have a thickness between 1000 Å and 3000 Å, e.g., generally near 2000 Å. These materials 116, 118, 120, 122 and others may be formed with chemical-vapor deposition, spun-on coatings, or other processes known in the art.

Figure 3:
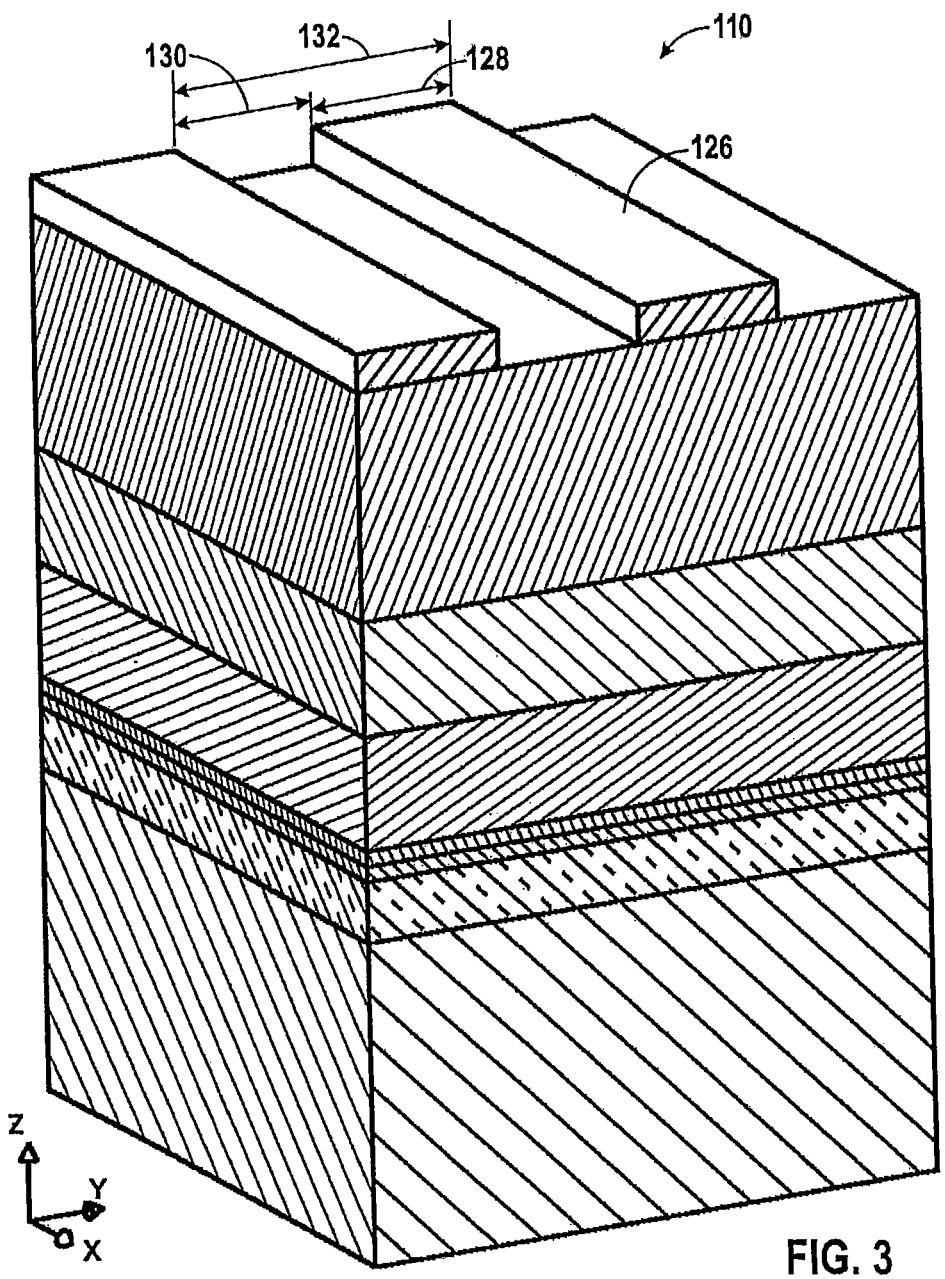

Next, a column mask 126 may be formed, as illustrated by FIG. 3. (The term "column" does not refer to any particular horizontal direction on the substrate 110 other than a direction that is different from the direction that subsequently-introduced rows extend.) The column mask 126 may include a pattern of lines that define masked regions having a width 128 and exposed regions having a width 130. The widths 128 and 130 may be generally equal to each other and each generally equal to the lithographic-resolution limit (e.g., the photolithographic-resolution limit), referred to as "F." The column mask 126 may have a pitch 132 that is generally equal to 2 F. The lines formed by the column mask 126 may be generally straight, generally parallel to each other, and may generally extend in the X-direction. These lines may be generally continuous and generally uniform in the X-direction. In other embodiments, though, the lines formed by the column mask 126 may have other shapes, e.g., they may undulate (e.g., up and down, left and right, or both), they may vary in width in the X-direction, or they may be formed from a plurality of shorter segments.

Figure 4:
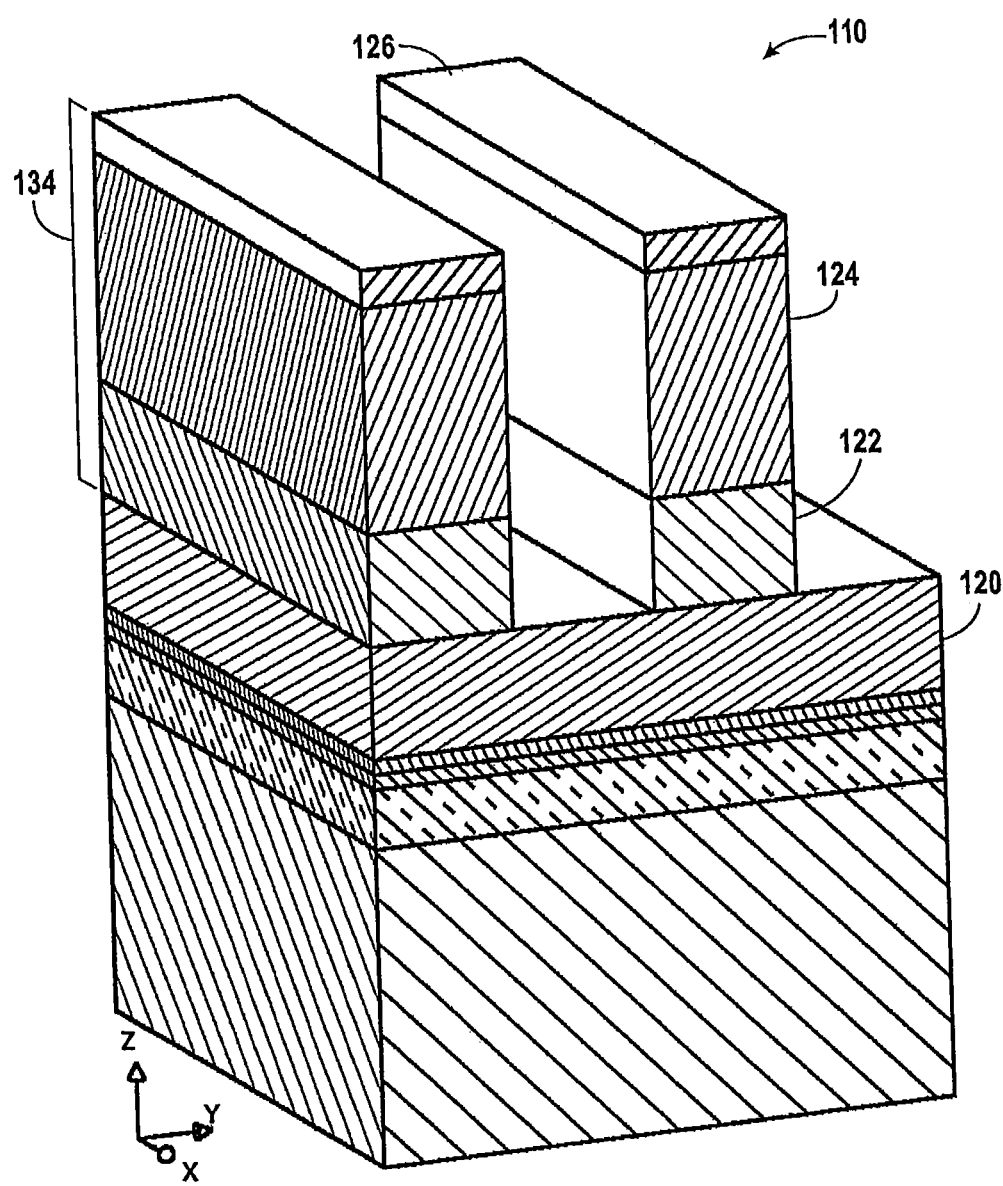

After forming the column mask 126, a column hard mask 134 may be formed, as illustrated by FIG. 4. The column hard mask 134 may be formed by generally-anisotropically etching (e.g., with a directional plasma etch) the portion of the upper masking body 124 and the portion of the lower masking body 122 that are disposed under the region not covered by the column mask 126. In some embodiments, the etch may stop on or in the sacrificial body 120.

Figure 5:
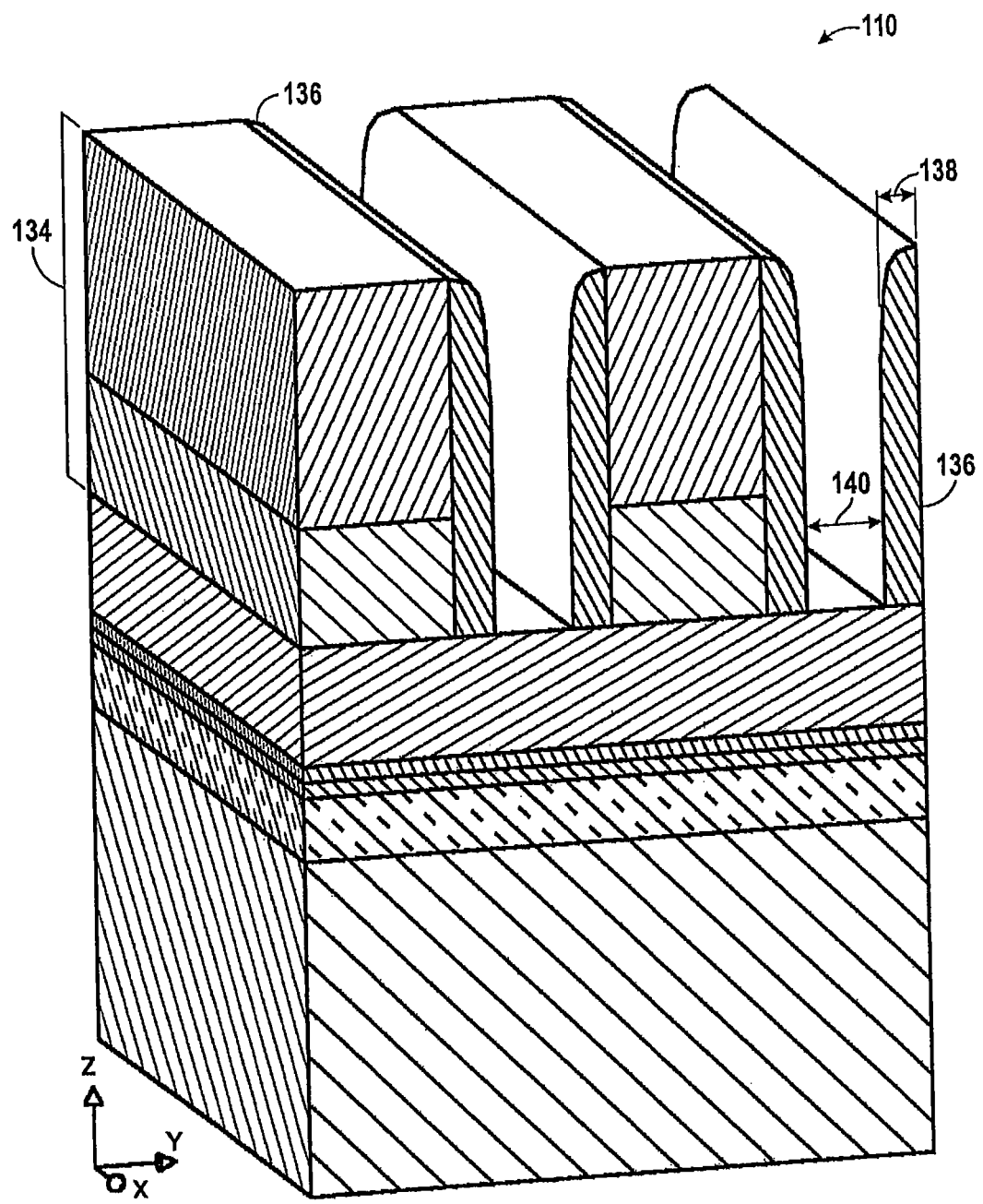

Next, the column mask 126 may be removed, and the column spacers 136 may be formed on the sidewalls of the column hard mask 134, as illustrated by FIG. 5. The column spacers 136 may be formed by depositing a generally conformal film (e.g., a film that is of generally uniform thickness on both vertical and horizontal structures) and, then, anisotropically etching that film to remove it from horizontal surfaces, leaving material disposed against generally vertical surfaces on the substrate 110. The column spacers 136 may be made of an oxide, and they may have a width 138 that is less than 100 nm, e.g., less than or generally equal to 36 nm. The column spacers 136 may narrow the area exposed by the column hard mask 134 to a width 140 that is less than or equal to F, e.g., generally equal to or less than ¾ F, ½ F, or ¼ F.

Figure 6:
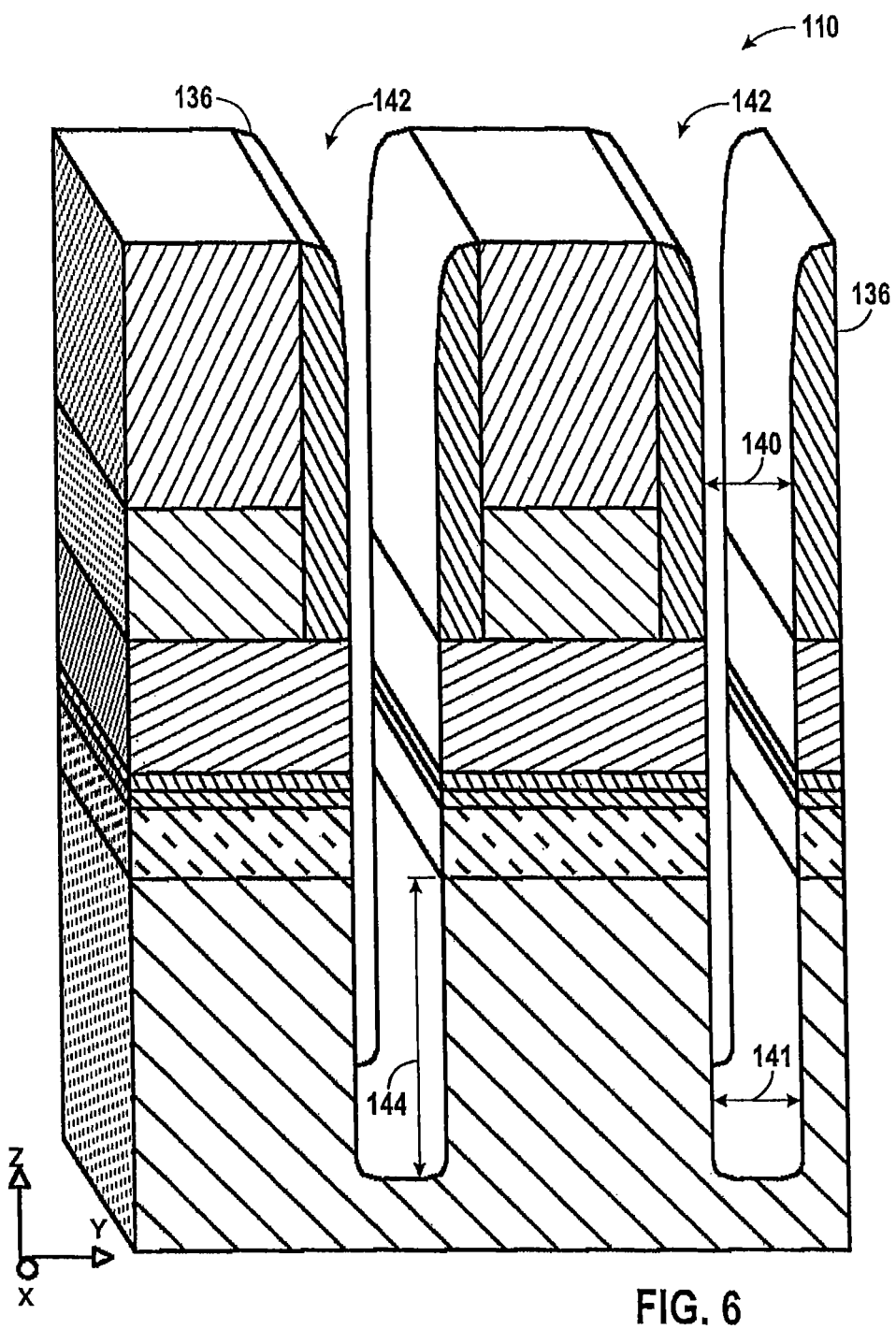

Next, as illustrated by FIG. 6, column isolation trenches 142 may be formed. The column isolation trenches 142 may be formed by generally anisotropically etching the exposed regions between the column spacers 136. The column isolation trenches 142 may have a width 141 that corresponds to (e.g., is generally equal to or proportional to) the width 140. The column isolation trenches 142 may generally extend in the X-direction and may be generally parallel to each other and generally straight. The cross-sectional shape of the column isolation trenches 142 may be generally uniform in the X-direction. In some embodiments, the column isolation trenches 142 may have a depth 144 that is between 500 Å and 5000 Å, e.g., generally equal to 2500 Å.

Figure 7:
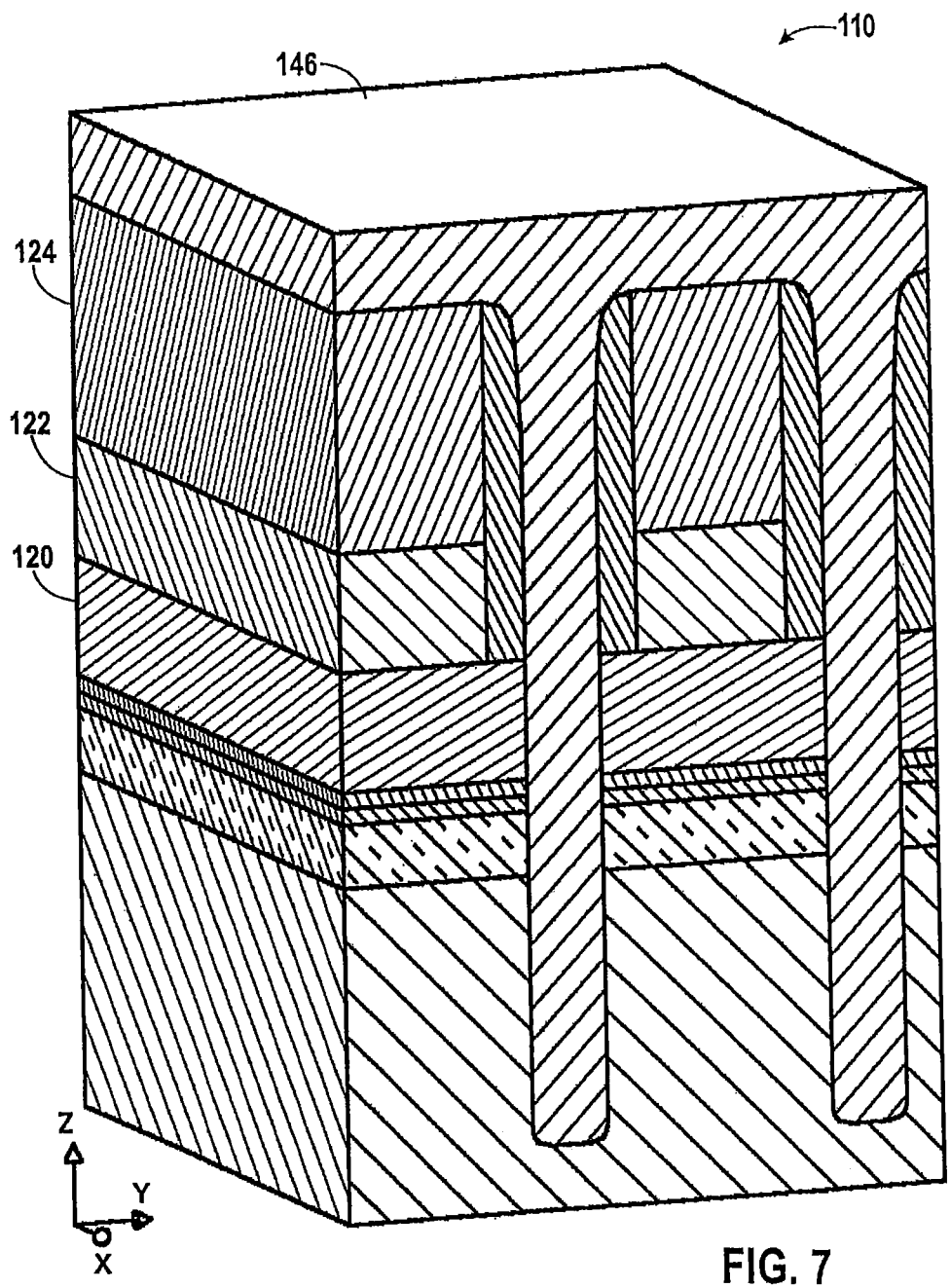

After forming the column isolation trenches 142, they may be filled partially or entirely with a dielectric 146, as illustrated by FIG. 7. The dielectric 146 may be made of a variety of materials, such as an oxide, and it may be lined with a variety of liner films (not shown), such as an oxide liner and a nitride liner. In some embodiments, prior to forming the dielectric 146, the bottom of the column isolation trenches 142 may be implanted or diffused with a dopant selected to further electrically isolate structures on opposing sides of the column isolation trenches 142.

Figure 8:
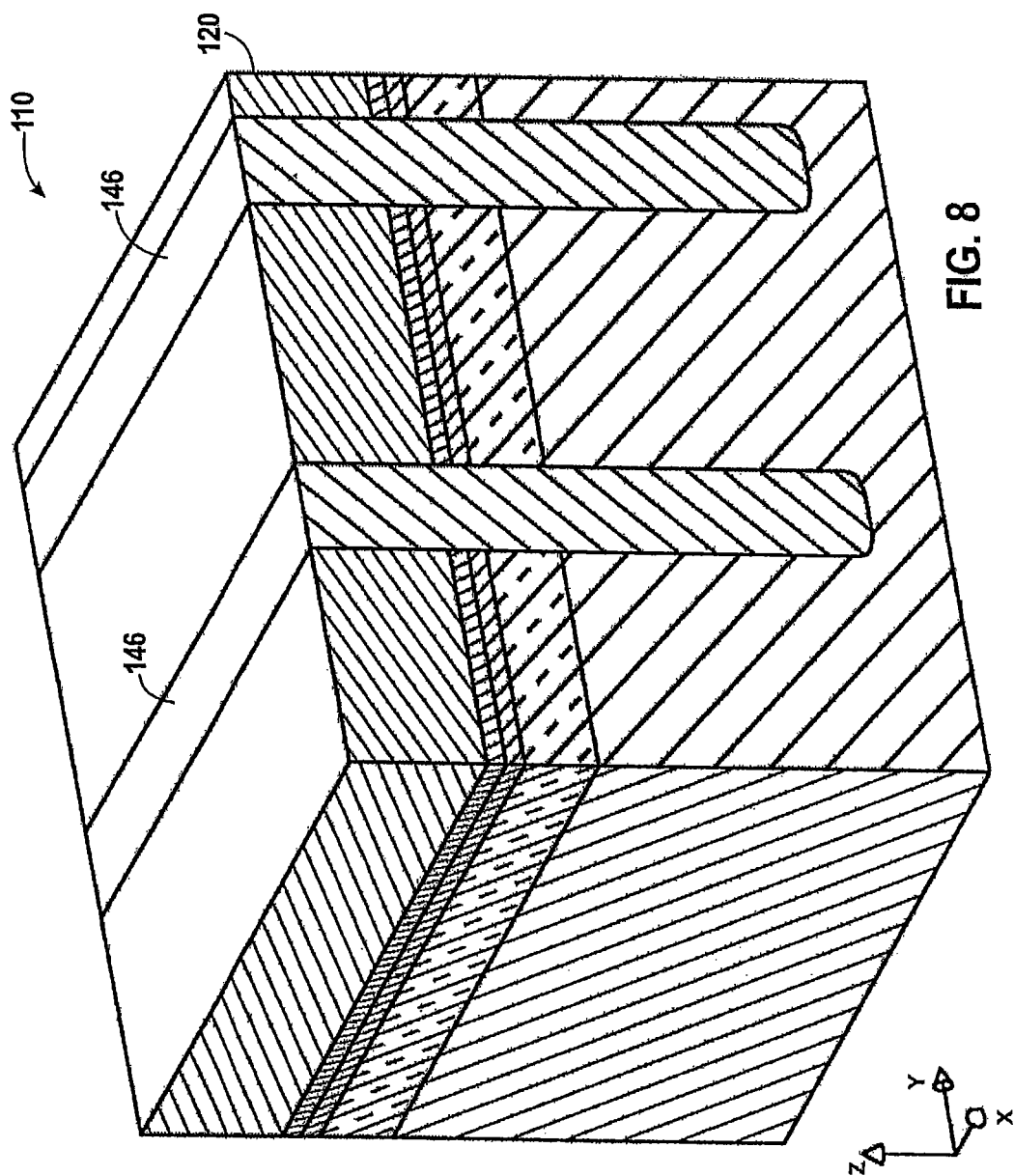

Next, the substrate 110 may be planarized, as illustrated by FIG. 8. Planarizing the substrate 110 may include etching the substrate 110 or polishing the substrate with chemical-mechanical planarization. Planarization may include removing both the upper masking body 124 and the lower masking body 122, and planarization may stop on or in the sacrificial body 120. Additionally, an upper portion of the dielectric 146 maybe removed.

Figure 9:
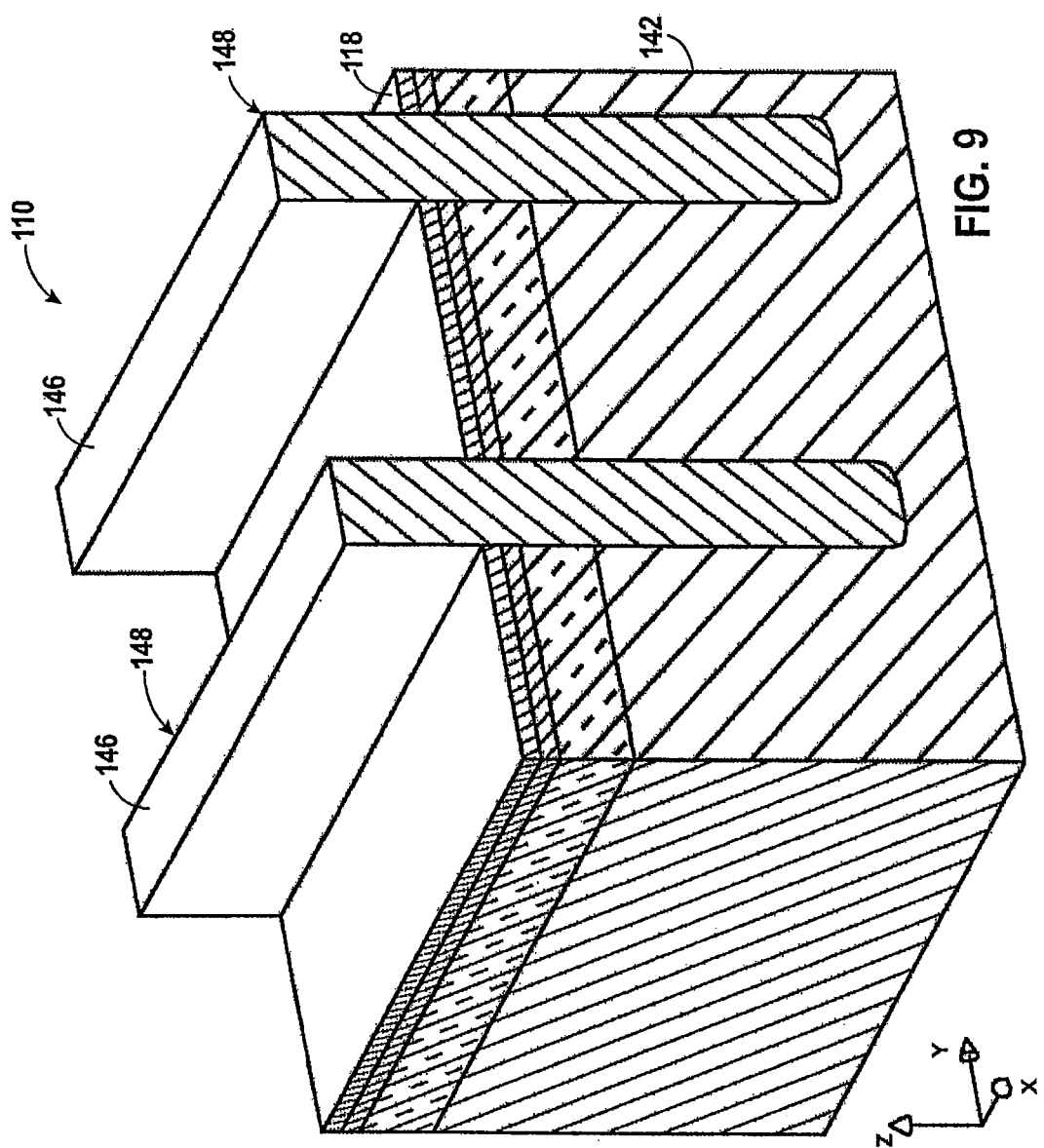

Next, the sacrificial body 120 may be partially or entirely removed, as illustrated by FIG. 9. Removing this body 120 may include wet etching or dry etching the substrate 110 with an etch that selectively etches the sacrificial body 120 without removing a substantial portion of the exposed dielectric 146, i.e., with an etch that is selective to the sacrificial body 120. An etch is said to be "selective to" a material if the etch removes that material without removing a substantial amount of other types of material. After removing the sacrificial body 120, generally vertical projections 148 formed by the dielectric 146 may extend from the substrate 110.

Figure 10:
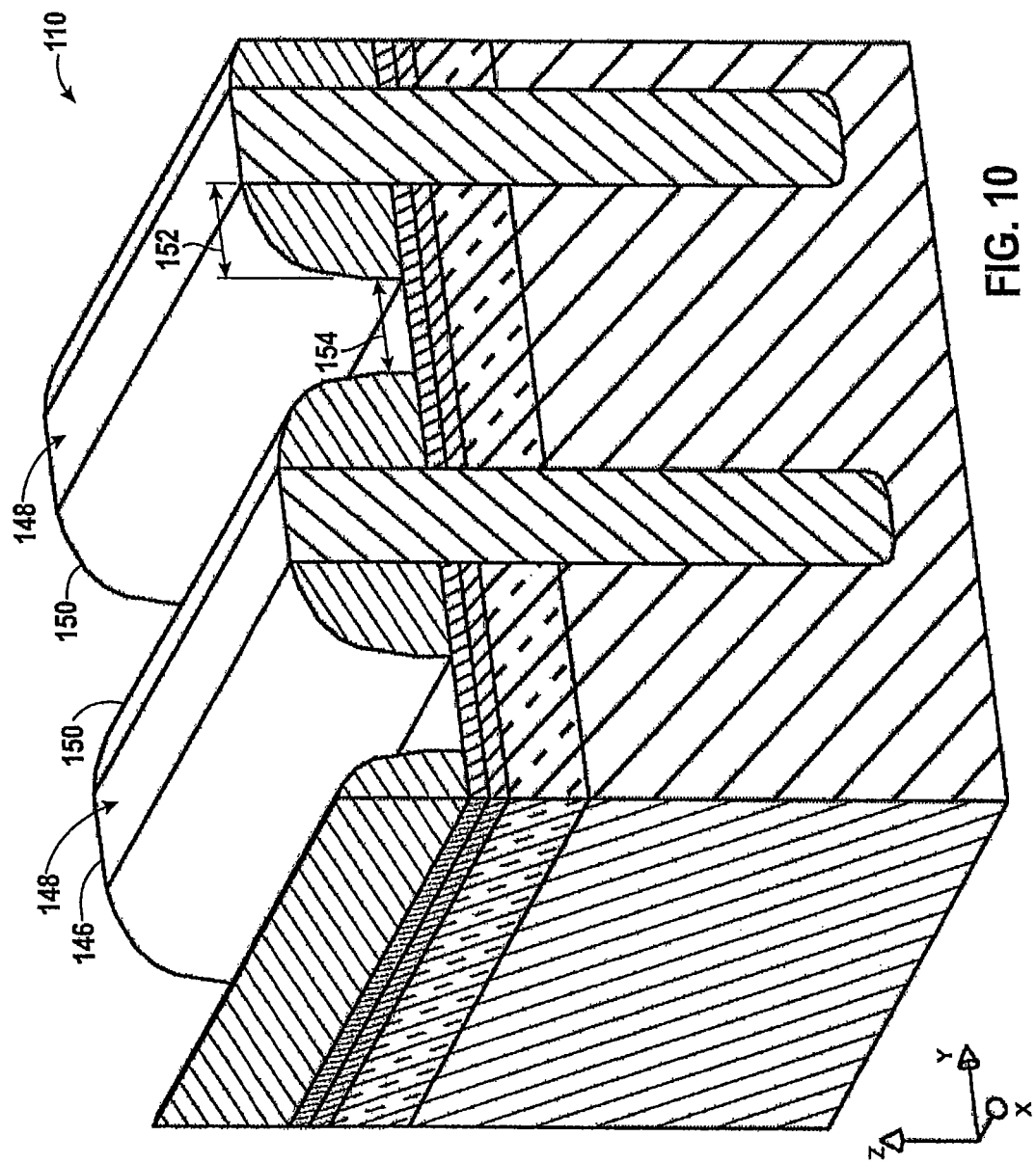

Next, a second column spacer 150 may be formed on the sidewalls of the generally vertical projections 148 of dielectric 146, as illustrated by FIG. 10. As with the previously-described column spacers 136, the second column spacers 150 may be formed by depositing a generally conformal film on the substrate 110 and anisotropically etching the film until the film is generally removed from the horizontal surfaces, leaving the material on the vertical surfaces on the substrate 110. The second column spacers 150 may be made of the same material as the dielectric 146, e.g., an oxide, or they may be made of a different material. The second column spacers 150 may have a width 152 that is less than or generally equal to 100 nm, e.g., less than or generally equal to 36 nm. The spacers 150 may define a width 154 between adjacent spacers 150 that is generally less than or equal to 1 F, ¾ F, ½ F, or ¼ F.

Figure 11:
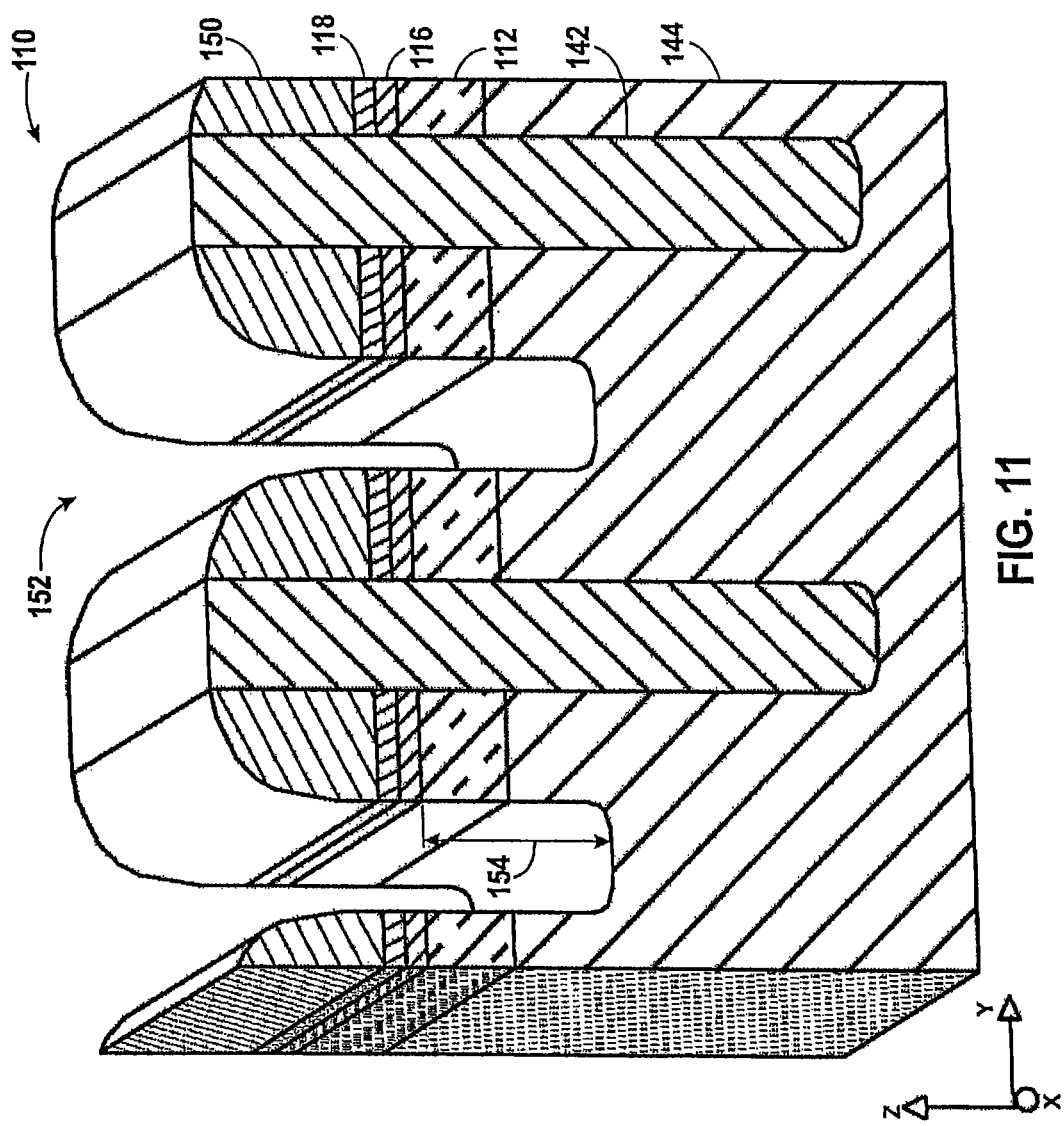

After forming the second group of column spacers 150, the column-gate trench 152 may be formed, as illustrated by FIG. 11. The column-gate trench 152 may be formed by generally anisotropically etching the exposed regions between the second group of column spacers 150. The column-gate trenches 152 may be generally parallel to each other and the column isolation trenches 142, and they may generally extend in the X-direction. The column-gate trenches 152 may have a depth 154 that is both less than the depth 144 (FIG. 6) of the column isolation trenches 142 and greater than the depth of the upper doped region 112.

Figure 12:
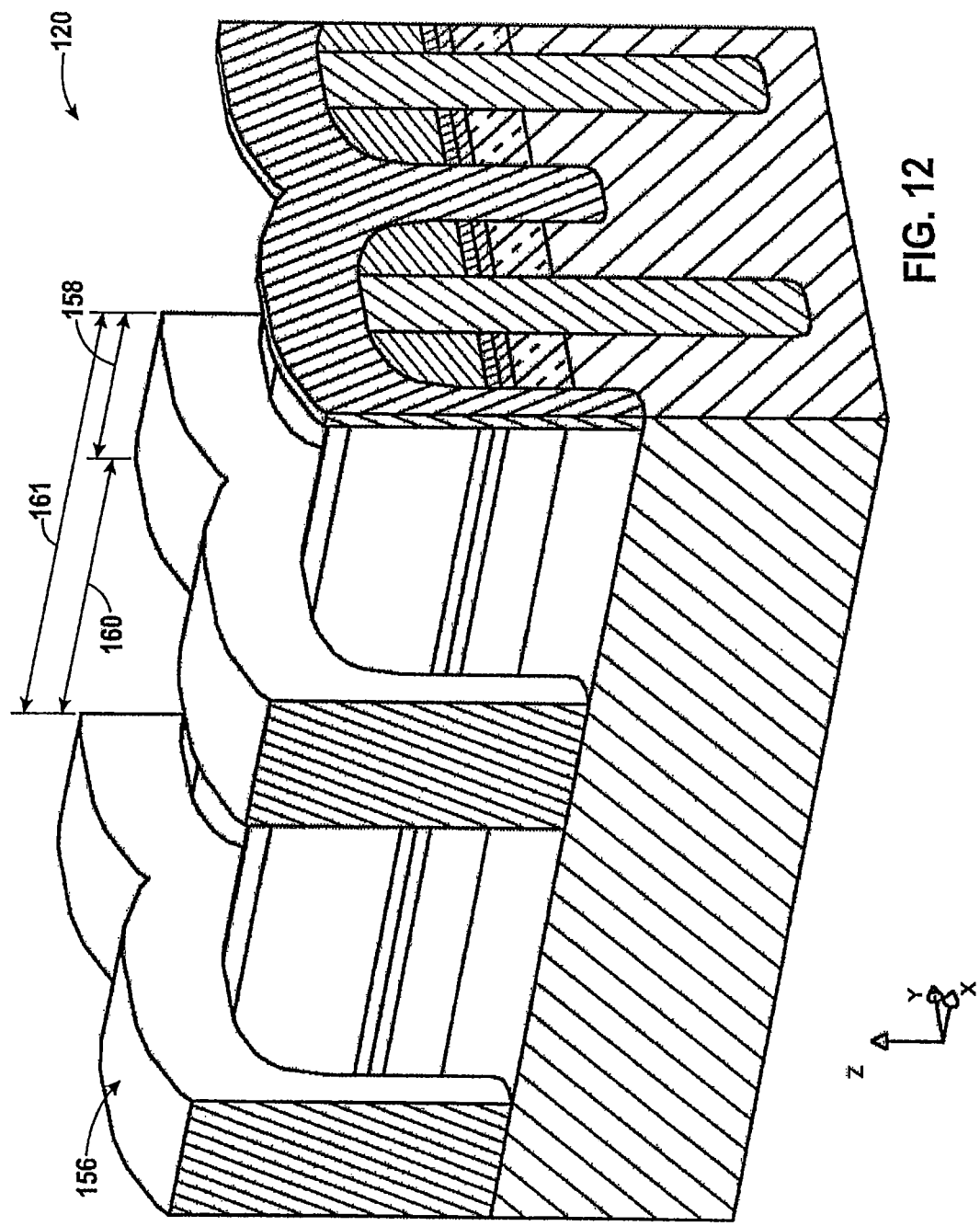

Next, a column-segmenting mask 156 may be formed, as illustrated by FIG. 12. The column-segmenting mask 156, like the other masks discussed, may be a soft mask or a hard mask formed with photolithography or other patterning processes. The column-segmenting mask 156 may define masked regions 158 and exposed regions 160. The masked regions 158 may extend generally in the Y-direction, and they may be generally straight and generally parallel to each other. In other embodiments, though, the masked regions 158 may undulate, vary in width, or be segmented. The masked regions 158 may have a width generally equal to or less than F. The exposed regions 160 may be wider than the masked regions 158, and together, the exposed region 160 and a masked region 158 may generally define the pitch 161 of the column-segmenting mask 156. The column-segmenting mask 156 may be formed from photoresist or it may be a hard mask, for instance. A portion of the column-segmenting mask 156 may be disposed in the trenches 152.

Figure 13:
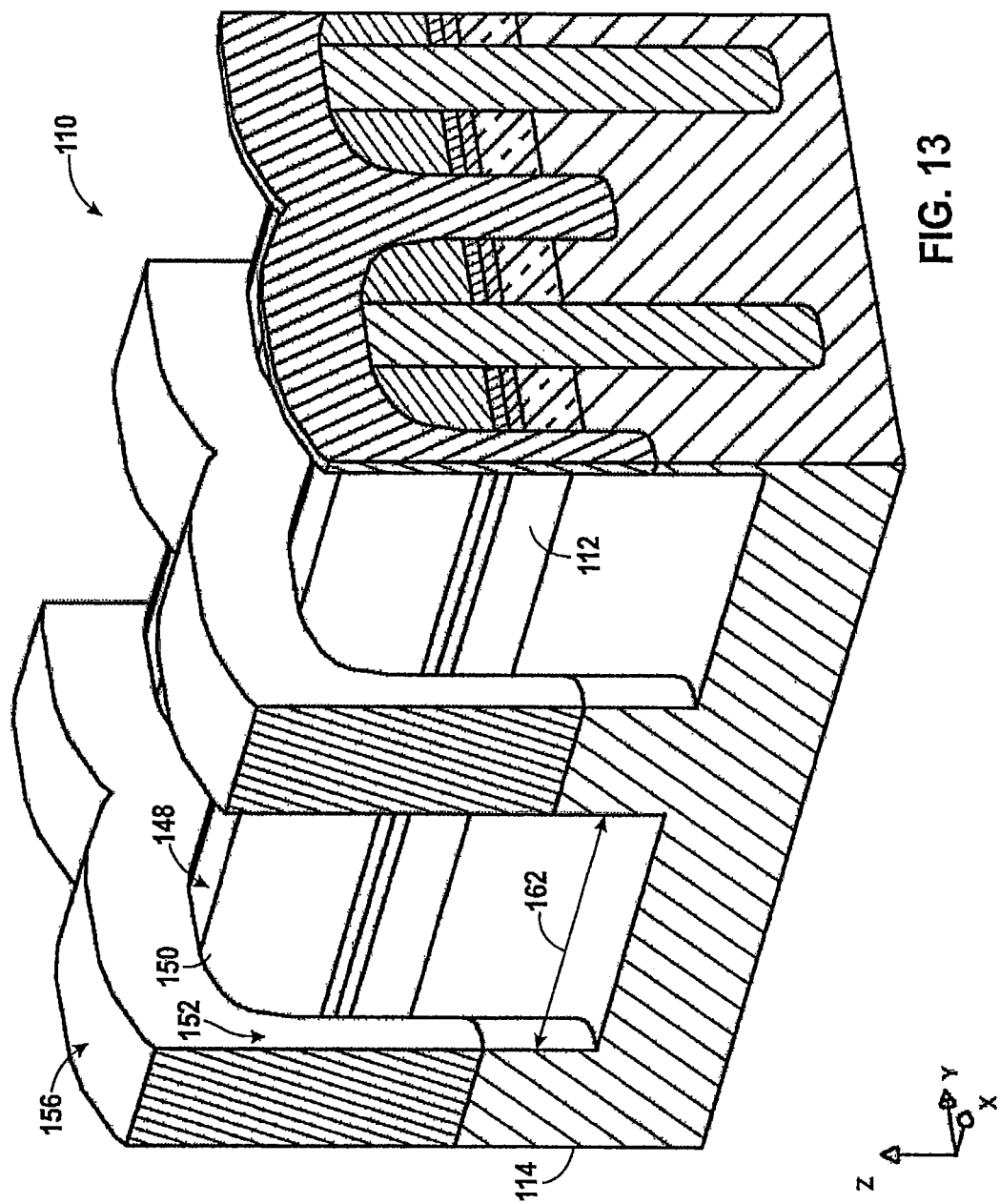

The substrate 110 may then be etched, as illustrated by FIG. 13. Etching the substrate 110 may include etching the substrate 110 with a generally anisotropic etch that selectively removes material from the lower doped region 114. This may form deeper portions 162 of the column-gate trenches 152.

Figure 14:
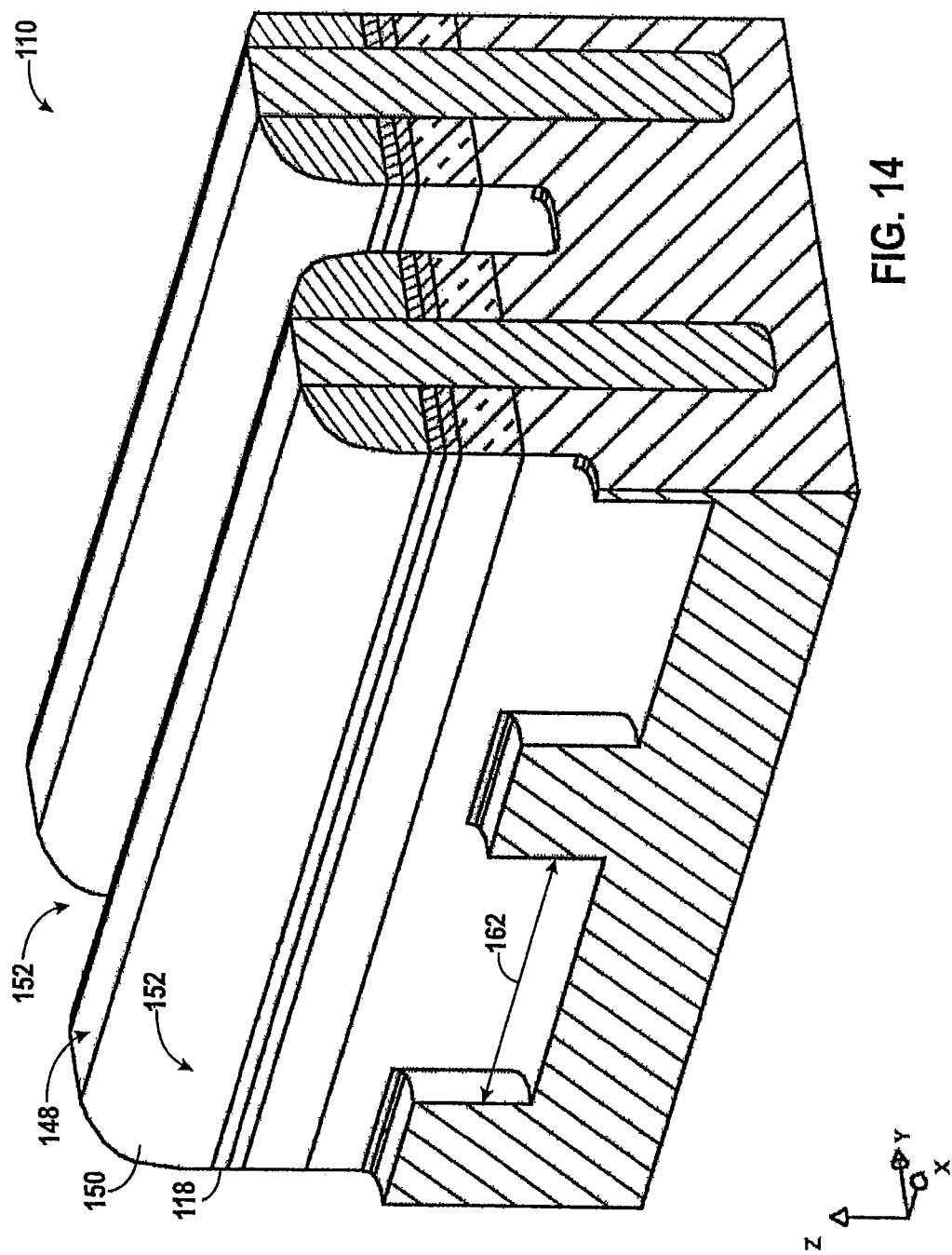
Figure 15:
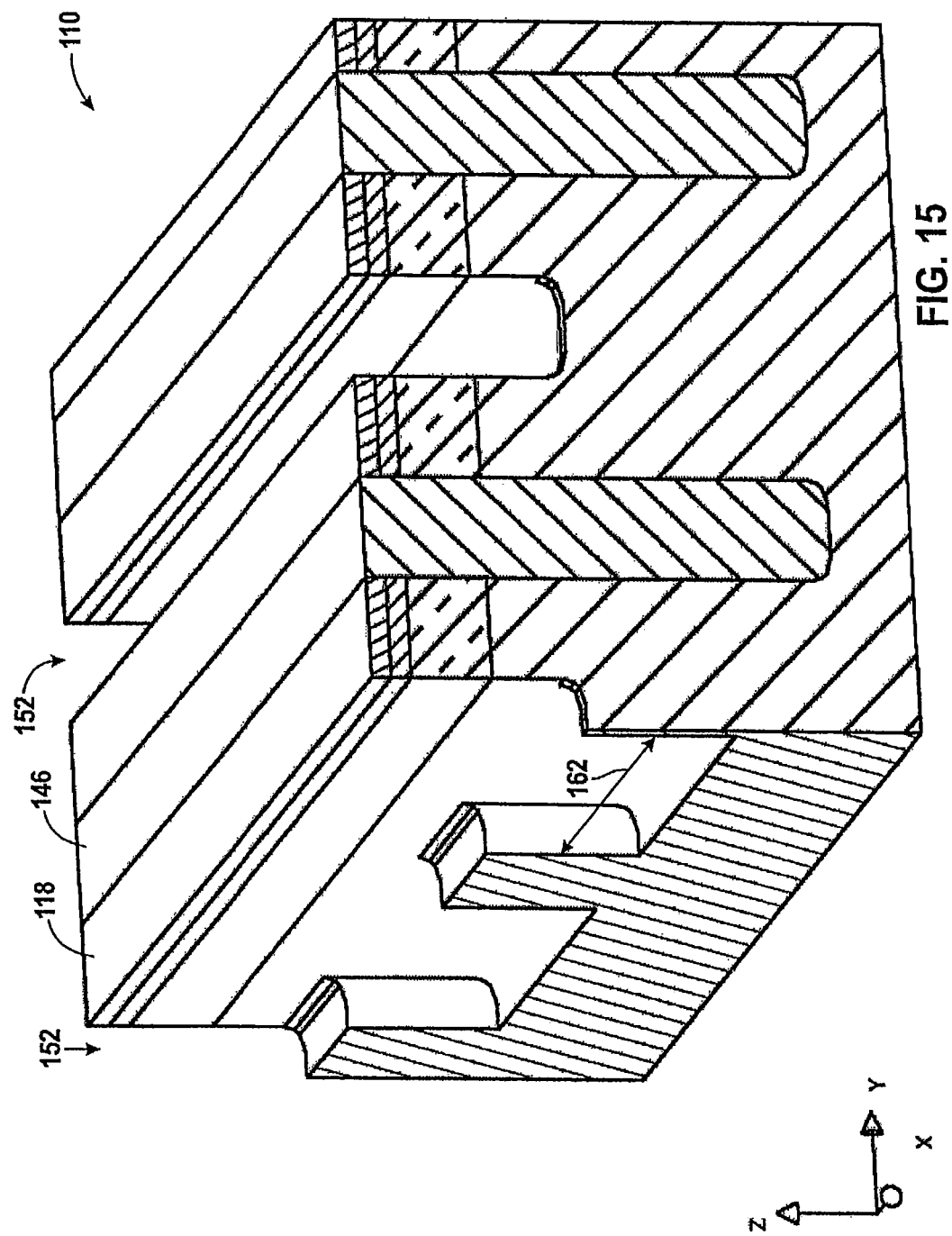

After forming the deeper portions 162, the column-segmenting mask 156 may be removed, as illustrated by FIG. 14, and the substrate 110 may be partially or substantially planarized, as illustrated by FIG. 15. Planarizing the substrate 110 may include selectively etching the second group of column spacers 150 and the vertical projections 148, or this process may include planarizing these structures with chemical-mechanical planarization. In other embodiments a portion or all of the second group of column spacers 150 and the vertical projections 148 may be left on the substrate 110 and removed during subsequent steps.

Figure 16:
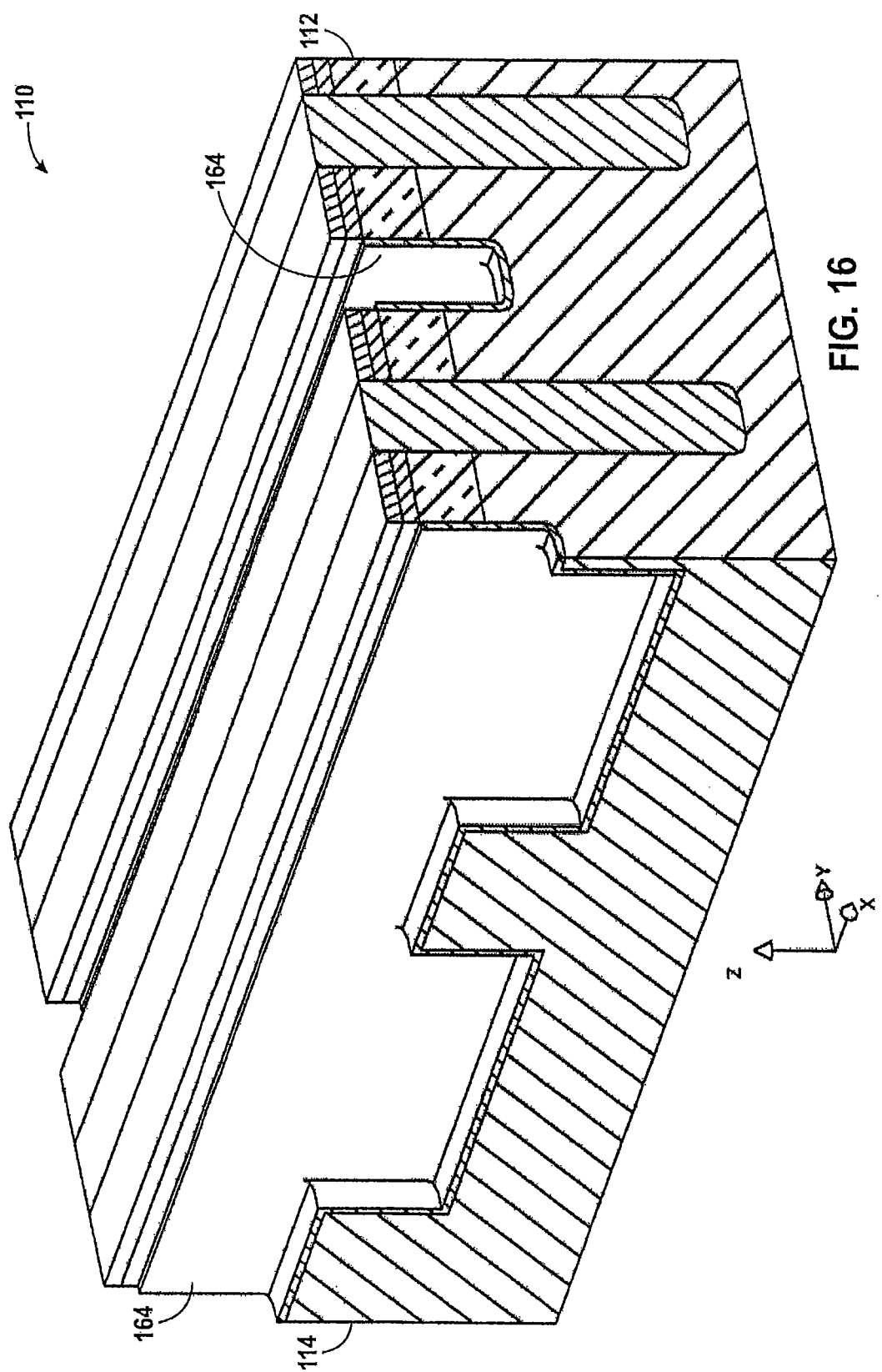

Next, a column-gate dielectric 164 may be formed, as illustrated by FIG. 16. The column-gate dielectric 164 may be deposited, grown, or otherwise formed, and it may substantially or entirely cover the exposed portions of the upper doped region 112 and the lower doped region 114. The column-gate dielectric 164 may include, consist of, or consists essentially of a variety of dielectric materials, such as oxide (e.g., silicon dioxide), oxynitride, or high-dielectric constant materials like hafnium dioxide, zirconium dioxide, and titanium dioxide, for example.

Figure 17:
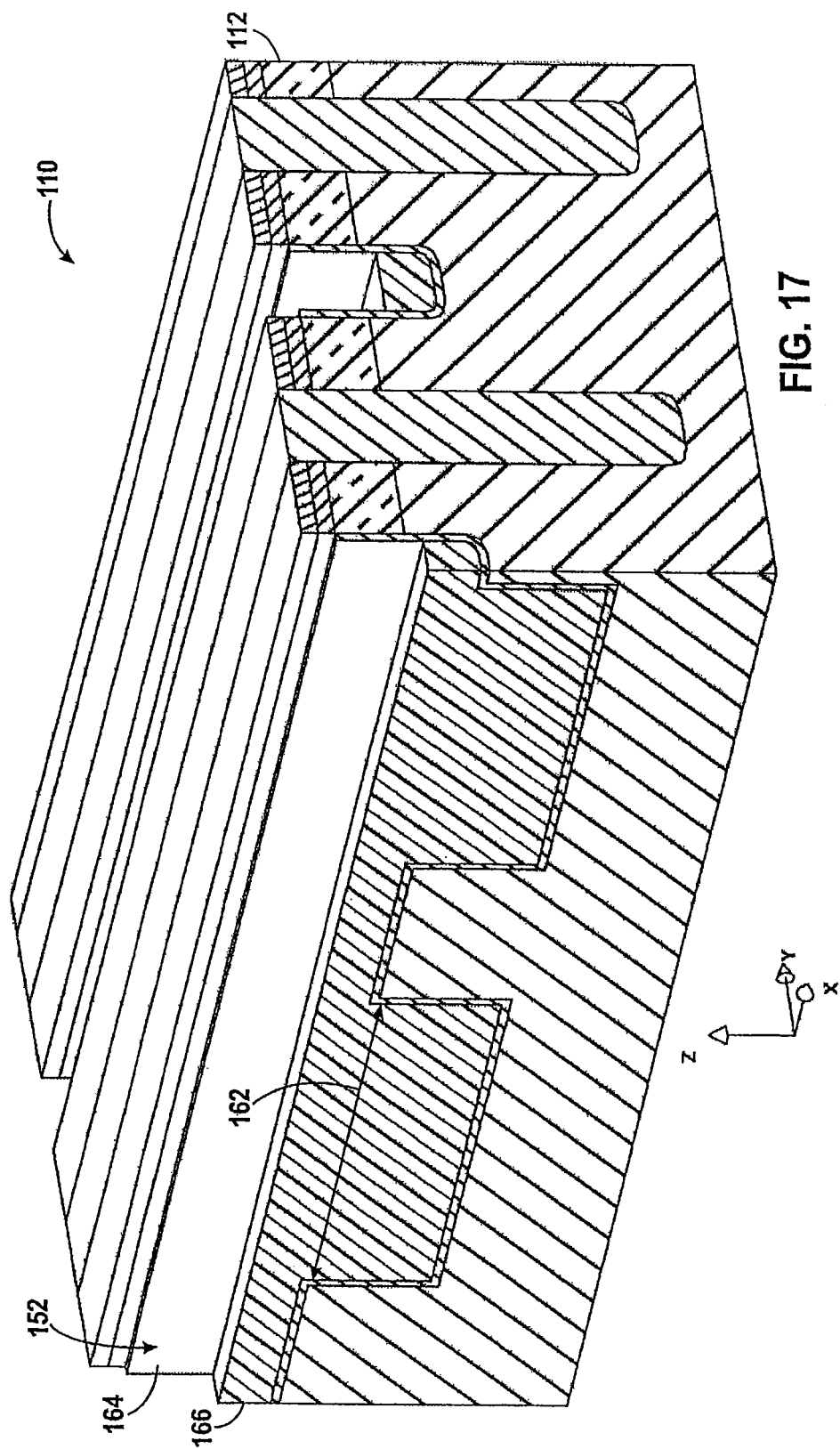

After forming the column-gate dielectric 164, in some embodiments, a column gate 166 may be formed, as illustrated by FIG. 17. The column gate 166 may be made of a conductive material, such as a metal or doped polysilicon, and it may be formed by depositing the conductive material on the substrate 110 until an overburden is formed and, then, etching the conductive material until the column gate 166 is recessed below the upper doped region 112. In some embodiments, the column gate 166 is not recessed into the deeper portions 162 of the column-gate trenches 152 such that the column gate 166 is generally continuous in the X-direction between deeper portions 162.

Figure 18:
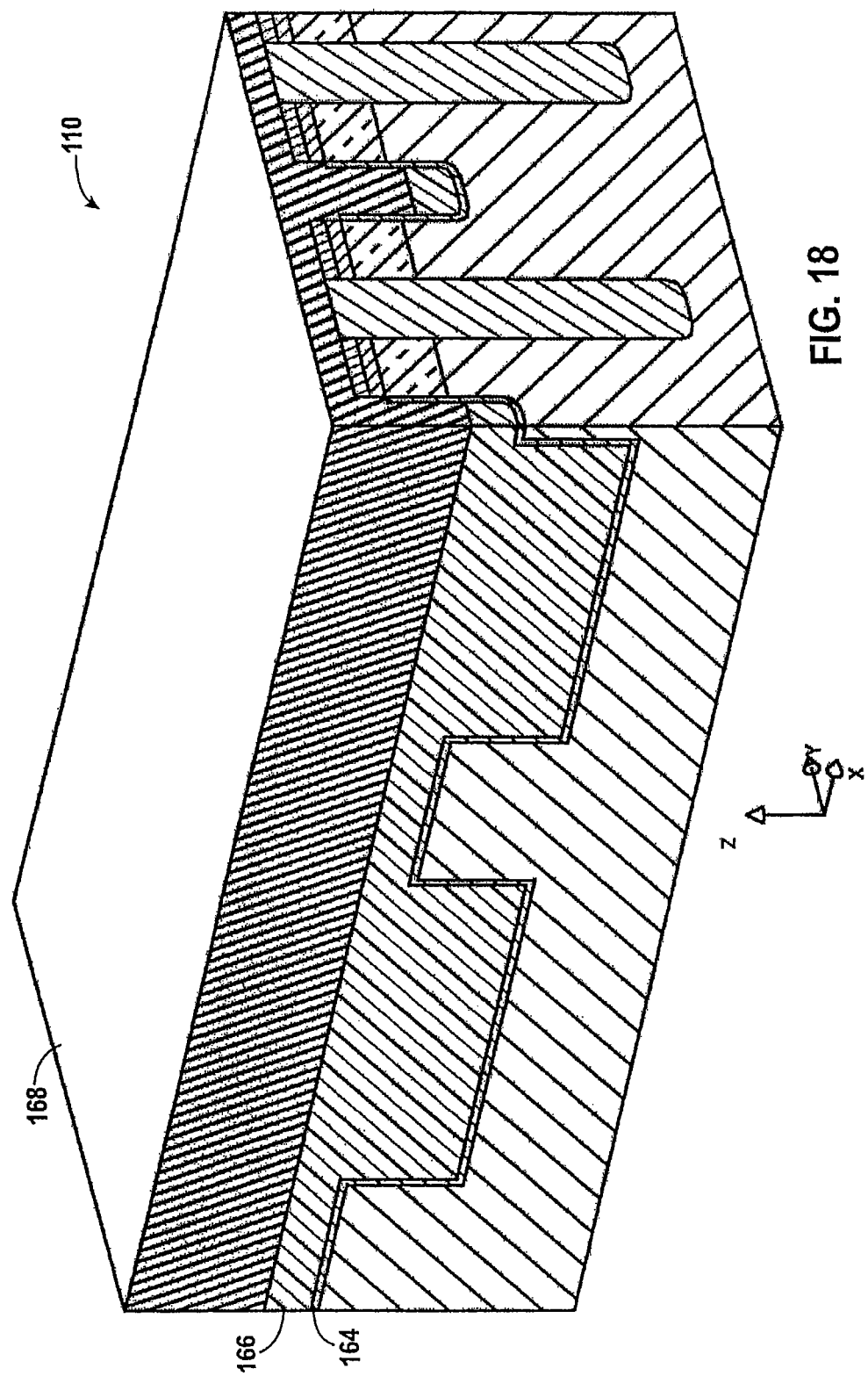

Next, a column-gate cover 168 may be formed on the substrate 110, as illustrated by FIG. 18. The column-gate cover 168 may be a dielectric material, such as an oxide, nitride, or other appropriate material. In some embodiments, the column-gate cover 168 may be formed by depositing a dielectric material on the substrate 110 and then planarizing the dielectric material with an etch or chemical-mechanical planarization.

Figure 19:
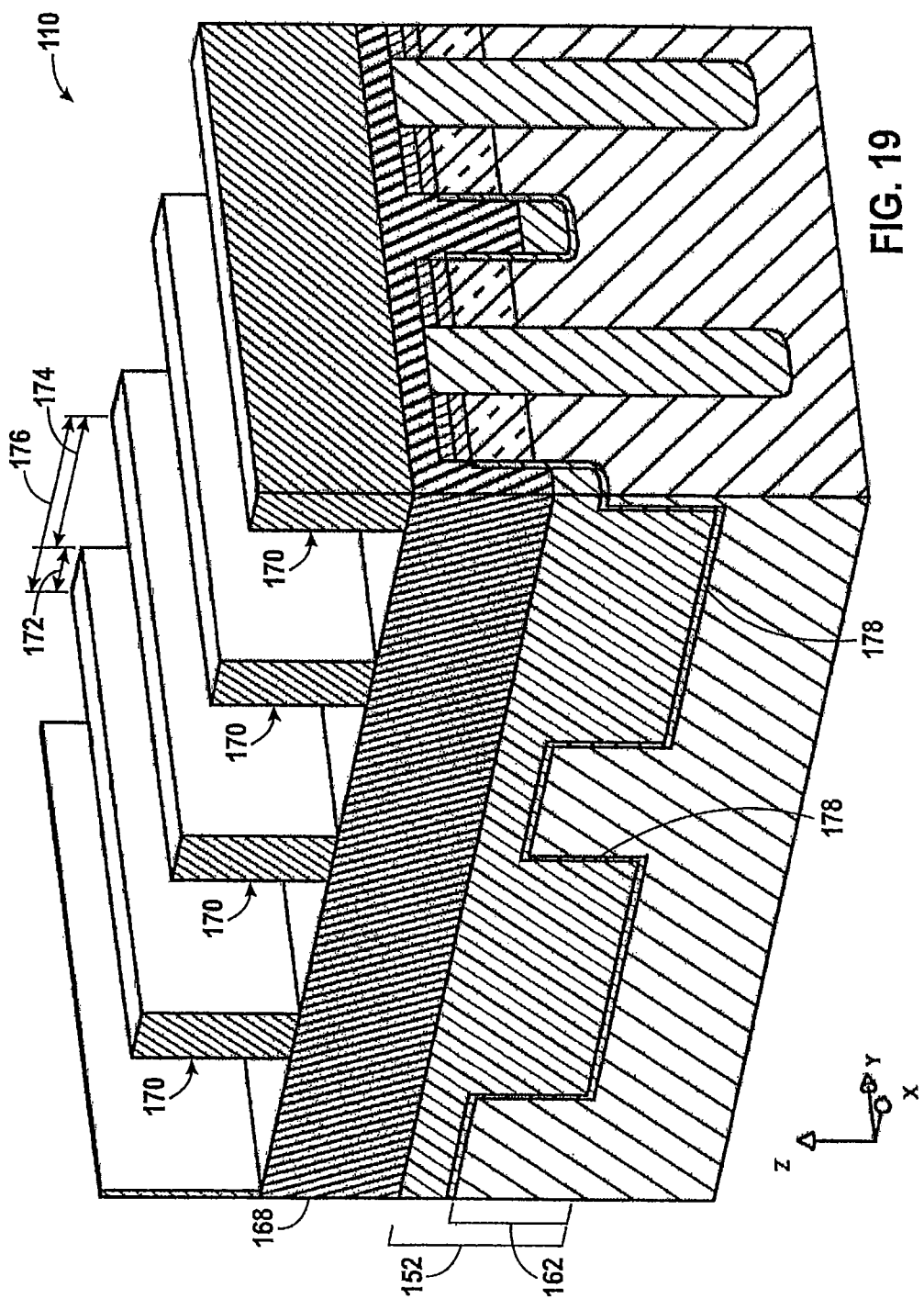

After forming the column-gate cover 168, a row mask 170 may be formed, as illustrated by FIG. 19. The row mask 170 may include a plurality of lines that generally extend in the Y-direction. In some embodiments, these lines are generally parallel, generally straight, and of generally uniform width in the Y-direction. In other embodiments, though, these lines may undulate, vary in width, or be segmented. The row mask 170 may generally define masked regions 172 and exposed regions 174, which together may repeat in the X-direction with a pitch 176. The pitch 176 may be generally equal to one-half of the pitch 161 (FIG. 12) of the column-segmenting mask 156. The mask 170 may be aligned in the X-direction such that alternating exposed regions 172 of the row mask 170 overlap an edge 178 of the deeper portion 162 of the column-deep trench 152 (an arrangement that is more clearly illustrated by a post-etch view in FIG. 20). The width of the masked region 172 may be generally equal to or less than F, ¾ F, or ½ F. The row mask 170 may be made of photoresist or it may be a hard mask. In some embodiments, the row mask 170 may be formed by double pitching a structure formed with photolithography to form sub-photo lithographic features, or other sub-photolithographic techniques may be used, such as a resist-reflow process or a resist-undercut process in which a hard mask is undercut with a wet etch. (Double-pitching refers to the process of forming sidewall spacers on a patterned structure to double the number of structures defined by the patterned structure.)

Figure 20:
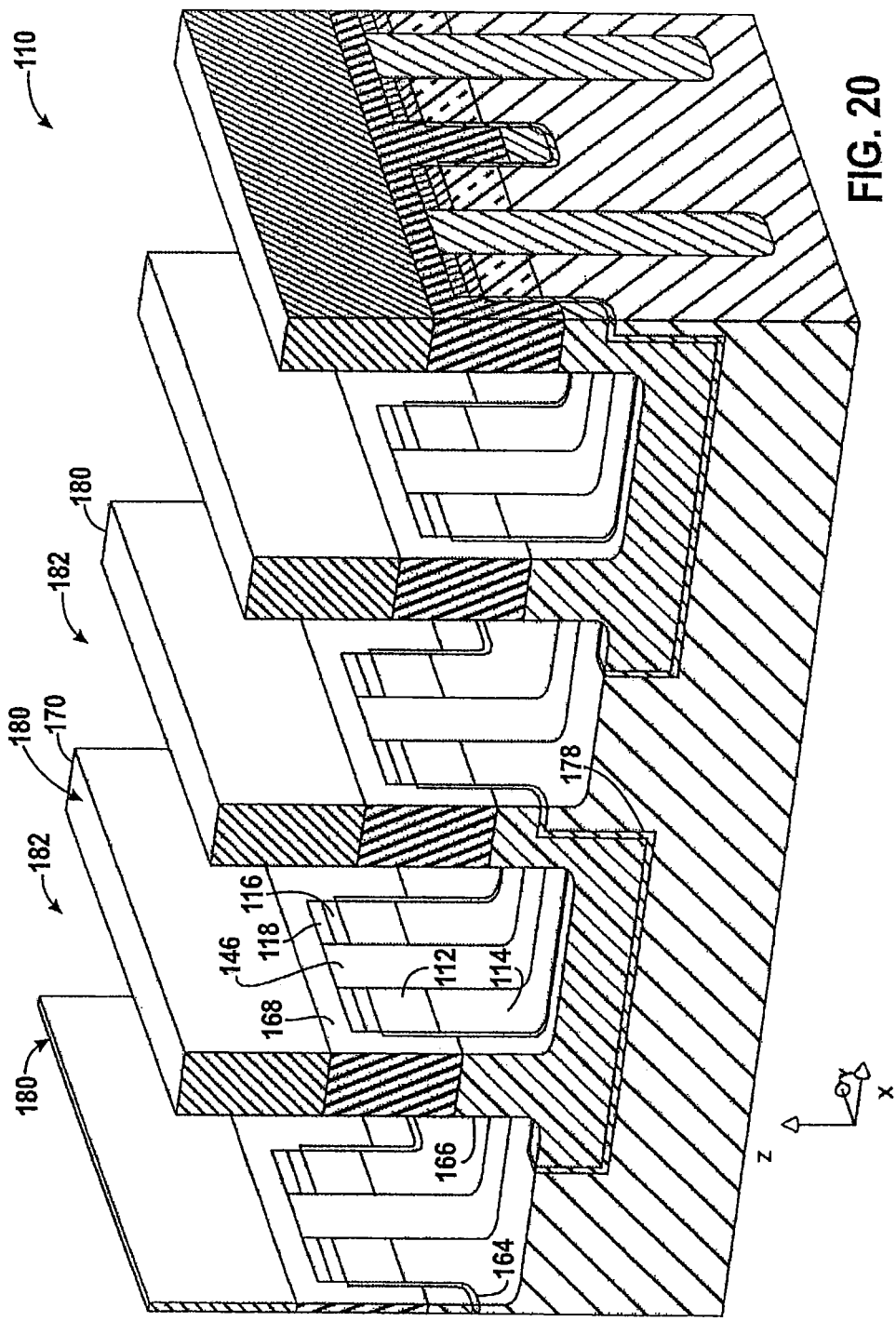

Next, the substrate 110 may be etched to form fin rows 180 separated by row-gate trenches 182, as illustrated by FIG. 20. The row-gate trenches 182 may be formed by generally anisotropically etching exposed regions 174 defined by the row mask 170. The row-gate trenches 182 may extend into the substrate 110 to a depth that overlaps the deeper portion 162 of the column-gate trenches 152. In some embodiments, the row-gate trenches 182 do not extend to the bottom of the deeper portion 162, leaving a portion of the column gate 166 extending between fin rows 180.

Figure 21:
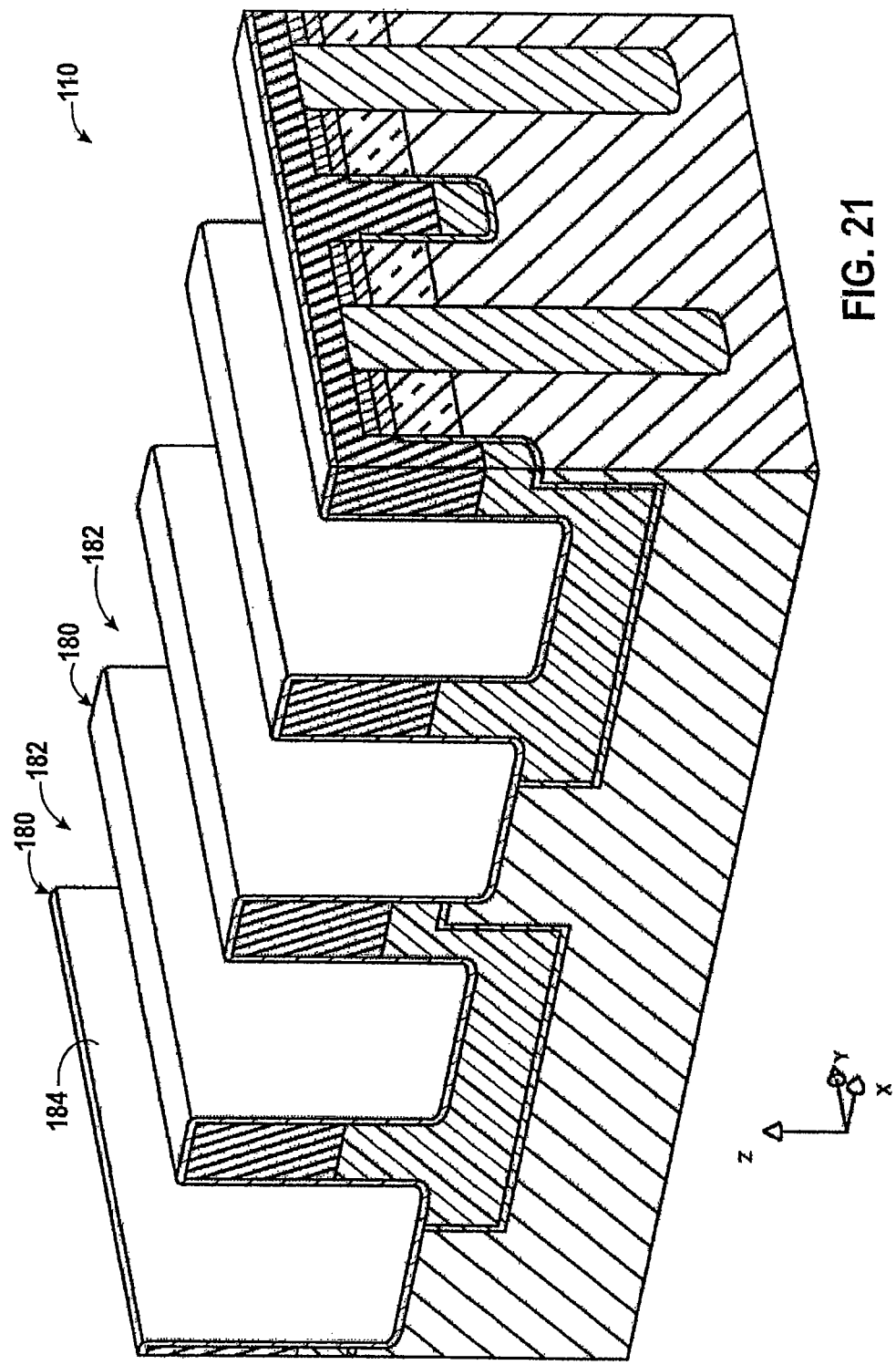

After forming the row-gate trenches 182, a row-gate dielectric 184 may be formed, as illustrated by FIG. 21. The row-gate dielectric 184 may be grown, deposited, or otherwise formed, and it may include one or more of the dielectric materials described above with reference to the column-gate dielectric 164.

Figure 22:
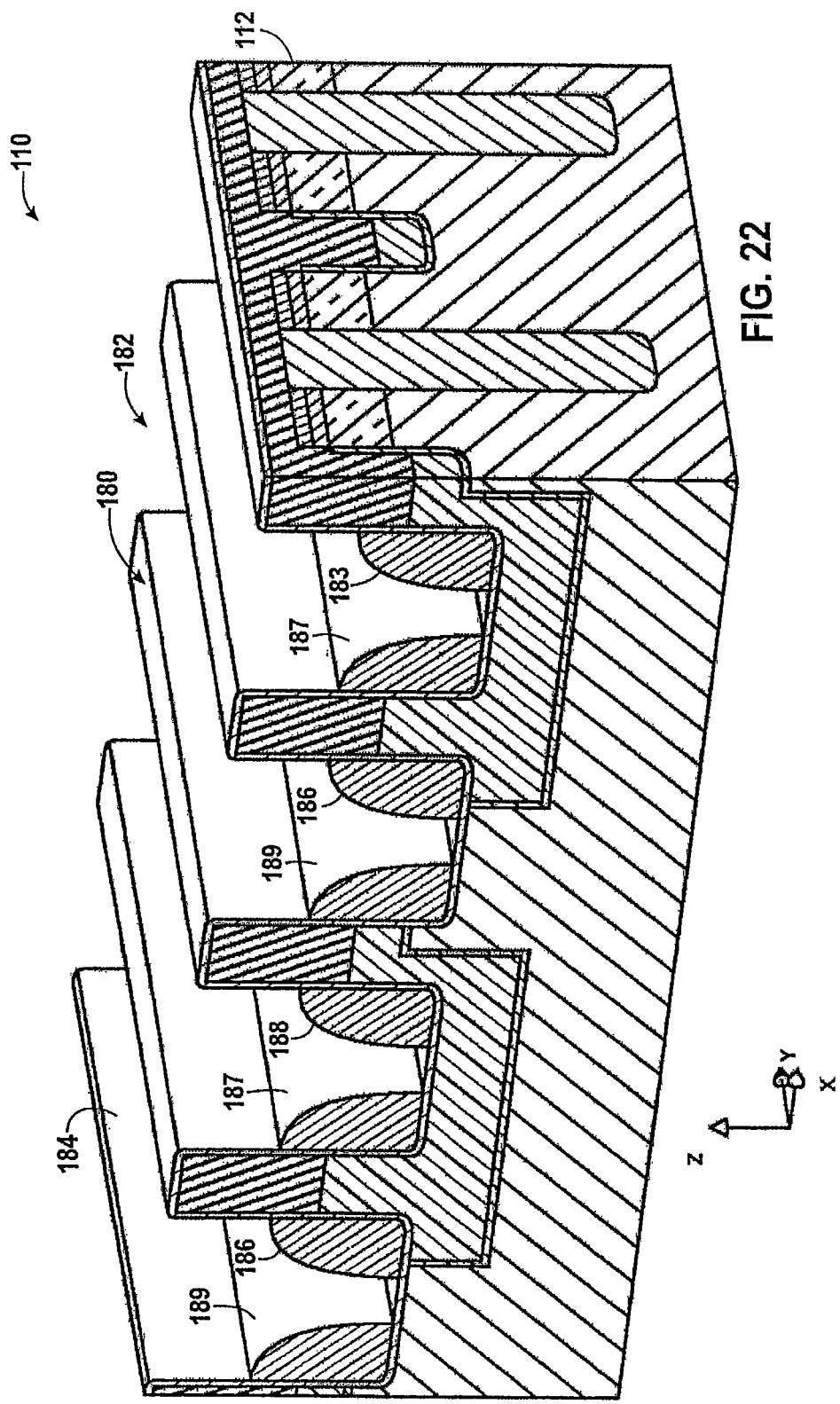

After forming the row-gate dielectric 184, row gates 186, 187, 188, and 189 may be formed, as illustrated by FIG. 22. In this embodiment, the row gates 186, 187, 188, and 189 may be formed with a sidewall-spacer process. A film of a conductive material, such as TiN, other appropriate metals, or doped polysilicon, may be deposited on the substrate 110 and, then, anisotropically etched to leave a conductive sidewall spacer 186 or 188 on either side of each fin row 180. The row gates 186, 187, 188, and 189 may overlap the upper doped region 112. In some embodiments, row gates 186 and 187 may be coupled to one another and at generally the same voltage, or in other embodiments, they may be controlled independently. Similarly, row gates 188 and 189 may be coupled to one another or they may be controlled independently.

Figure 23:
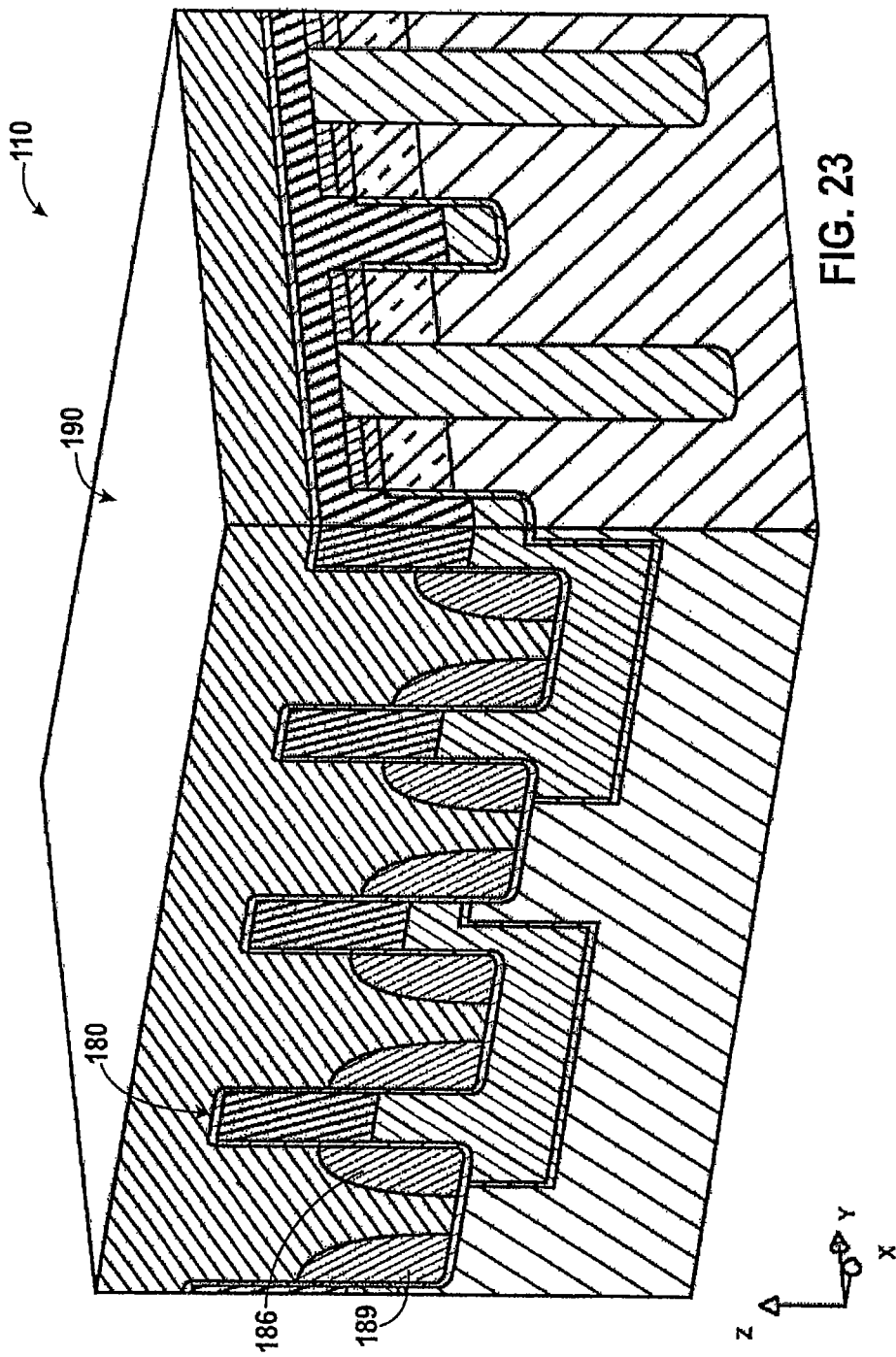

Next, a dielectric material 190 may be formed on the substrate 110, as illustrated by FIG. 23. The dielectric material 190 may be an oxide, nitride, or other appropriate material, and it may isolate gates 186, 187, 188, and 189 associated with adjacent fin rows 180.

Figure 24:
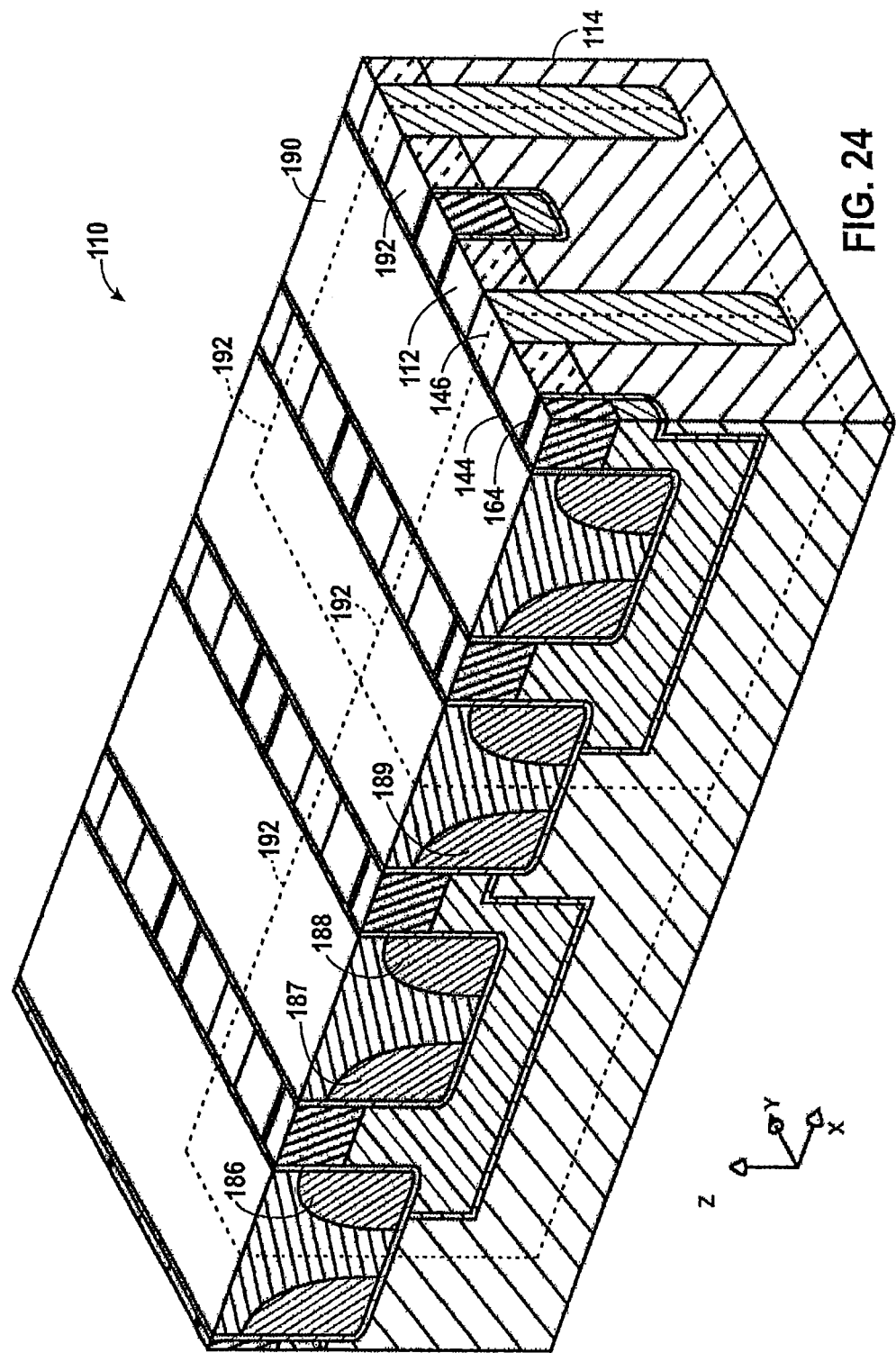

After forming the dielectric material 190, the substrate 110 may be planarized, as illustrated by FIG. 24. The substrate 110 may be planarized with an etch or chemical-mechanical planarization. In some embodiments, planarization exposes the top portion of the upper doped region 112 for establishing electrical contact with subsequently-formed data lines and data elements.

Figure 25:
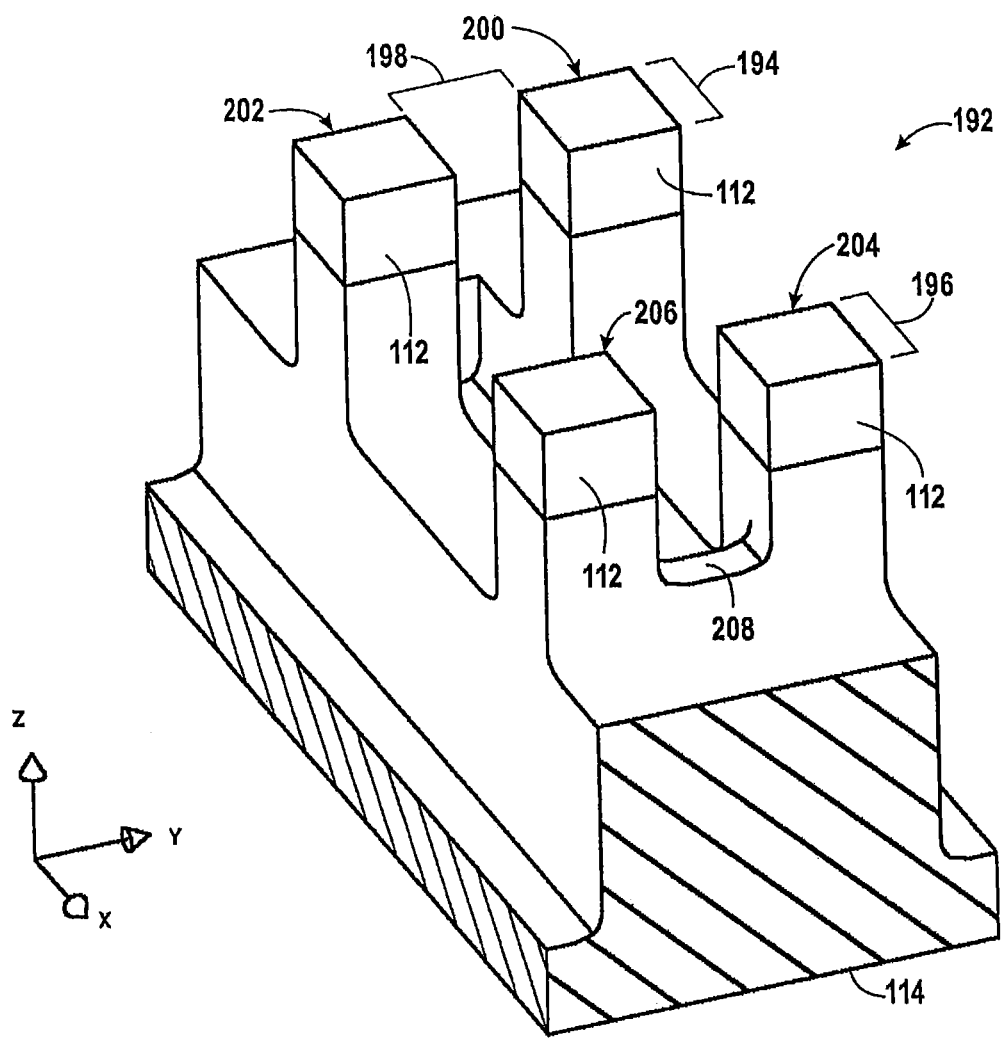
Figure 26:
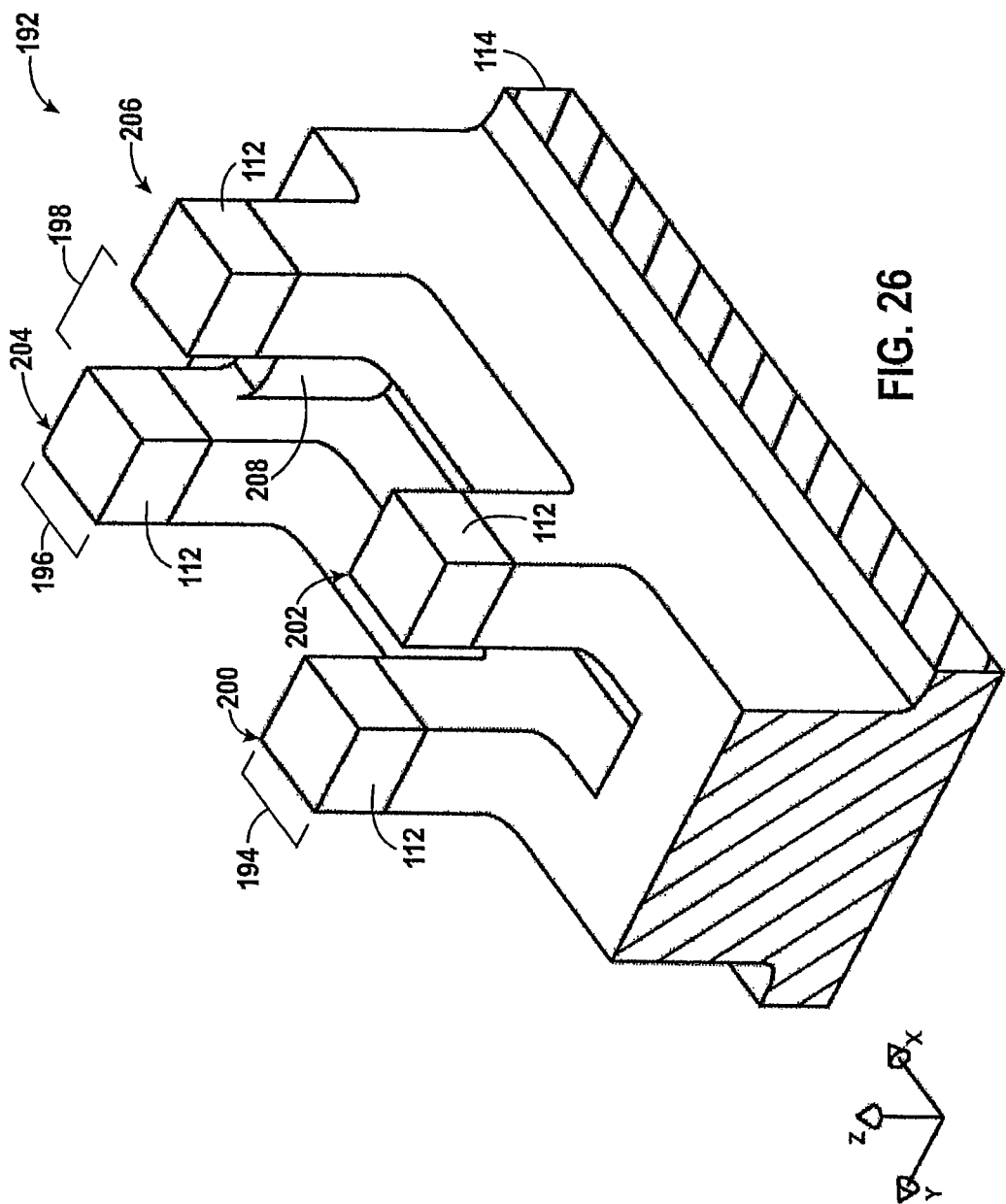

This process may produce an array of cells 192 each with three transistors: one transistor controlled by the row gates 188 and 189, one transistor controlled by a column-segment gate 210 (not numerically designated in FIG. 24), and one transistor controlled by the row gates 186 and 187. These transistors are described below. The resulting array is illustrated by the perspective view of FIG. 24, and an example of an individual cell is illustrated by FIGS. 25-30. The semiconductor portion of each cell in this embodiment is illustrated by FIGS. 25 and 26, and other aspects of an individual cell are illustrated by FIGS. 27-30.

As depicted by FIGS. 25 and 26, each cell 192 may include two fins 194 and 196 that are partitioned by a common cavity 198 that extends between the fins 194 and 196. The fin 194 may include two legs 200 and 202 that may be disposed on either side of the cavity 198, and the fin 196 may include two legs 204 and 206 that may also be disposed on either side of the cavity 198. In some embodiments, the cavity 198 changes depth between the legs 204 and 206 to form an elevated portion 208 that spans between the legs 204 and 206. The legs 200, 202, 204, and 206 may include a distal portion that is formed from the upper doped region 112 and a lower portion that is formed from the lower doped region 114. As explained below, fin 194 may form an AND gate with a pair of stacked transistors, and the fin 196 may form a single transistor.

Figure 27:
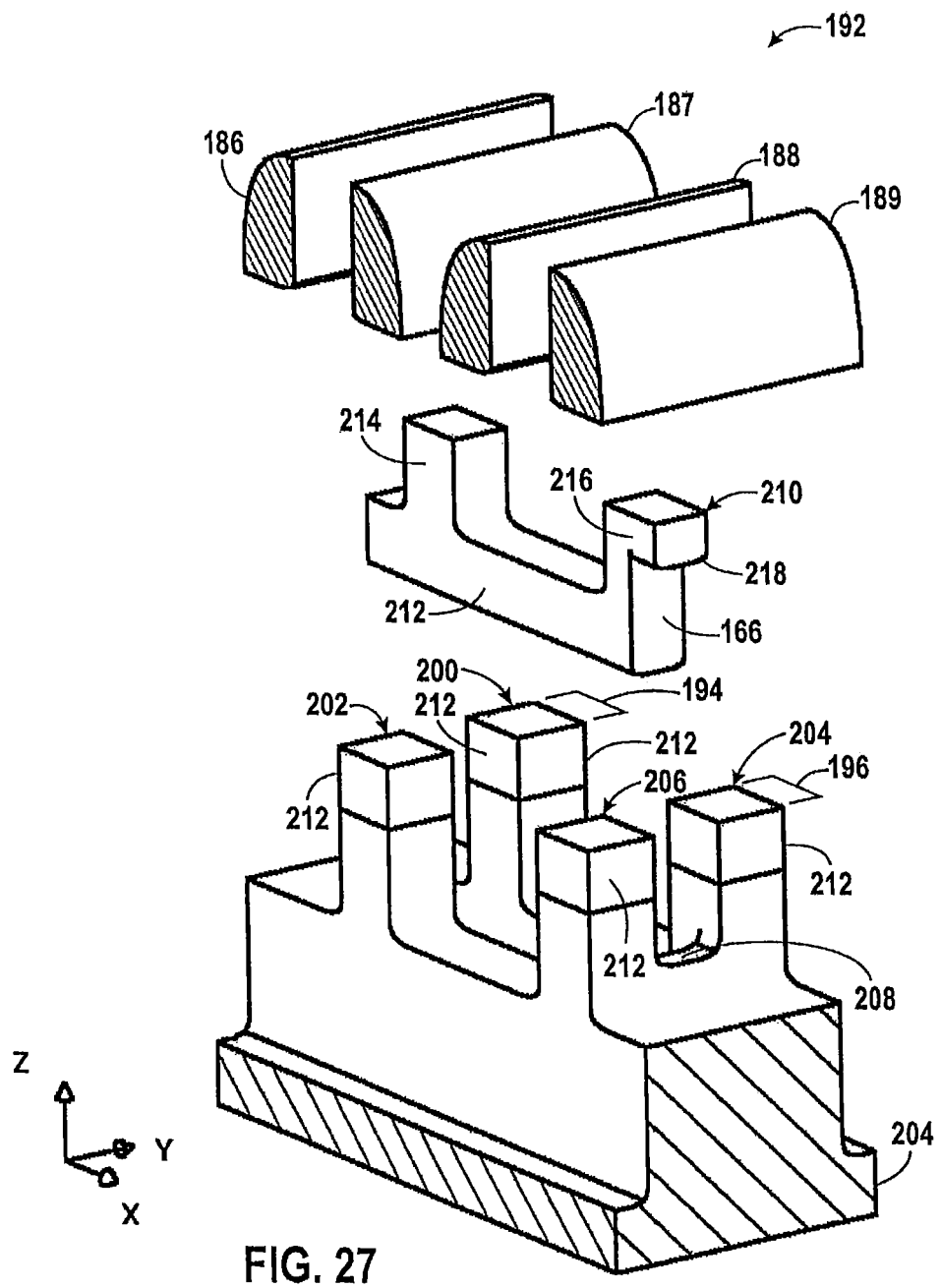

FIG. 27 is an exploded view of portions of the example of a single cell 192. The cell 192 may include the semiconductor portion described with reference to FIGS. 25 and 26, a column-gate segment 210, and the row gates 186, 187, 188, and 189. The column-gate segment 210 may be formed from the column gate 166 by partitioning the column gate 166 during formation of the row-gate trenches 182, as illustrated by FIG. 20. The column-gate segment 210 may be separated, e.g., electrically isolated, from other column-gate segments 210 formed from the same column gate 166 and other column gates 166. Each column-gate segment 210 may include a buried member 212 and two risers 214 and 216. The risers 214 and 216 may extend generally vertically and generally perpendicularly from the buried member 212, and the buried member 212 may electrically connect the risers 214 and 216 to each other. The riser 216 may include a lip 218 that extends generally perpendicularly from the riser 216 and is shaped to overlap the elevated portion 208. In some embodiments, the top of the risers 214 and 216 generally do not overlap the upper doped region 212. The column-gate segment 210 may be generally complementary to the cavity 198.

Though not shown in FIG. 27, the cell 192 may also include the insulating members described above: the dielectric 146, the column-gate dielectric 164, the row-gate dielectric 184, and the dielectric material 190.

Figure 29:
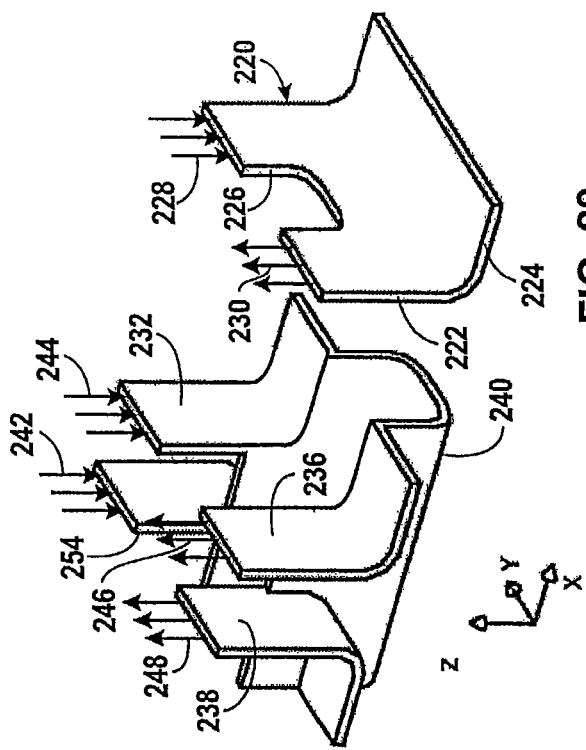
Figure 30:
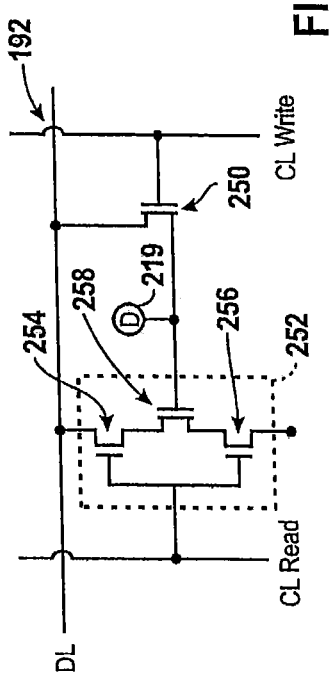
FIG. 30 illustrates a circuit schematic of a single data cell that may be formed with the access device and the driver illustrated by FIGS. 1-29.
Figure 28:
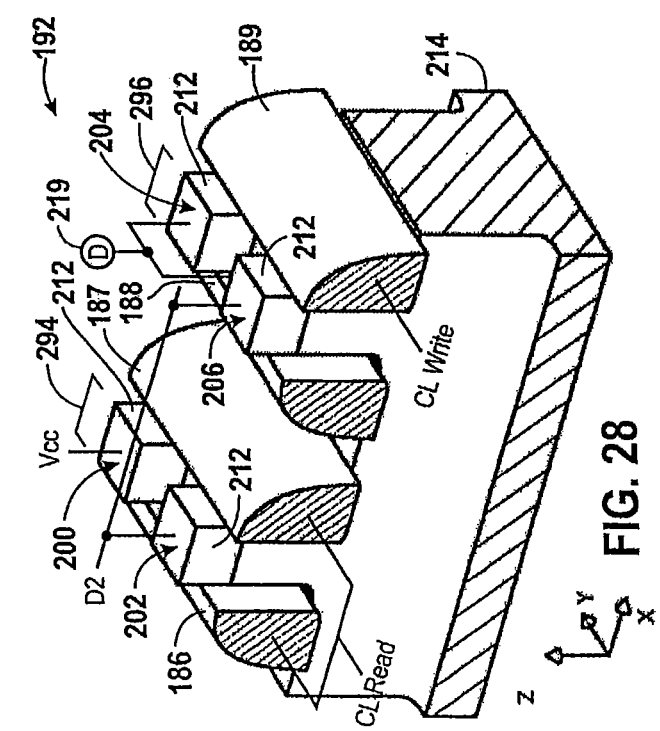

FIGS. 28, 29, and 30 illustrate one use for the structures described above. FIG. 28 is a perspective view of portions the portions of cell 192, illustrating one way in which the cell 192 may be configured to form a data cell, and FIG. 29 is a perspective view of conductive channels that may be formed during the operation of the cell 192. FIG. 30 is a circuit diagram of an example of a data cell that may be formed with the cell 192 or other cells.

As illustrated by FIGS. 28 and 30, the cell 192 may be connected to a data element 219, a voltage source Vcc, a data line DL, a read control line CL READ, and a write control line CL WRITE. In some embodiments, the data line may be referred to as a digit line, and the control lines may be referred to as word lines. In these figures, connections to the cell 192 are represented in schematic form to emphasize that the cell 192 may be connected to other devices with a variety of techniques. One example of a process for forming these connections is illustrated by subsequent figures.

As illustrated by FIG. 28, the data line DL/D2 may connect to the legs 202 and 206. The voltage source may connect to the leg 200, and the data elements 219 may connect to both the leg 204 and the column-gate segment 210 (viewable in FIG. 27). The data element 219 may connect to the column-gate segment 210 via the riser 216 and the lip 218. The read control line may connect to or be formed from the row gates 186 and 187, and the write control line may connect to or be formed from the row gate 189. In some embodiments, the row gate 188 may be unused during some or all of the following operations of the cell 192, or it may connect to the write control line.

When a voltage (e.g., a voltage greater than the threshold voltage or less than the threshold voltage, depending on the doping of the upper doped regions 112 and the lower doped region 114) is applied to the row gate 189, the cell 192 may form a conductive channel 220, an example of which is illustrated by FIG. 29. In some embodiments, the channel 220 may include a generally vertical portion 222 and a generally horizontal portion 224, e.g., these portions 222 and 224 may generally form an L-shape. (Hereinafter, these portions are referred to as the vertical portion 222 and the horizontal portion 224, which is not to suggest that these features or any others are necessarily exactly vertical, horizontal, or orthogonal). The vertical portion 222 may include a generally non-conductive notch 226 in the upper part of the vertical portion 222.

In operation, the channel 220 may conduct current between the leg 204 and the leg 206. In some embodiments, the distal portion of the legs 204 and 206 may be referred to as a source and a drain. The current between the leg 204 and the leg 206 is represented both by arrows 228, corresponding to current flowing into the channel 220 from the leg 204, and by arrows 230, corresponding to current exiting the channel 220 through the leg 206. In other embodiments, or other operations, the direction of current may be reversed. When a sub-threshold voltage is applied to the row gate 189, the cell 192 may not establish the channel 220, and current may generally not flow from the upper doped regions 212 of the legs 204 and 206 through the lower doped region 214. Thus, in some embodiments, current flowing between the legs 204 and 206 may be controlled by the voltage of the row gate 189. (As used herein, a sub-threshold voltage is a voltage that allows current to flow and may be a voltage less than the threshold voltage or a voltage greater than the threshold voltage, depending on the configuration of the cell, e.g., a PMOS-type cell or an NMOS-type cell).

Current flowing between the legs 200 and 202 may be partially or substantially entirely controlled by two-different voltages: the voltage of the control read lines CL READ and the voltage of the column-gate segment 210 (FIG. 27). As illustrated by FIGS. 29, upper channel portions 232, 234, 236, and 238 may be established by electric fields emanating from row gates 186 and 187. Each of these upper channel portions 232, 234, 236, and 238 may include a generally vertical portion and a generally horizontal portion, e.g., they may generally have an L-shape. The upper channel portions 232 and 234 may be formed in the leg 200, and the upper channel portions 236 and 238 may be formed in the leg 202.

The upper channel portions 232 and 234 may be connected to the upper channel portions 236 and 238 by a lower channel 240. The lower channel 240 may be generally orthogonal to both the generally horizontal and the generally vertical portions of the upper channel portions 232, 234, 236, and 238. In some embodiments, the lower channel 240 generally extends in the X-direction and generally has a U-shaped cross section. The lower channel 240 may be formed by electric fields emanating from the column-gate segment 210 (FIG. 27).

In operation, current may flow between the legs 200 and 202 when both the upper channel portions 232, 234, 236, and 238 and the lower channel 240 are formed. Thus, the fin 194 may form an AND gate with a pair of upper transistors that are controlled by the row gates 186 and 187 and a lower transistor that is controlled by the column-gate segment 210. An example of current flow is illustrated by arrows 242 and 244, depicting current flow into the upper channel portions 232 and 234. These currents 242 and 244 may flow through the lower channel 240 and, then, out the upper channel portions 236 and 238, as illustrated by arrows 246 and 248. The upper channel portions 232 and 234 may be said to be connected in series to the upper channel portions 236 and 238 by the lower channel 240. In other embodiments or other operations, the direction of current may be reversed.

FIG. 30 illustrates the cell 192 (and other cells in accordance with the present technique) in circuit schematic form. The illustrated cell 192 may include the data element 219, a transistor 250, and a driver 252. The data element 219 may include a variety of different types of data elements. For example, the data element 219 may include a sensor, such as an image sensor, e.g., a charge-coupled device or photodiode, or a memory element. Among the various types of envisioned memory elements are volatile memory elements, such as dynamic random access memory (DRAM), and nonvolatile memory elements, such as phase-change memory elements (e.g., ovonic devices), floating gate memory elements, ferroelectric memory elements, magnetoresistive memory elements, and semiconductor-oxide-nitride-oxide-semiconductor (SONOS) memory elements.

The transistor 250 illustrated by FIG. 30 may be formed by the fin 196 of FIG. 28, and the driver 252 illustrated by FIG. 30 may be formed by the fin 194 of FIG. 28. In some embodiments, the driver 252 may include two access transistors 254 and 256 and an amplifying transistor 258. The access transistors 254 and 256 may be formed by legs 200 and 202 of the fin 194, as illustrated by FIG. 28, and the amplifying transistor 258 may be formed by the portion of the fin 194 adjacent the column-gate segment 210, as illustrated by FIG. 27. The access transistors 254 and 256 may be referred to as read-access devices, and the transistor 250 may be referred to as a write-access device. Other embodiments may include other types of read-access and write-access devices, such as diodes.

The cell 192 illustrated by FIG. 30 may output data from the data element 219. In operation, the data element 219 may apply a voltage to the gate of the amplifying transistor 258, and the amplifying transistor 258 may amplify this signal. The amplifying transistor 258 may be configured to operate in its triode region, and it may drive a current between its source and its drain that varies according to the voltage from the data element 219, e.g., the amplifying transistor 258 may conduct a current that is generally proportional to the voltage of its gate. To conduct current through the amplifying transistor 258, the access transistors 254 and 256 may close a path between the voltage source Vcc and the data line DL. When a read signal is asserted on the read control line CL READ, the access transistors 254 and 256 may enter a conductive state, allowing current to flow between the data line DL and the voltage source Vcc, through the amplifying transistor 258. The magnitude of the current to or from the data line DL may be controlled, in part or substantially entirely, by a voltage that the data element 219 applies to the gate of the amplifying transistor 258. Thus, in some embodiments, current flowing between the data line DL and the voltage source Vcc may be indicative of (e.g., generally proportional to) a data value being output from the data element 219.

Some embodiments of the driver 252 are believed to increase the speed and accuracy with which the data element 219 conveys data through the data line DL. Because the current flowing into the data line DL is supplied by the voltage source Vcc rather than the data element 219, the speed with which the data line DL changes voltage when reading data may be at least partially decoupled from the size of the data element or its signal. Thus, relatively small data elements 219 that supply relatively small currents may still rapidly change the digit line DL voltage.

In some embodiments, the data element 219 may convey multiple bits, e.g., 2, 3, 4, 5 or more bits of data, through relatively small changes in the voltage applied to the gate of the amplifying transistor 258. These relatively small differences in voltage may be amplified by the driver 252 and output via the data line DL. Thus, the resolution of the data element 219 may be increased by amplifying signals with the driver 252.

In some embodiments, such as those in memory devices, data may be written to the data element 219. To write data, a signal may be asserted on the write control line CL WRITE, and this signal may turn on the transistor 250. When the transistor 250 is turned on, current may flow from the data line DL to the data element 219, and this current may change a property of the data element 219, e.g., a stored charge or degree of crystalintity. The change in the property of the data element 219 may be used to store data.

Figure 31:
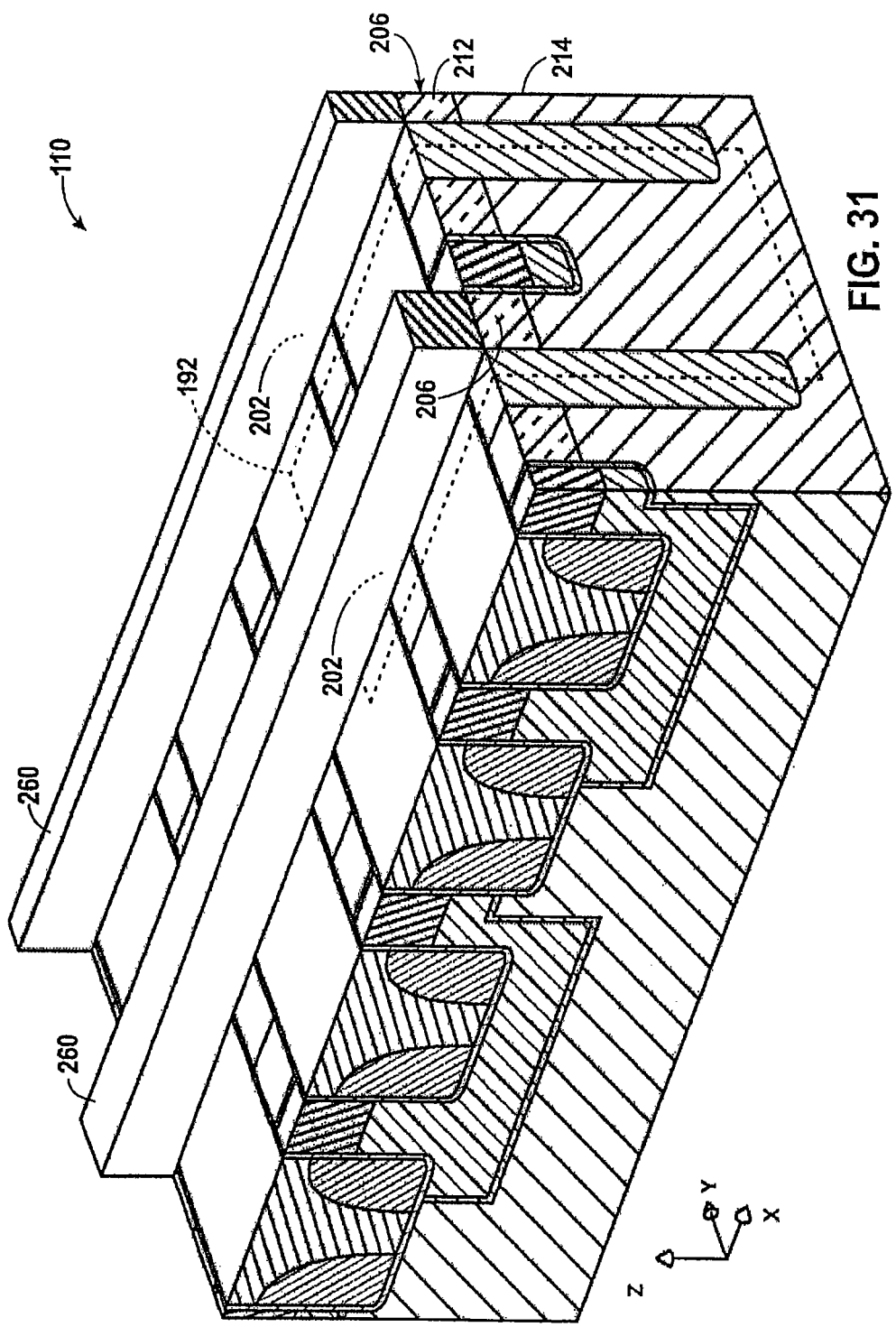

FIGS. 31-38 illustrate an example of a process for connecting the cell 192 of FIG. 28 to a capacitor memory element. As illustrated by FIG. 31 digit lines 260 may be formed on the substrate 110. The digit lines 260 may generally extend in the X-direction, and they may connect to the legs 206 and 202 of the cells 192. The data lines 260 may be generally straight, but in other embodiments they may have other shapes, e.g., they may undulate, vary in width, or be segmented. In some embodiments, the data lines 260 may be spaced above the legs 202 and 206, and they may be connected to the legs 202 and 206 through a via, a contact, or other structure.

Figure 32:
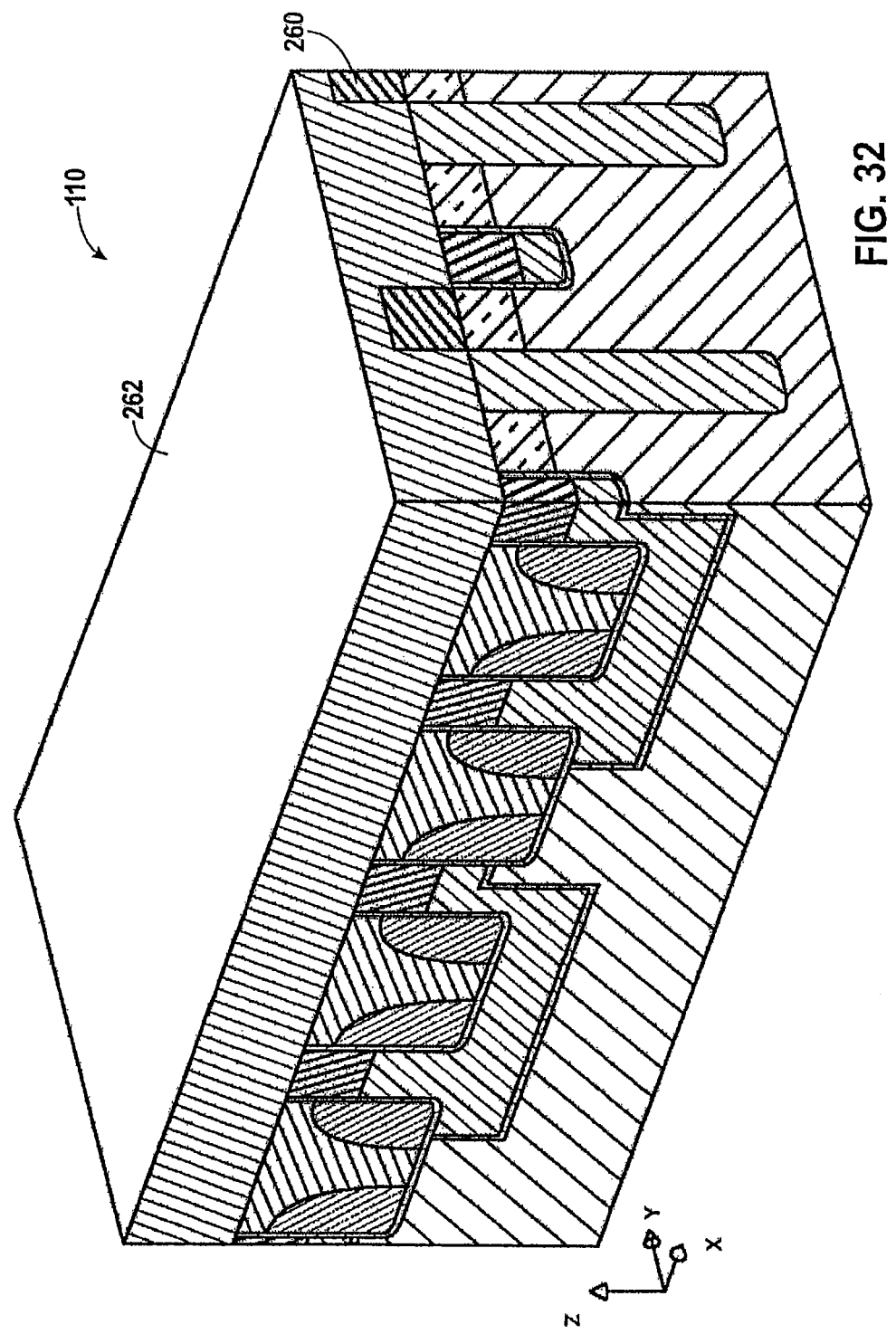
Figure 33:
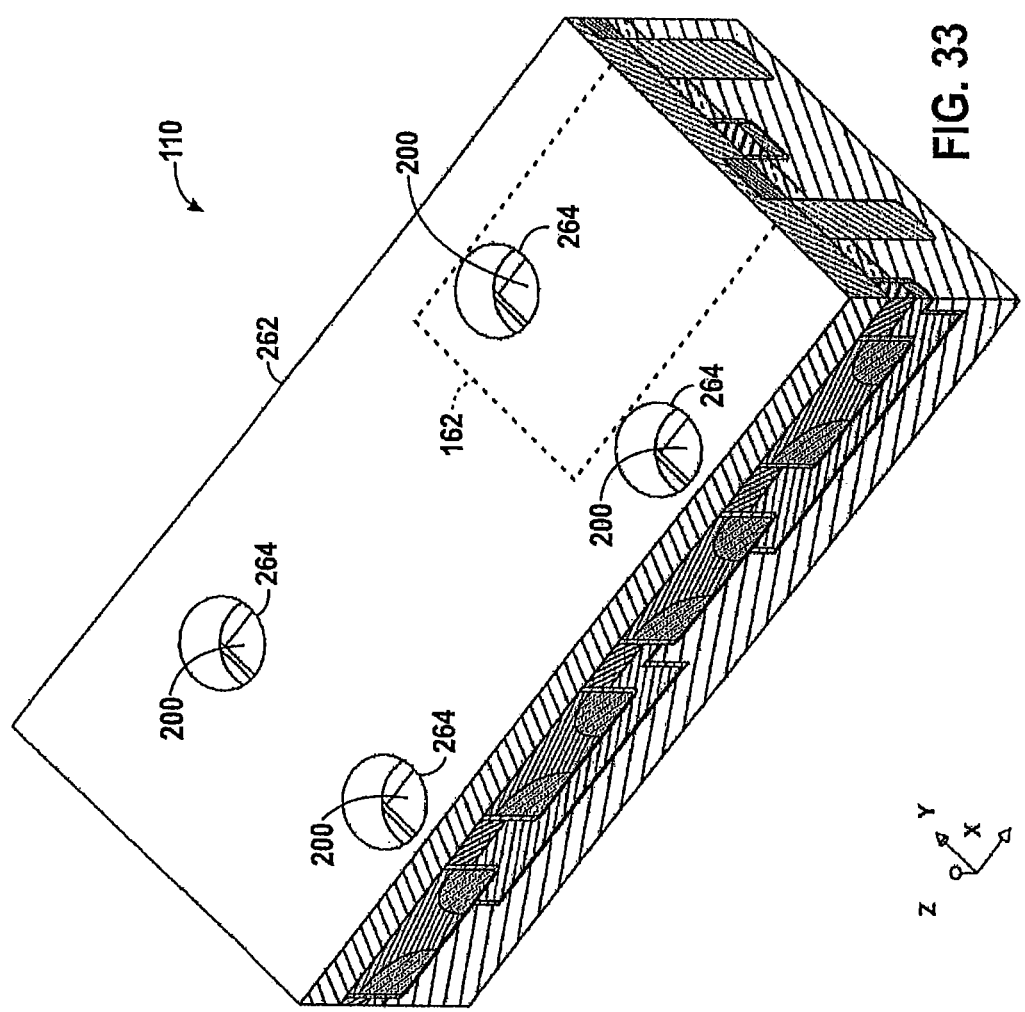

Next, a dielectric body 262 may be formed on the data lines 260, as illustrated by FIG. 32, and vias 264 may be opened through the dielectric body 262, as illustrated by FIG. 33. The vias 264 may expose the legs 200 in each of the cells 192. The vias 264 may be formed by patterning the substrate 110 with photolithography and then generally anisotropically etching the substrate 110 to remove exposed portions of the dielectric body 262.

Figure 34:
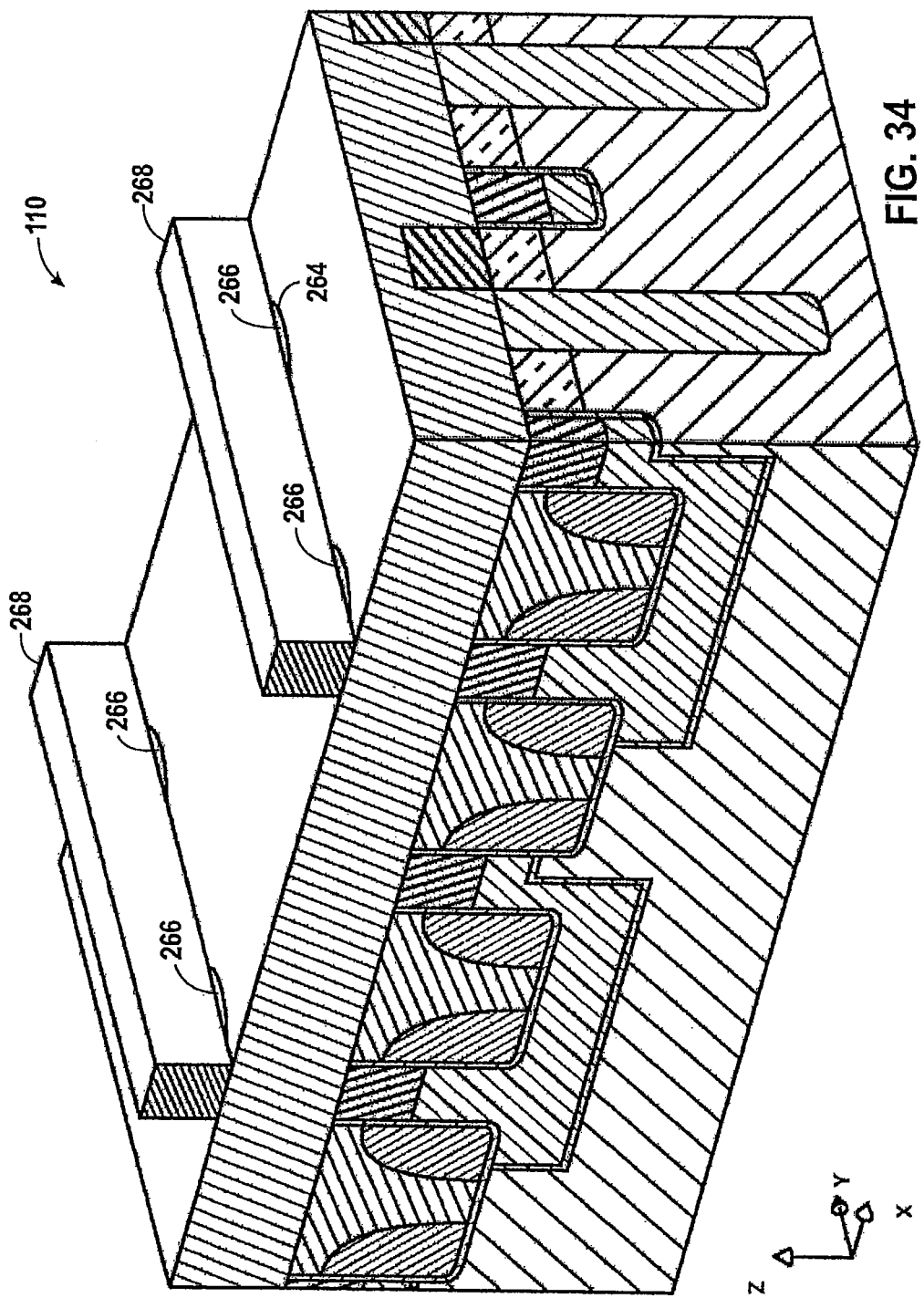

After opening the vias 264, contacts 266 may be formed in the vias 264 and voltage-source connectors 268 may be formed, as illustrated by FIG. 34. In some embodiments, the contacts 266 may be formed by depositing a generally conductive material, such as one or more of the conductive materials described above, on the substrate 110 and etching the conductive material until the conductive material remains primarily inside the vias 264. In some embodiments, the power-source connectors 268 may be formed by depositing a generally conductive film and patterning and etching the conductive film. The illustrated voltage-source connectors 268 extend generally in the Y-direction. In other embodiments, they may extend in other directions, e.g., the X-direction, or they may be formed from a conductive plate.

Figure 35:
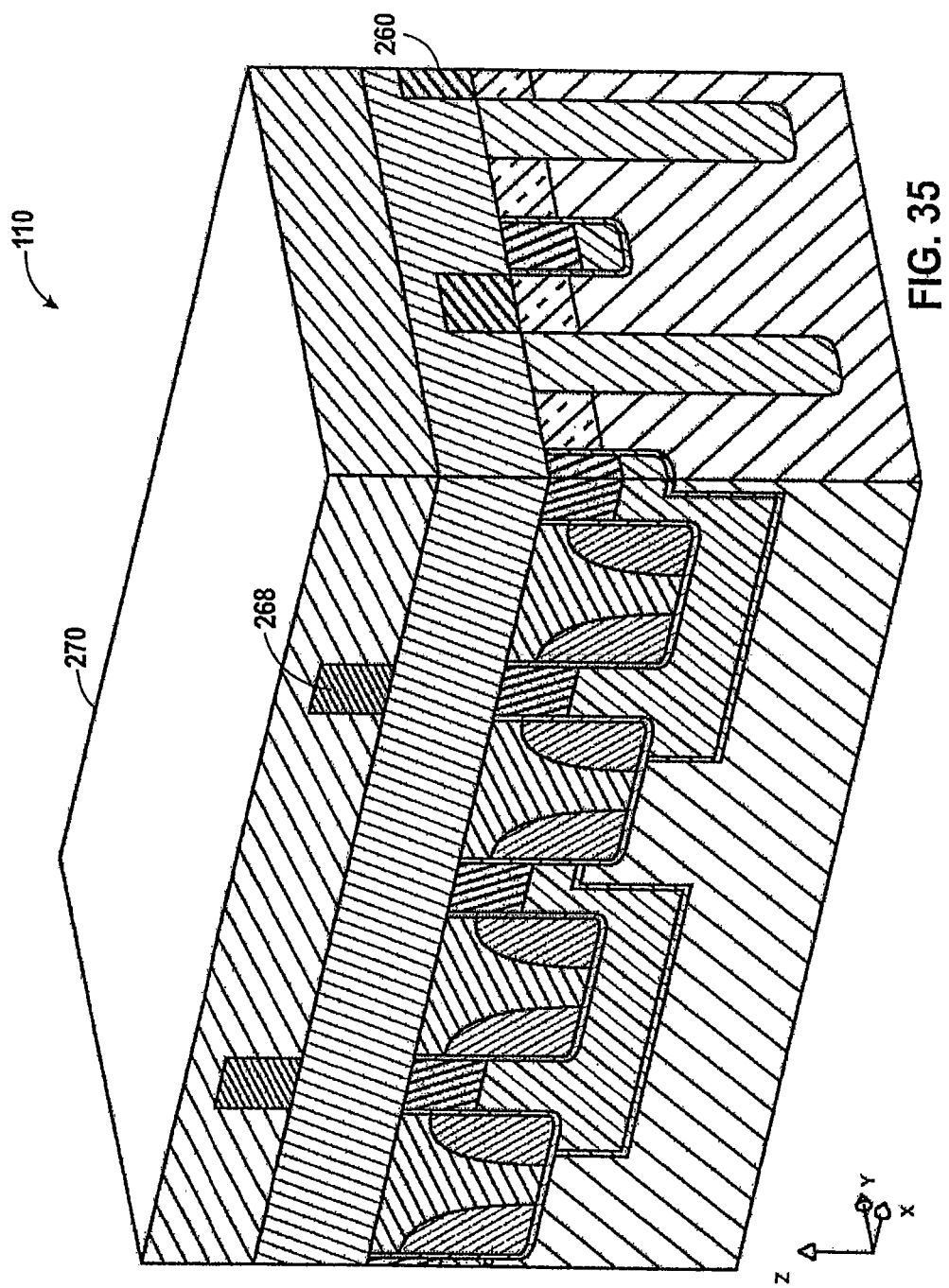

Next, another dielectric body 270 may be formed on the substrate 110, as illustrated by FIG. 35. The dielectric body 270 may be made of an oxide, a nitride, a spun-on dielectric, or other appropriate materials.

Figure 36:
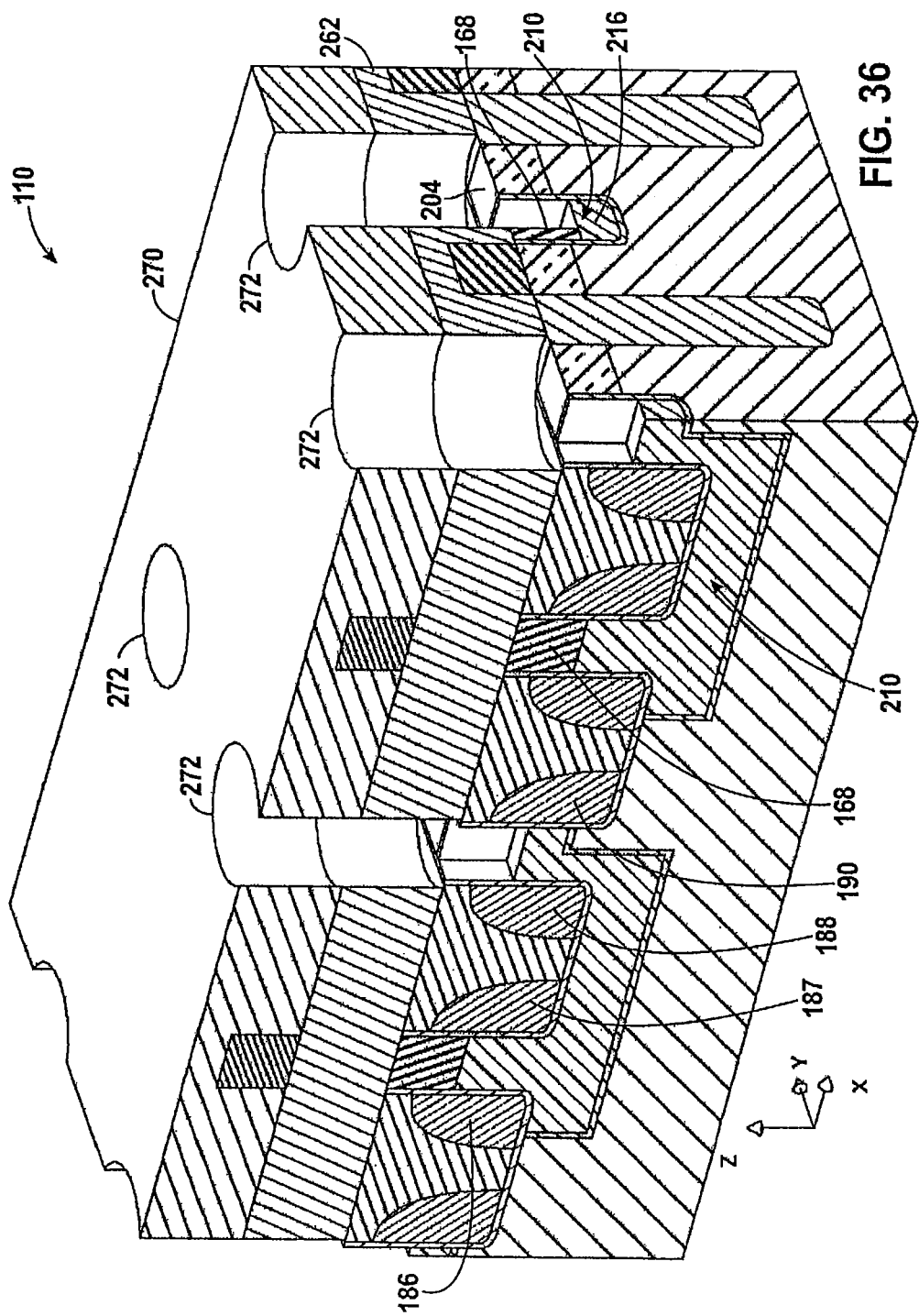

After forming the dielectric body 270, vias 272 may be formed through the dielectric body 270 and the dielectric body 262, as illustrated by FIG. 36. The vias 272 may be formed by patterning the substrate 110 with photolithography and generally anisotropically etching the substrate 110. In some embodiments, the vias 272 may overlap both the leg 204 and the riser 216 of the column-gate segment 210. In some embodiments, the etch that opens the vias 272 may selectively remove a portion of the column-gate cover 168 to expose part of the column-gate segments 210. In certain embodiments, this etch may not remove a substantial portion of the protective dielectric 190 that covers the row gates 186, 187, 188, and 190, such that these structures remained generally isolated from the column-gate segment 210.

Figure 37:
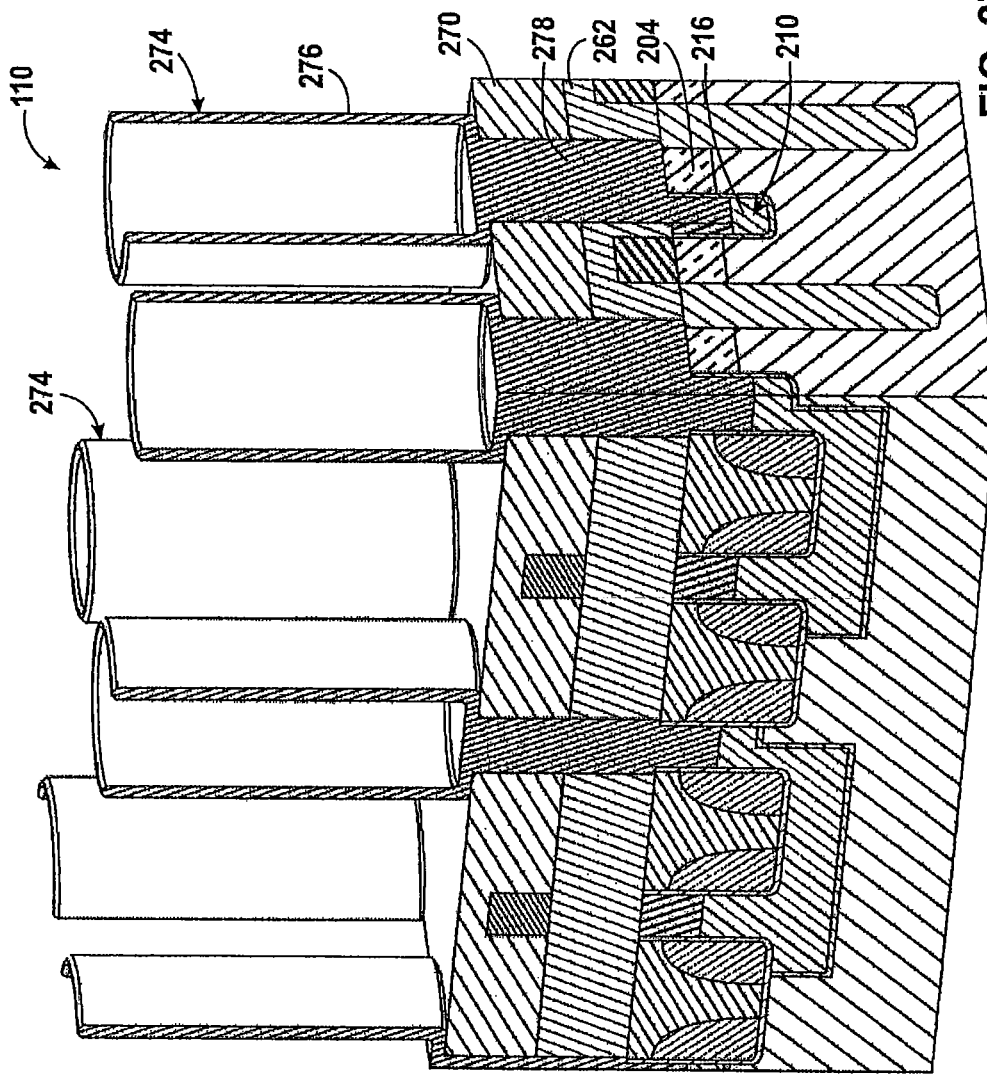

Next, capacitor plates 274 may be formed on the substrate 110, as illustrated by FIG. 37. The capacitor plates 274 may include an upper, cup-shaped portion 276 and a lower contact 278. The cup-shaped portion 276 may be formed by depositing a sacrificial layer and, then, etching holes that are complementary to the capacitor plates 274 in the sacrificial layer. After forming the holes, a generally conformal film may be deposited on the sacrificial layer and planarized, e.g., with chemical-mechanical planarization, to remove the portion of the conformal film disposed outside of the holes, thereby leaving the cup-shaped portion 276. The capacitor plates 274 may be made of a conductive material, e.g., a metal, doped polysilicon, or other appropriate materials. The lower contact 278 may connect to both the leg 204 and the riser 216 of the column-gate segment 210. In subsequent steps, a capacitor dielectric may be deposited on the capacitor plates 274, and a common capacitor plate may be formed by depositing a conductive film on the substrate 110, thereby forming capacitors.

In operation, the capacitor plates 274 may store data by accumulating a charge. The size of the charge may correspond to particular data values, e.g., a small charge may correspond to a zero and a larger charge may correspond to a one. In some embodiments, the range of stored charge may be divided into smaller increments corresponding to multiple bit data values, e.g., two, three, four, or more bits.

Figure 38:
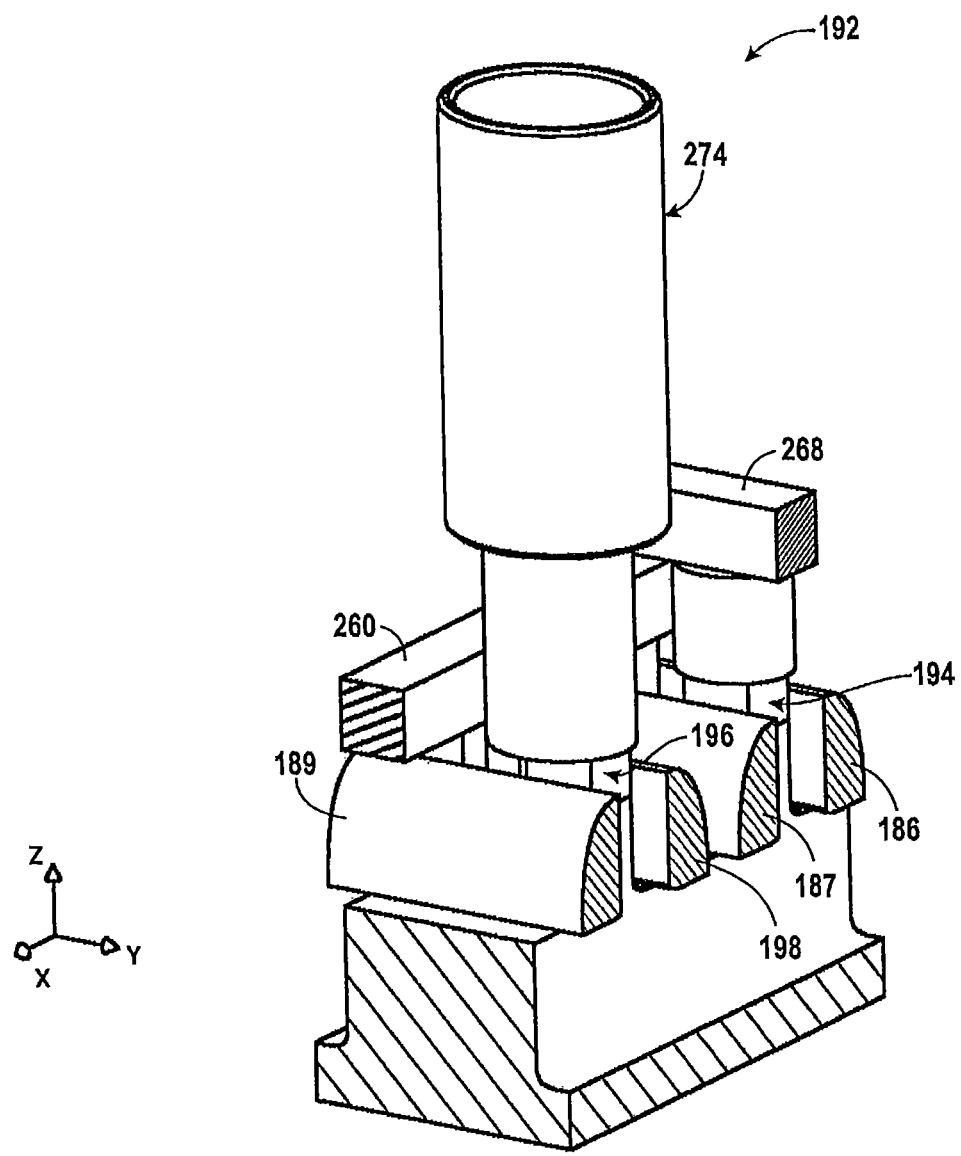

FIG. 38 illustrates an example of a single cell 192 connected to the capacitor plate 274. In this embodiment, the capacitor plate 274 is the data element, the fin 196 forms an access device controlled by the row gate 189, and the fin 194 forms a driver controlled by both the row gates 186 and 187 and the column-gate segment 210 (FIG. 27). When the row gates 186 and 187 are energized beyond a threshold voltage, current may flow from the voltage-source connector 268 to the data line 260 depending on the magnitude of the voltage asserted by the capacitor plate 274 on the column-gate segment 210 (FIG. 27). The magnitude of this current from the voltage source may indicate the value of data stored by the capacitor plate 274 by changing the voltage of the data line 260. For example, a rise in the voltage of the digit line 260 may correspond to a stored data value of 1, and a decrease in the voltage of the digit line 260 may correspond to a stored data value of 0.

Figure 39:
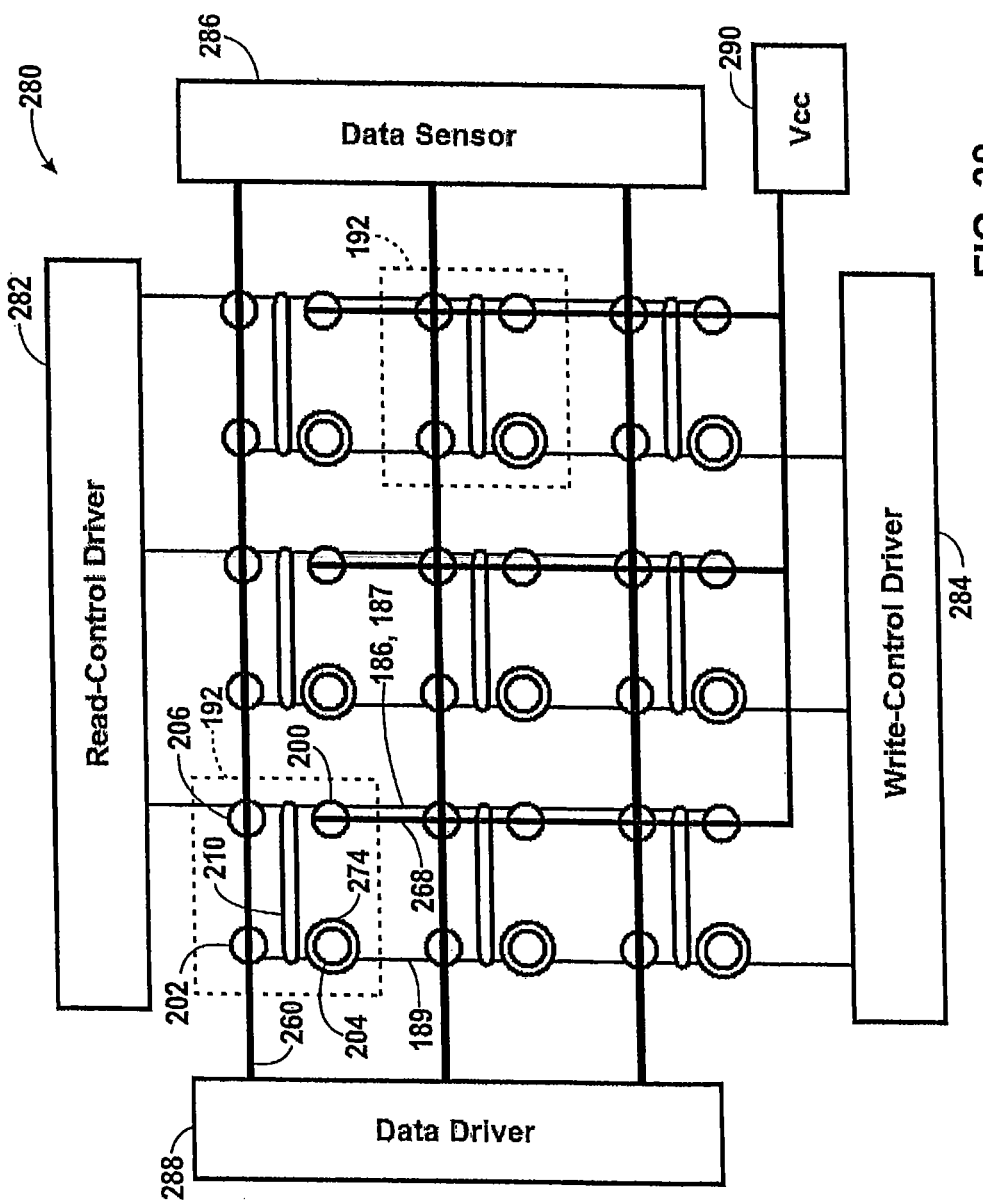
FIGS. 39 and 40 illustrate two embodiments of arrays of data cells in accordance with an embodiment of the present technique.

FIG. 39 illustrates one example of an array 280 of the cells 192. The illustrated array 280 may include a plurality of cells 192, a read-control driver 282, a write-control driver 284, a data sensor 286, a data driver 288, and a voltage source 290. As described above, the cells 192 may each include a capacitor plate 274, the column-gate segment 210, and the legs 200, 202, 204, and 206. The legs 202 and 206 of the cells 192 may connect to the data driver 288 and the data sensor 286, and the leg 200 may connect to the voltage source 290 via the voltage-source connector 268.

In operation, the data driver 288 may output a voltage or current through the data lines 260 to write data to the capacitor plates 274, and the data sensor 286 may read, e.g. categorize into discrete categories corresponding to digital values, currents or voltages output by the cells 192 on the data lines 260. The read-control driver 282 may be configured to select cells 192 for reading by asserting a voltage on the row gates 186 and 187 of a selected cell 192. In some embodiments, these row gates 186 and 187 may be referred to as read control lines or read word lines. The write-control driver 284 may be configured to select a cell 192 by asserting a voltage on the row gate 189 associated with that cell 192. The row gates 189 may be referred to in some embodiments as write-control lines or write word lines.

Figure 40:
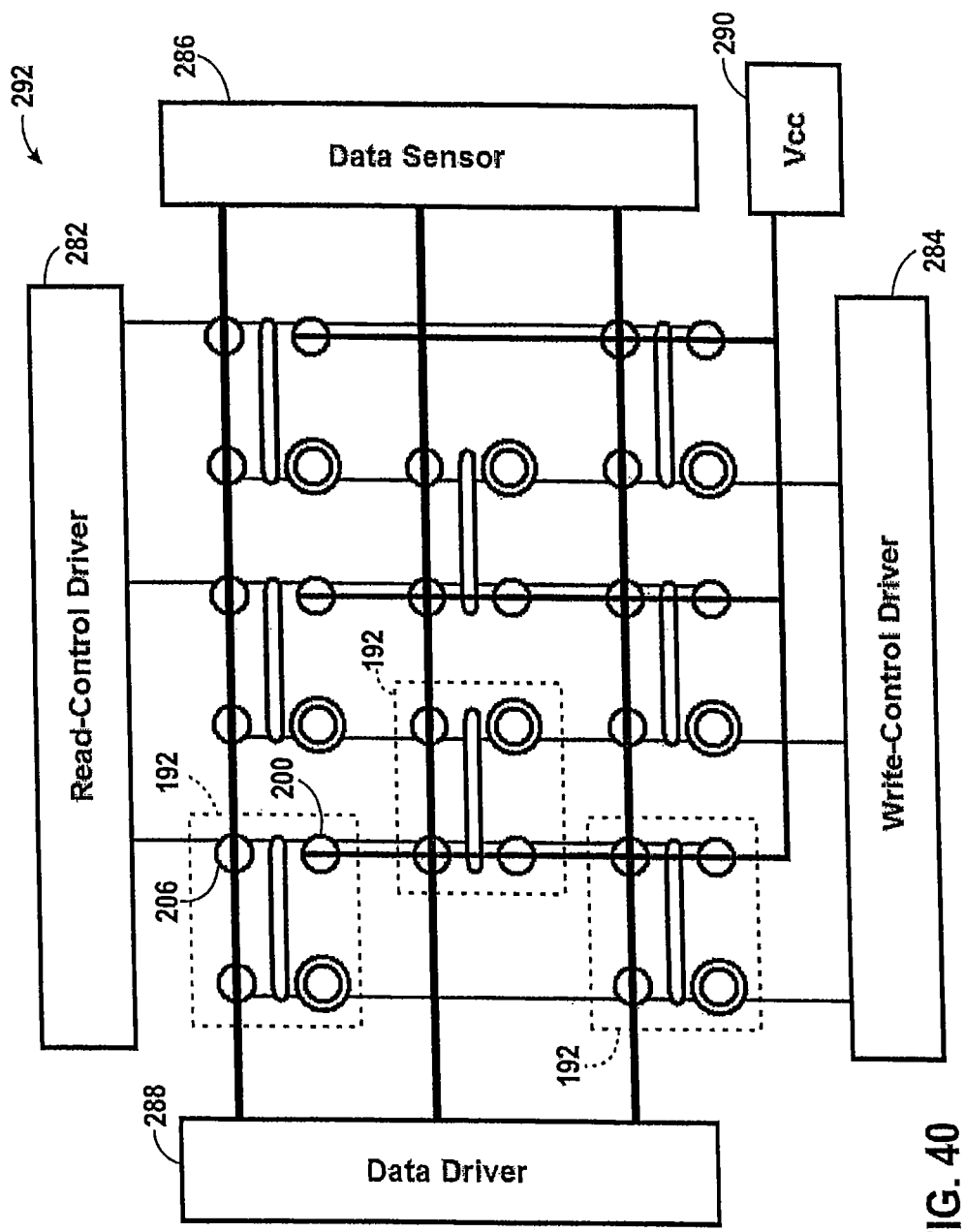

The illustrated cells 192 in the array 280 may be arranged in a generally rectangular lattice (e.g., they may have generally similar orientations and may be arranged in generally orthogonal rows and columns). In other embodiments, they may have other arrangements. For example, the cells 192 may be arranged in offsetting rows in a hexagonal lattice, or the cells 192 may be arranged with different orientations in adjacent rows, as illustrated by an array 292 of FIG. 40. In this embodiment, the cells 192 may be oriented in a first direction, and the cells 192' in adjacent rows may be oriented in an opposite direction and offset by approximately one-half of a cell 192.

FIGS. 41-63 illustrate another example of a process for forming a data cell with a driver. In the present example, the process begins with obtaining a substrate 294 in the state illustrated by FIG. 41. The substrate 294 may be obtained by executing (or contracting with others to execute) the steps illustrated by FIGS. 1-10 and described above. Accordingly, the substrate 294 may include the previously-described upper doped region 112, lower doped region 114, column isolation trenches 142, dielectric 146, vertical projections 148, and second group of column spacers 150.

Figure 41:
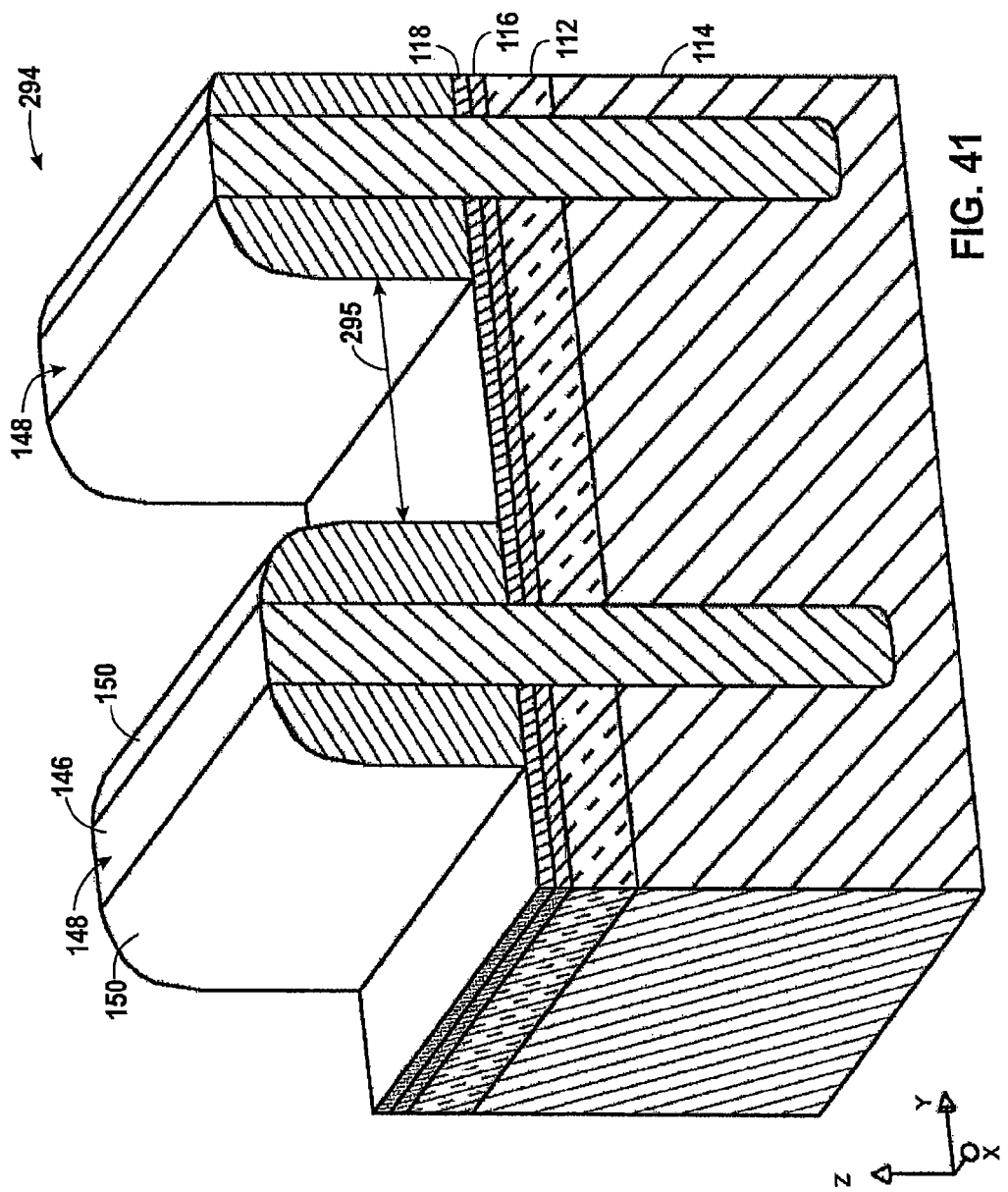
FIGS. 41-57 illustrate steps in a second embodiment of a process for forming an access device and a driver in accordance with an embodiment of the present technique.

In some embodiments, the substrate 294 of FIG. 41 may be different from the substrate 110 of FIG. 10 in at least one regard. The gaps 295 between adjacent column spacers 150 may be wider than the gaps 154 (FIG. 10). The wider gaps 295 may be made wider by adjusting the spacing of the column mask 126 (FIG. 3) to increase the distance between pairs of the column isolation trenches 142.

Figure 42:
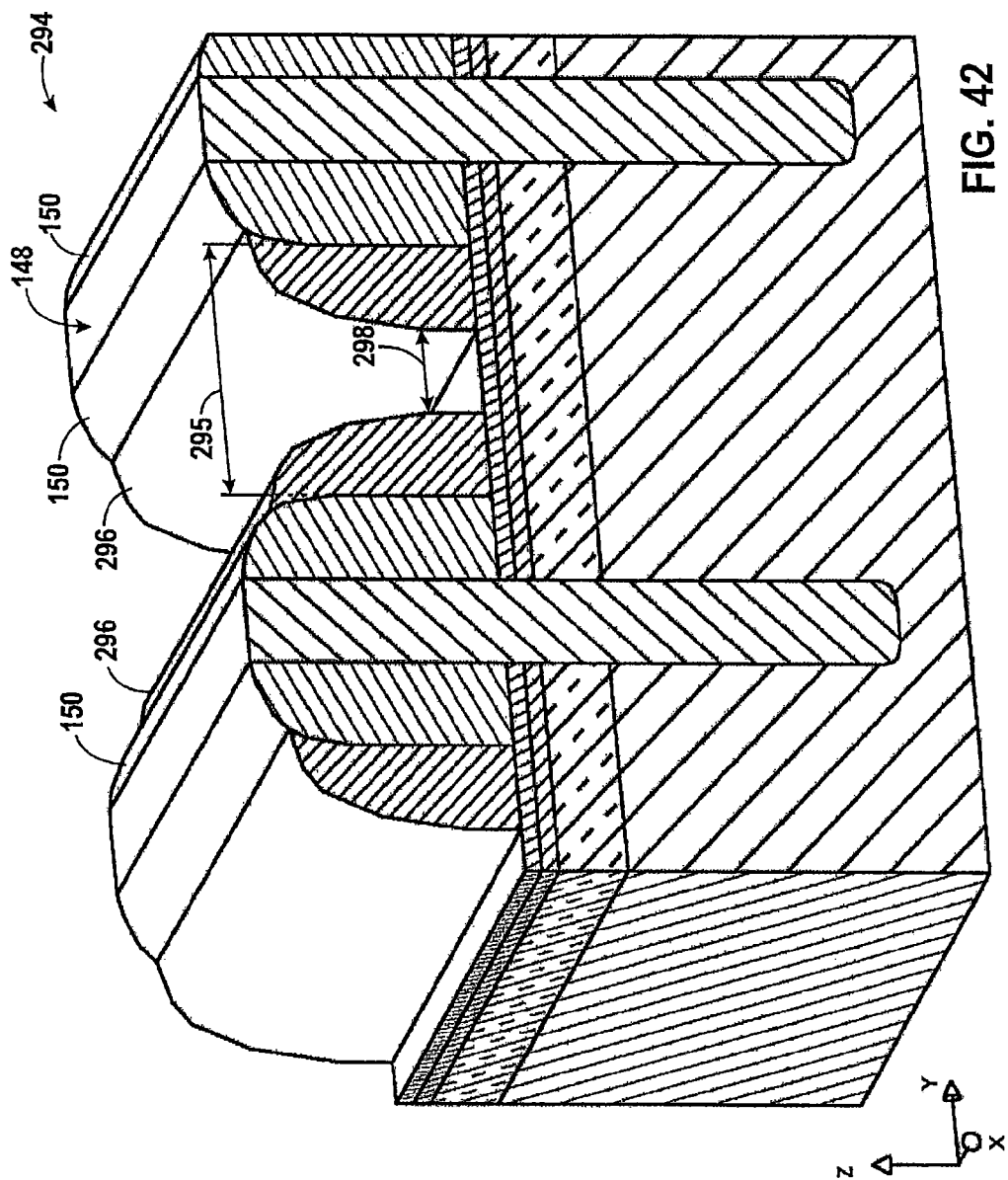

Next, a third column spacer 296 may be formed, as illustrated by FIG. 42. The third column spacer 296 may be formed by depositing a film on the substrate 294 and then generally anisotropically etching that film to remove the film from horizontal surfaces. The third column spacer 296 may generally define a gap 298 in the wider gap 295. In some embodiments, the gap 298 may be generally equal to the gap 154 (FIG. 3). The third column spacer 296 may be made of a different material from the second group of column spacers 150 and the vertical projections 148 to facilitate selective removal of the third column spacer 296. For example, the second group of column spacers 150 and the vertical projections 148 may be an oxide and the third column spacer 296 may be polysilicon.

Figure 43:
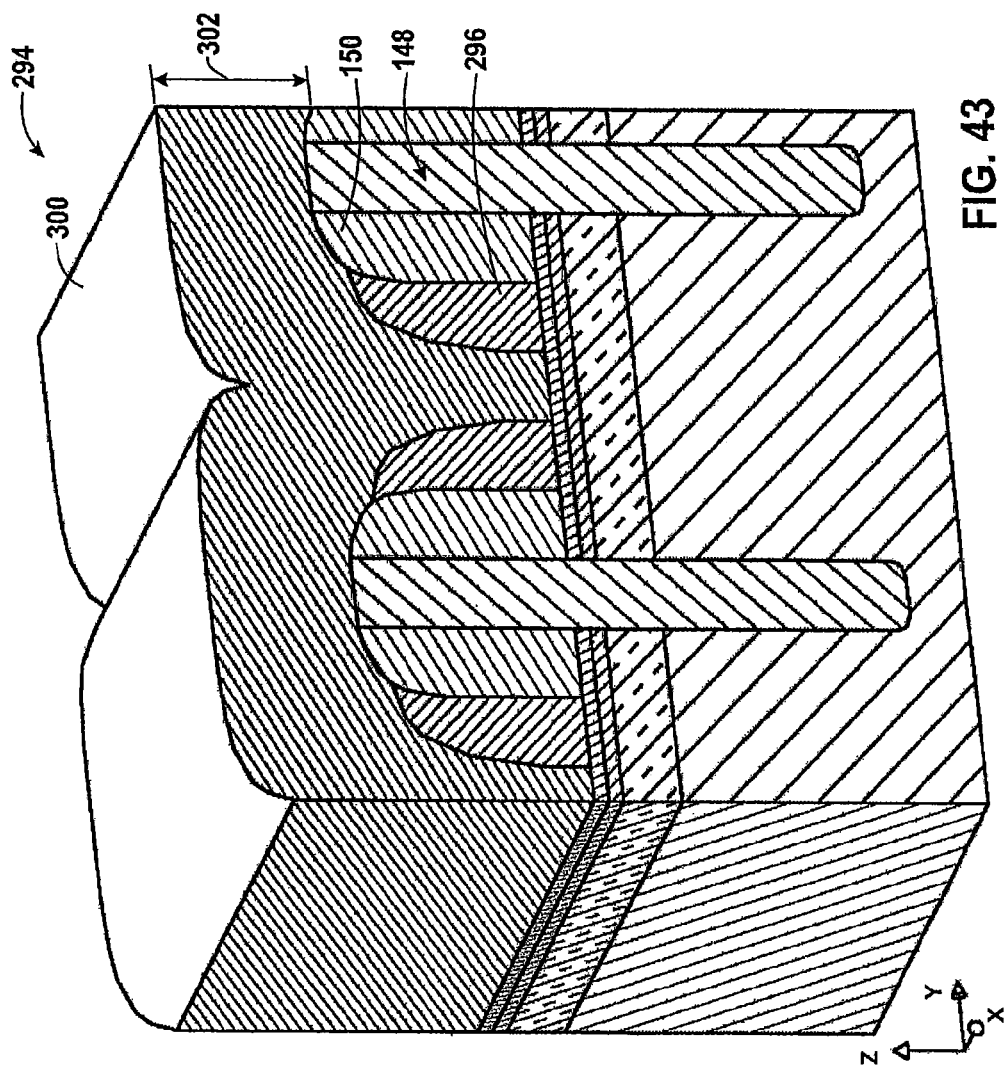

After forming the third column spacer 296, a masking material 300 may be formed on the substrate 294, as illustrated by FIG. 43. The masking material 300 may be formed with an overburden 302 to planarize the substrate 294. In some embodiments, the masking material 300 is a different material from the third column spacer 296 to facilitate selective removal of these materials. For example, the masking material 300 may be an oxide.

Figure 44:
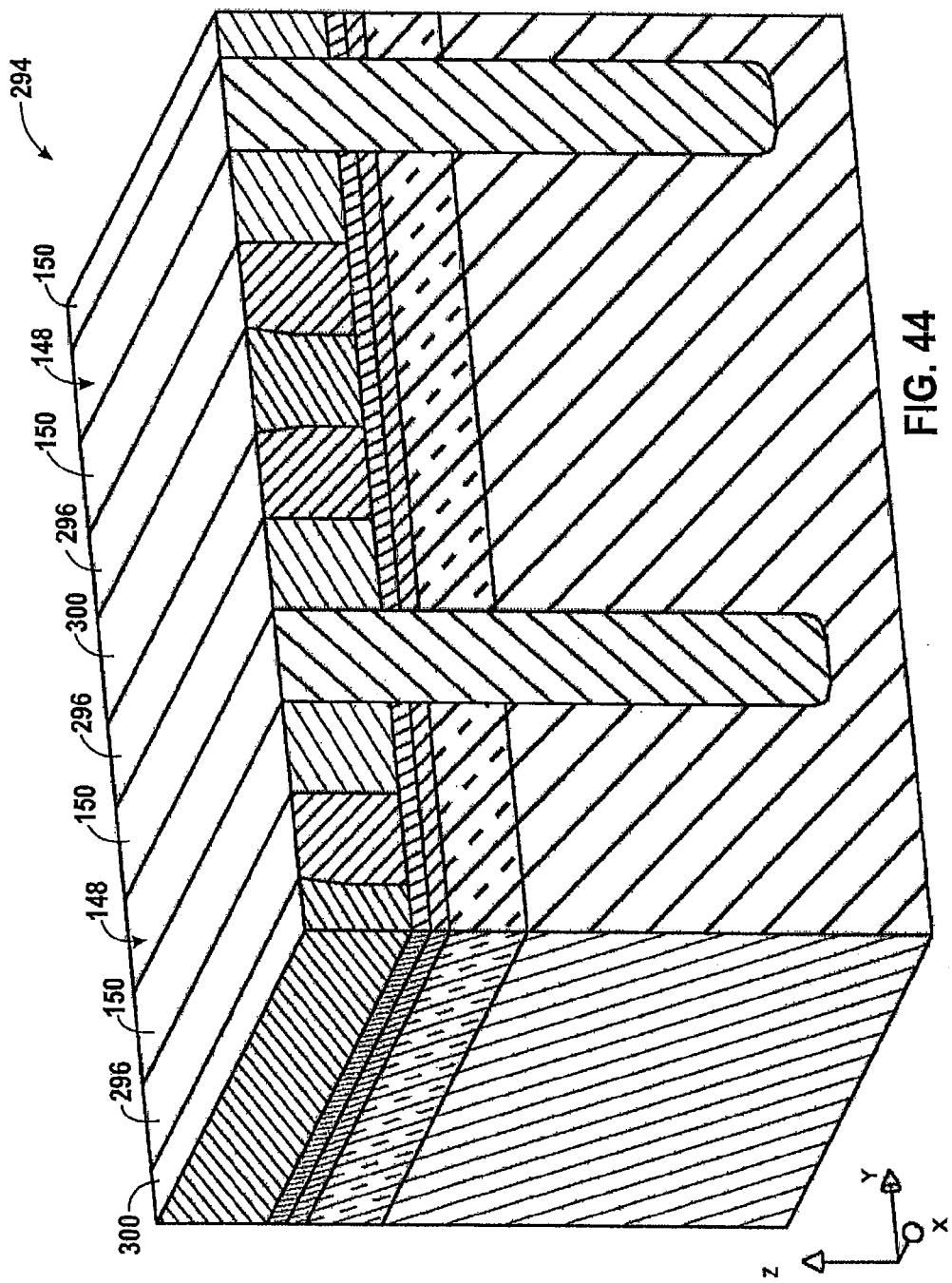

Next, the substrate 294 may be planarized, as illustrated by FIG. 44. Planarizing may include etching the substrate 294 with an etch that is generally nonselective among the materials being etched (such as an etch referred to in the art as an "alligator etch") or polishing the substrate 294 with chemical-mechanical planarization.

Figure 45:
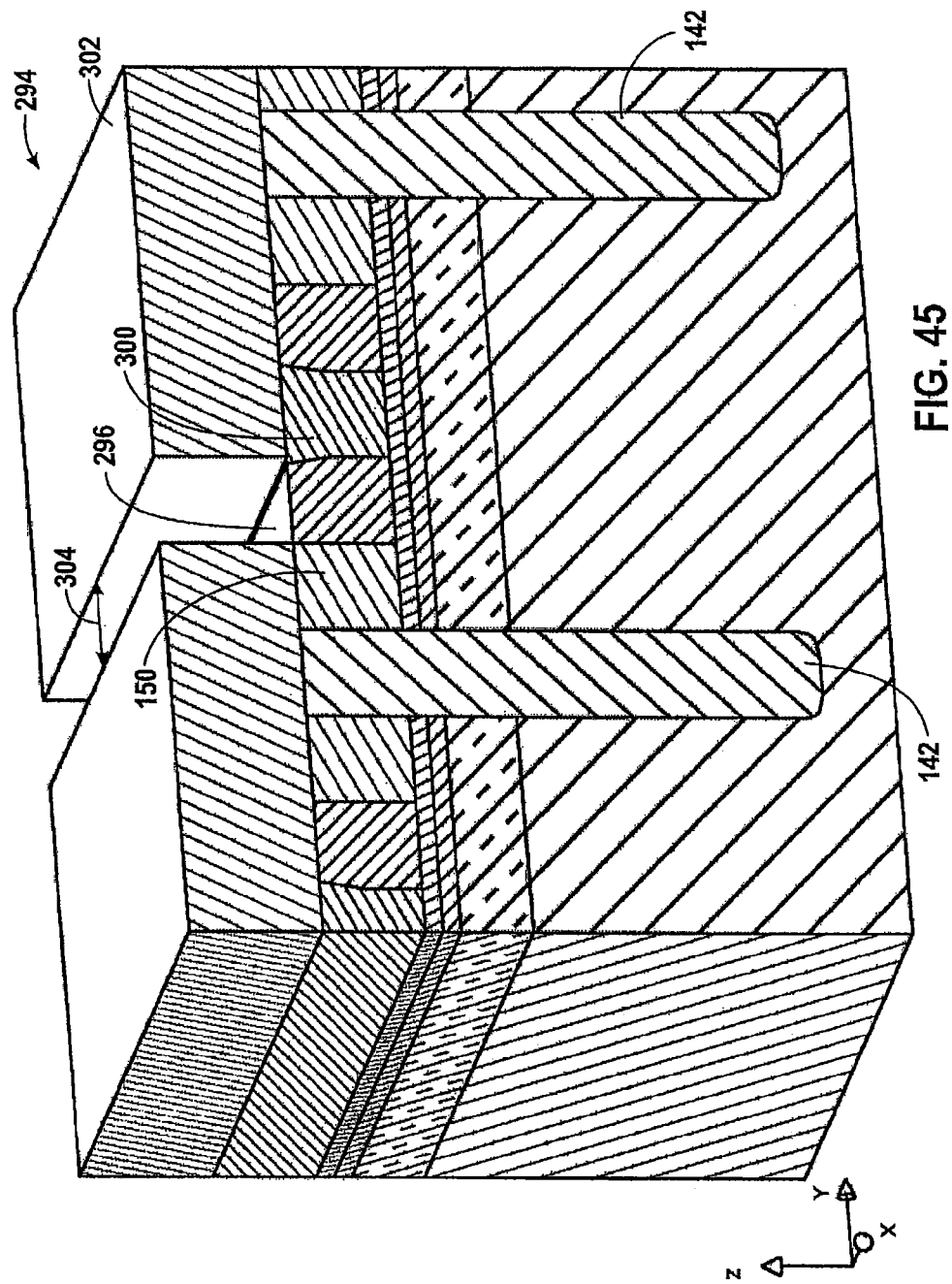

After planarizing the substrate 294, a column-notch mask 302 may be formed, as illustrated by FIG. 45. The column-notch mask 302 may be a hard mask (e.g., an oxide hard mask), or it may be made of photoresist. The column-notch mask 302 may generally cover the substrate 294 with the exception of the space above one of the third column spacers 296 between pairs of the column isolation trenches 142. In the illustrated embodiment, an exposed region 304 of the column-notch mask 302 may be generally aligned with the left third column spacer 296. The exposed region 304 may be made wider than the left third column spacer 296 to increase the alignment margin in the Y-direction, as the structures 150 and 300 adjacent the left third column spacer 296 may function as a hard mask.

Figure 46:
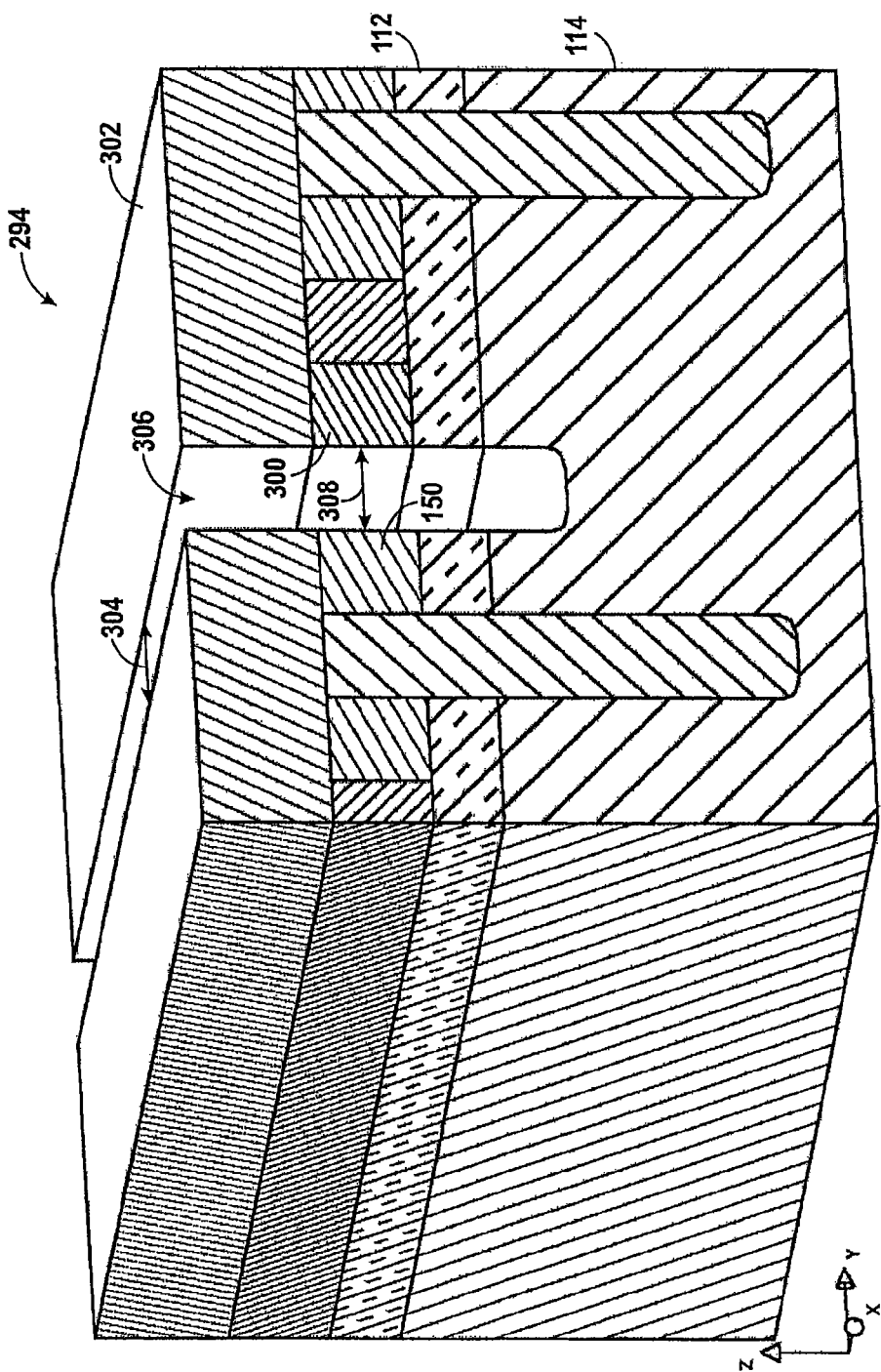

Next, a column notch 306 may be formed in the substrate 294, as illustrated by FIG. 46. In some embodiments, the column notch 306 may be formed by selectively etching the third column spacer 296 disposed under the exposed region 304 and, then, using the second group of column spacers 150 and the masking material 300 as a mask to etch through the upper doped region 112. In embodiments in which the third column spacer 296 is made of polysilicon, the third column spacer 296 may be removed with a tetramethylammonium hydroxide (TMAH) etch. Removing one of the third column spacers 296 may form a gap 308 that may generally define the width of the column notch 306. In some embodiments, the gap 308 may be narrower than or generally equal to 1 F, ¾ F, or ½ F.

Figure 47:
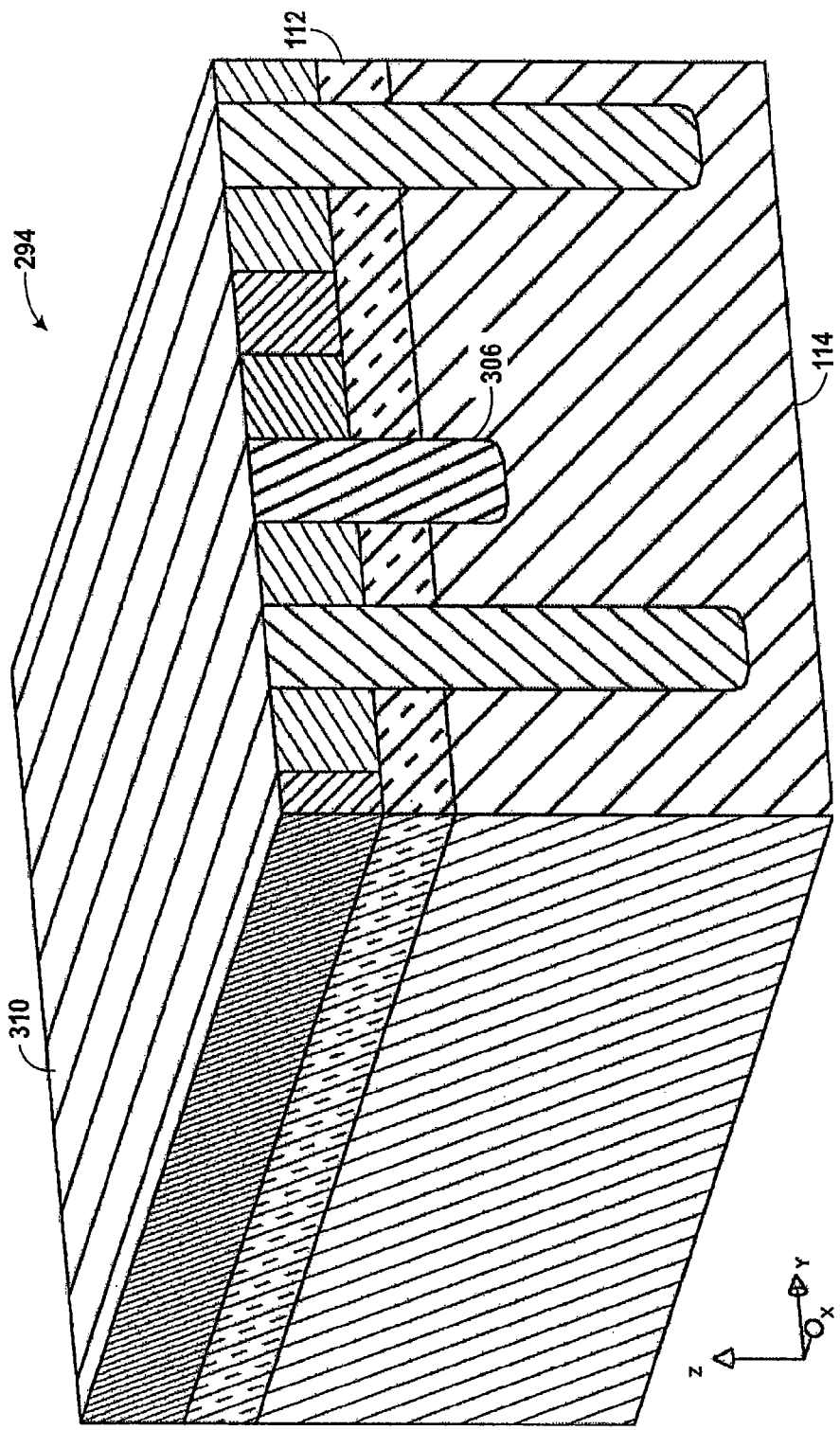

After forming the column notch 306, the column-notch mask 302 may be removed and the column notch 306 may be partially or entirely filled with a column-notch dielectric 310, as illustrated by FIG. 47. The column-notch dielectric 310 may be formed by depositing a dielectric material, such as an oxide like tetra-ethyl-ortho-silicate (TEOS), in the column notch 306 until the column notch 306 is substantially filled. In some embodiments, the column-notch dielectric 310 may include one or more liner materials, such as an oxide and a nitride liner, adjacent the upper doped region 112 and the lower doped region 114.

Figure 48:
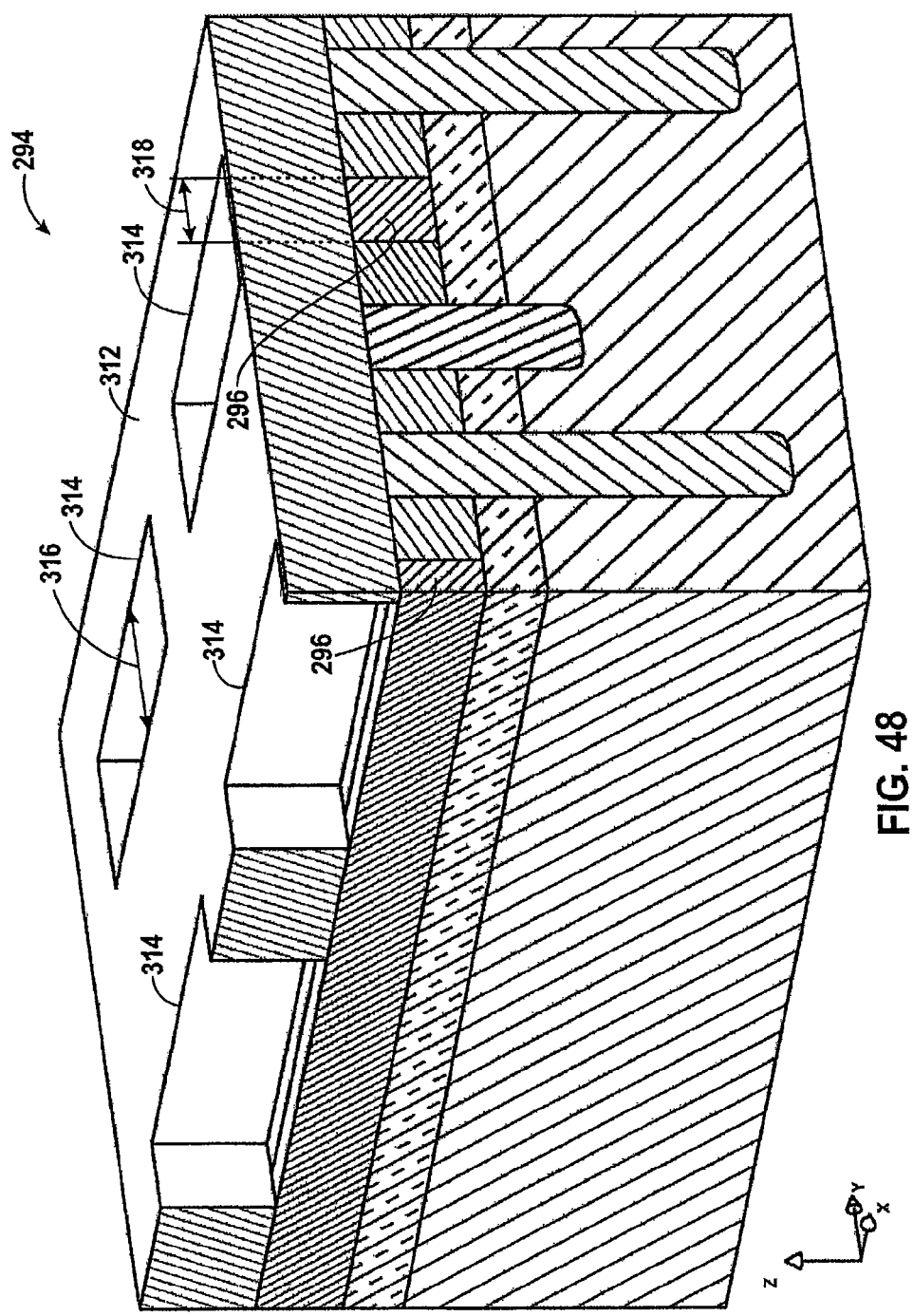

Next, in some embodiments, a second column-notch mask 312 may be formed on the substrate 294, as illustrated by FIG. 48. The second column-notch mask 312 may be a hard mask (e.g., an oxide hard mask) or it may be made of photoresist, and it may define a plurality of exposed regions 314. In this embodiment, the exposed regions 314 may be arranged in a generally rectangular lattice, but in other embodiments, they may be arranged differently, e.g., in a generally hexagonal lattice. The illustrated exposed regions 314 may define a generally cuboid volume, but in other embodiments, they may have other shapes, e.g., they may generally define a right-elliptical-cylindrical volume or a right-circular-cylindrical volume. In this embodiment, the exposed regions 314 are generally disposed over the remaining third column spacer 296 and are generally aligned with this structure. To increase alignment margins in the Y-direction, the exposed regions 314 may have a width 316 that is wider than a width 318 of the remaining third column spacer 296.

Figure 49:
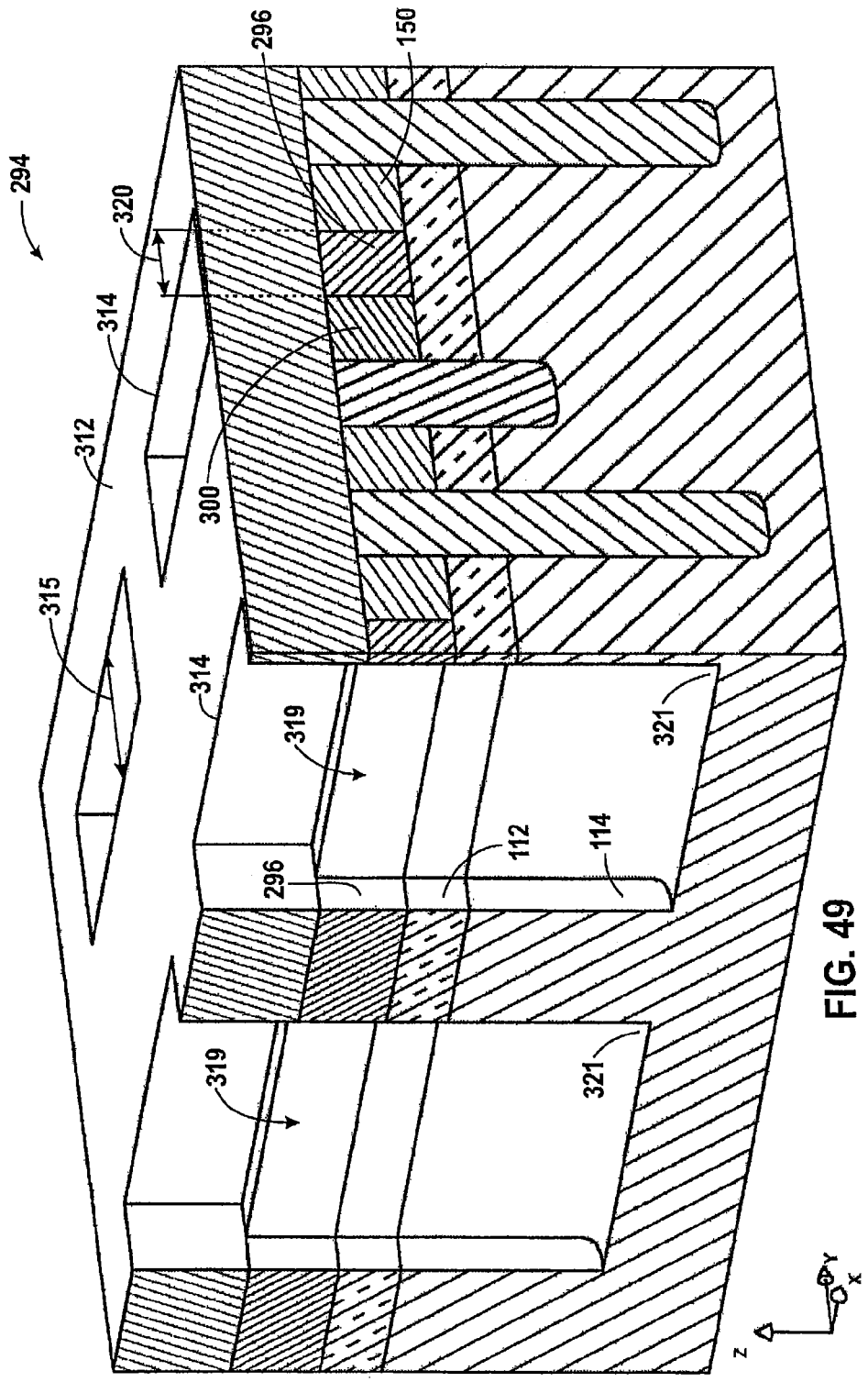

Next, as illustrated by FIG. 49, column-trench segments 319 may be formed in the substrate 294. The column-trench segments 319 may be formed in two steps. In some embodiments, a portion of the third column spacer 296 disposed under the exposed regions 314 may be removed, for example, with a TMAH wet etch or a dry etch. This portion of the third column spacer 296 may be removed with an etch that is generally selective to the third column spacer 296 and not to either the second column spacer 150 or the masking material 300. As a result of this selectivity, in some embodiments, a substantial portion of these materials 150 and 300 may remain on the substrate 294, thereby functioning as a hard mask that defines a width 320 that is narrower than the width 316 of the exposed regions 314. After forming an opening through the third column spacer 296, the remainder of the column-trench segments 319 may be formed. In some embodiments, the upper dopped region 112 and the lower doped region 114 may be generally anisotropically etched, using the second column-notch mask 312 to define features in the X-direction and both the second group of column spacers 150 and the masking material 300 to define features in the Y-direction. The column-trench segments 319 may have a width that is generally equal to the width 308 of the column notch 306.

While not shown, the bottom of one or both sides of the column-trench segment 319 may be implanted with a high Vth implant to suppress N-channel formation of parasitic devices. For example, the right side 321 of the column-trench segment 319 may be implanted with an angled implant.

Figure 50:
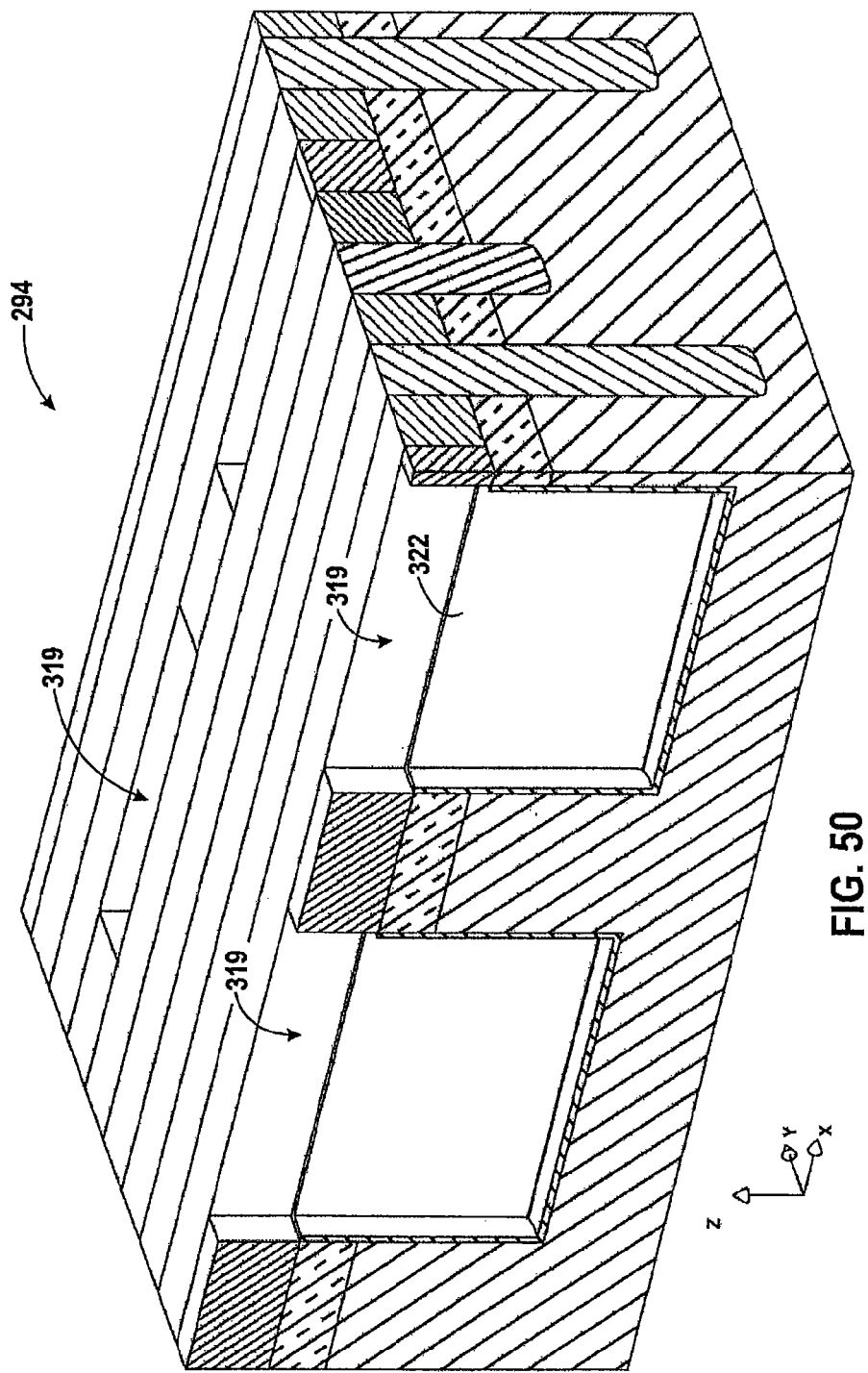

After forming the column-trench segments 319, the second column-notch mask 312 may be removed, and a column-gate dielectric 322 may be formed, as illustrated by FIG. 50. The column-gate dielectric 322 may include any of the materials described above with reference to the column-gate dielectric 164 illustrated by FIG. 21.

Figure 51:
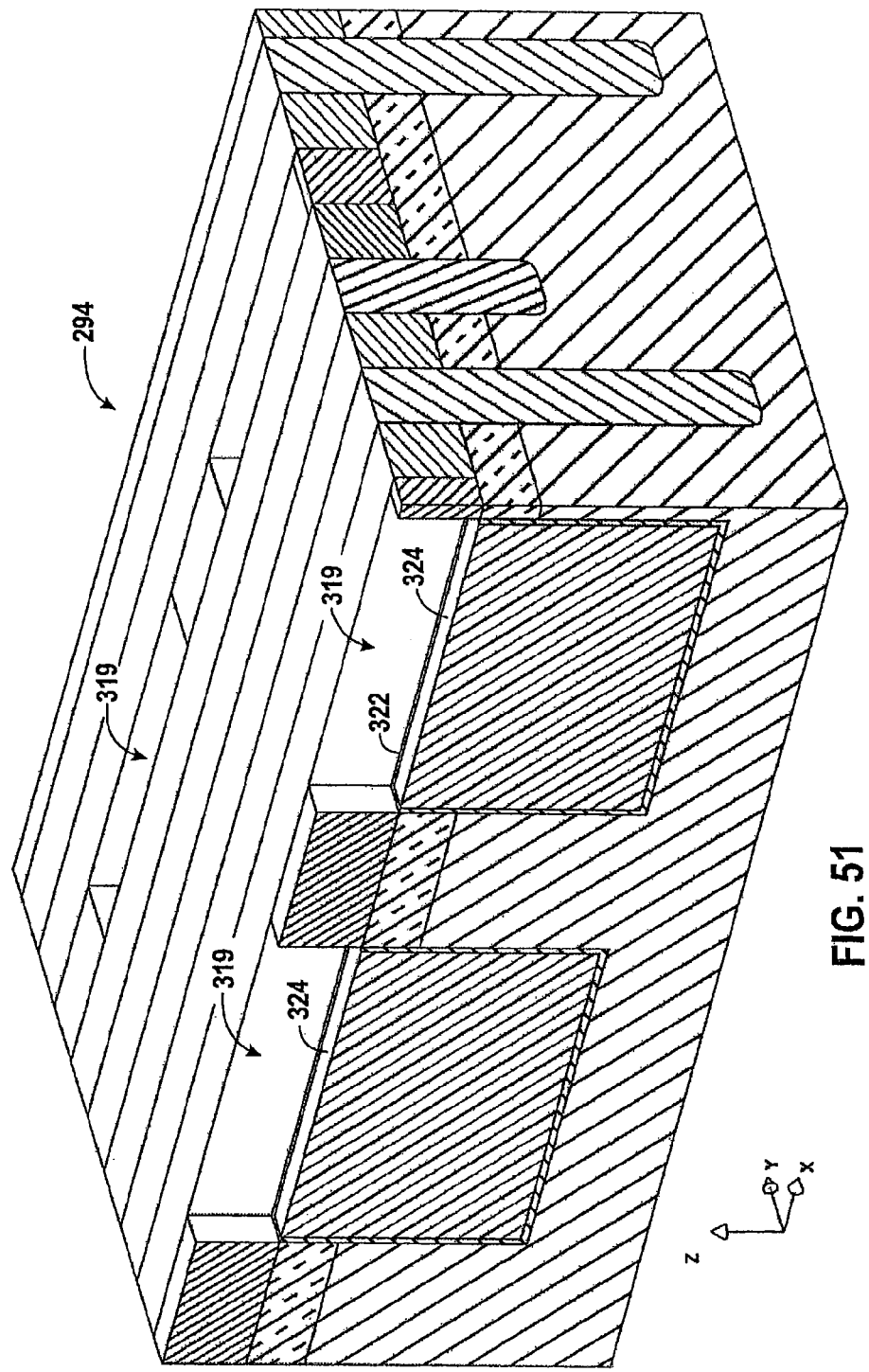

After forming the column-gate dielectric 322, column-gate segments 324 may be formed, as illustrated by FIG. 51. The column-gate segments 324 may be formed by depositing, e.g., with chemical-vapor deposition or physical-vapor deposition, a conductive material, such as a metal or doped polysilicon (e.g., an n+ doped polysilicon), on the substrate 294. In some embodiments, the conductive material may then be etched to recess the conductive material into the column-trench segments 319. The column-gate segments 324 may generally extend in the X-direction and may be generally isolated from other column-gate segments 324 at this stage of the process.

Figure 52:
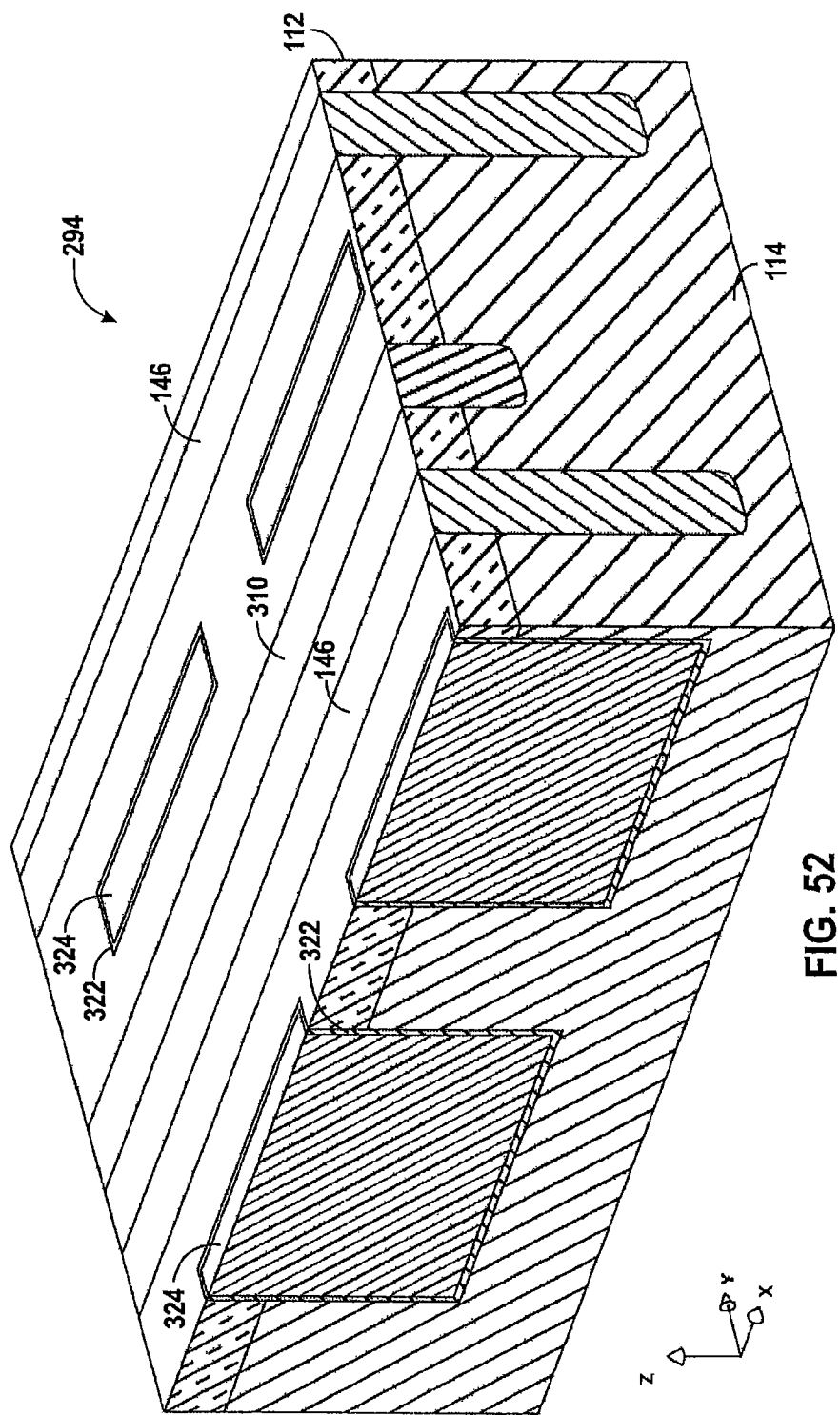

Next, the substrate 294 may be planarized, as illustrated by FIG. 52. Planarizing may include removing some or substantially all of the materials disposed above the upper doped region 112. The substrate 294 may be planarized with chemical-mechanical planarization or a generally non-selective etch, such as an alligator etch.

Figure 53:
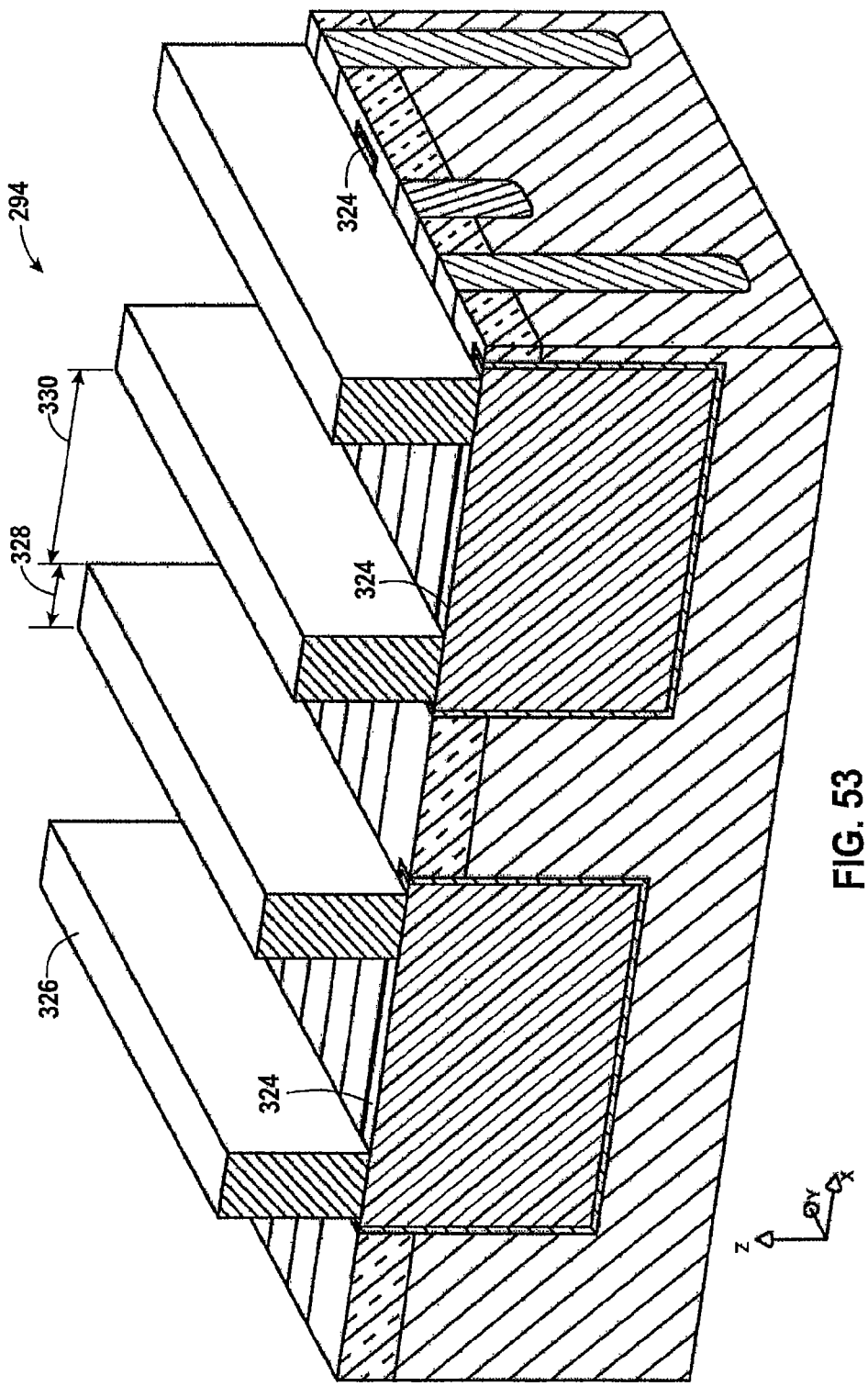

Following planarization, a row mask 326 may be formed on the substrate 294, as illustrated by FIG. 53. The row mask 326 may be a soft mask or a hard mask, and it may generally define a plurality of masked regions 328 and exposed regions 330, both of which may generally extend in the Y-direction. In some embodiments, the width of the masked regions 328 may be defined with sub-photolithographic techniques, such as double pitching or reflowing a mask formed with the photolithography. The masked regions 328 may be generally parallel to each other and generally straight, or in other embodiments, they may have other shapes, e.g., they may undulate side to side, they may be discontinuous, or they may vary in width along the Y-axis. In some embodiments, the width of the masked region 328 is generally equal to or less than F, ¾ F, or ½ F. The width 330 may be larger than the width 328, e.g., in some embodiments, the width 330 may be generally equal to F. The masked regions 328 may be generally aligned with, and partially or substantially entirely disposed over, opposite ends of the column-gate segments 324.

Figure 54:
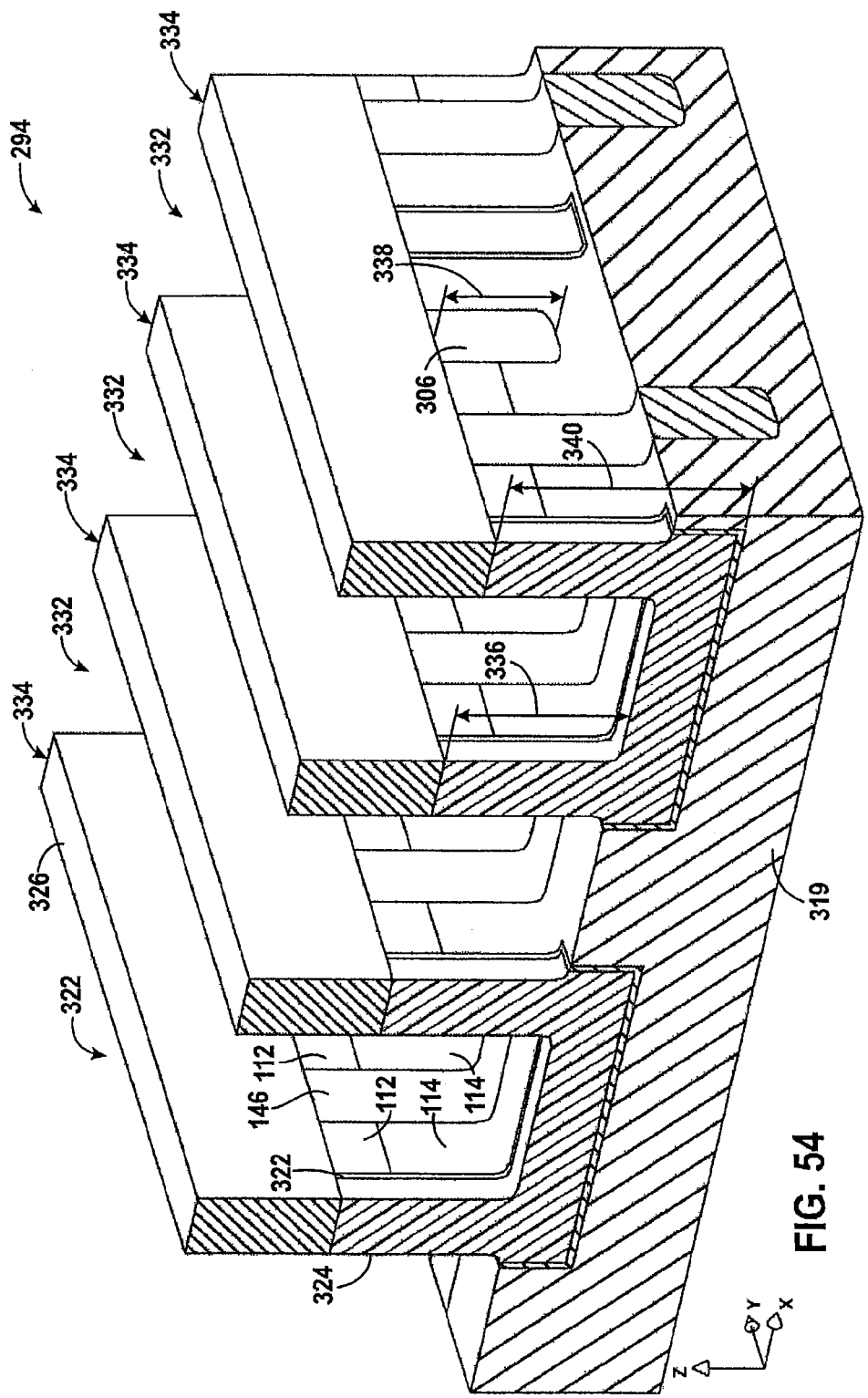

Next, row-gate trenches 332 may be formed, as illustrated by FIG. 54. The row-gate trenches 332 may be formed by generally anisotropically etching the substrate 294 between the masked regions 328. The row-gate trenches 332 may define fin rows 334. The row-gate trenches 332 may have a depth 336 that is greater than a depth 338 of the column notch 306, but in some embodiments, not as large as a depth 340 of the column-trench segments 319.

Figure 55:
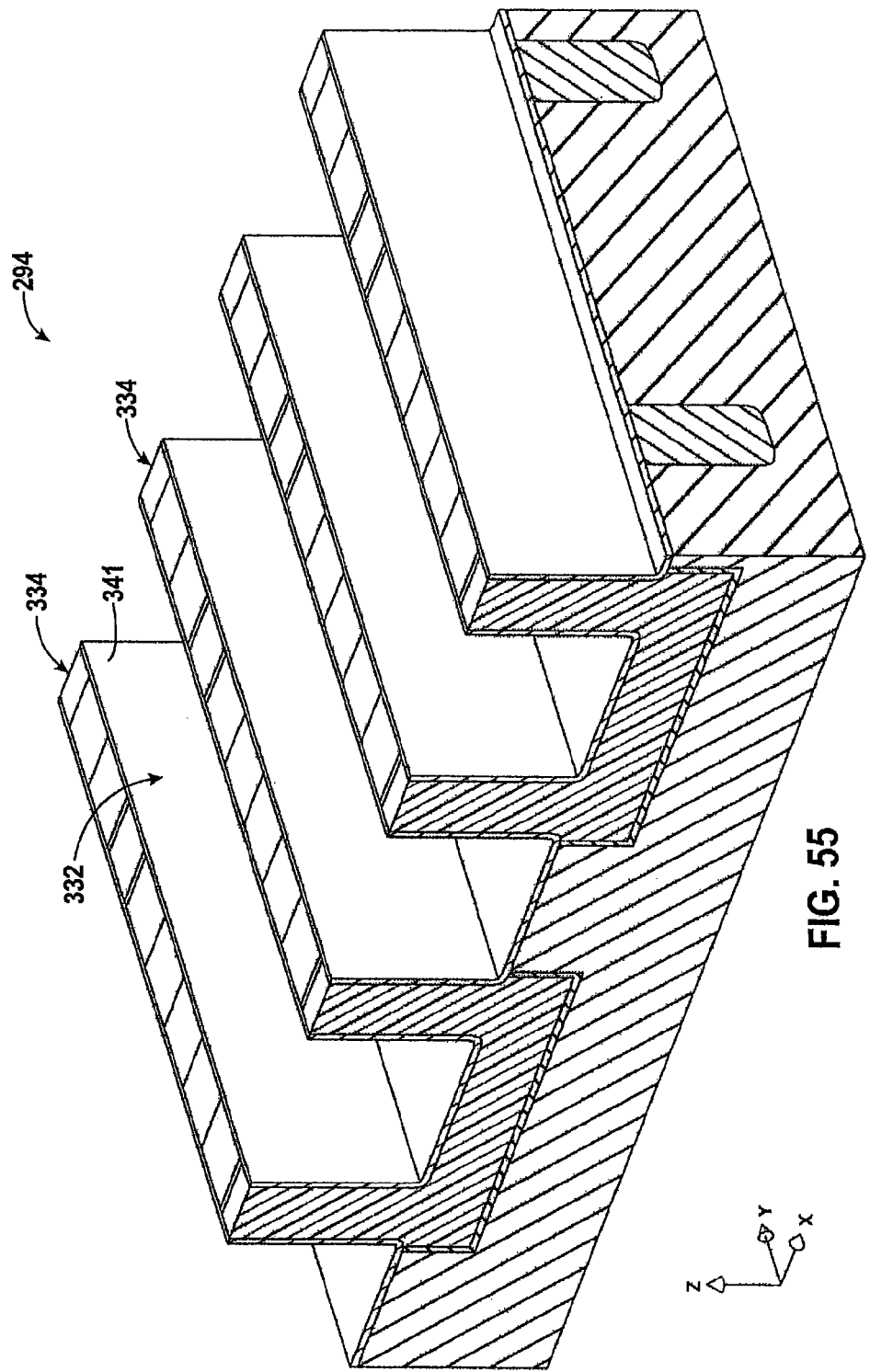

After forming the row-gate trenches 332, the row mask 326 may be removed, and a row-gate dielectric 342 may be formed on the substrate 294, as illustrated by FIG. 55. The row-gate dielectric 341 may include any of the materials described above with reference to the column-gate dielectric 164 in FIG. 21.

Figure 56:
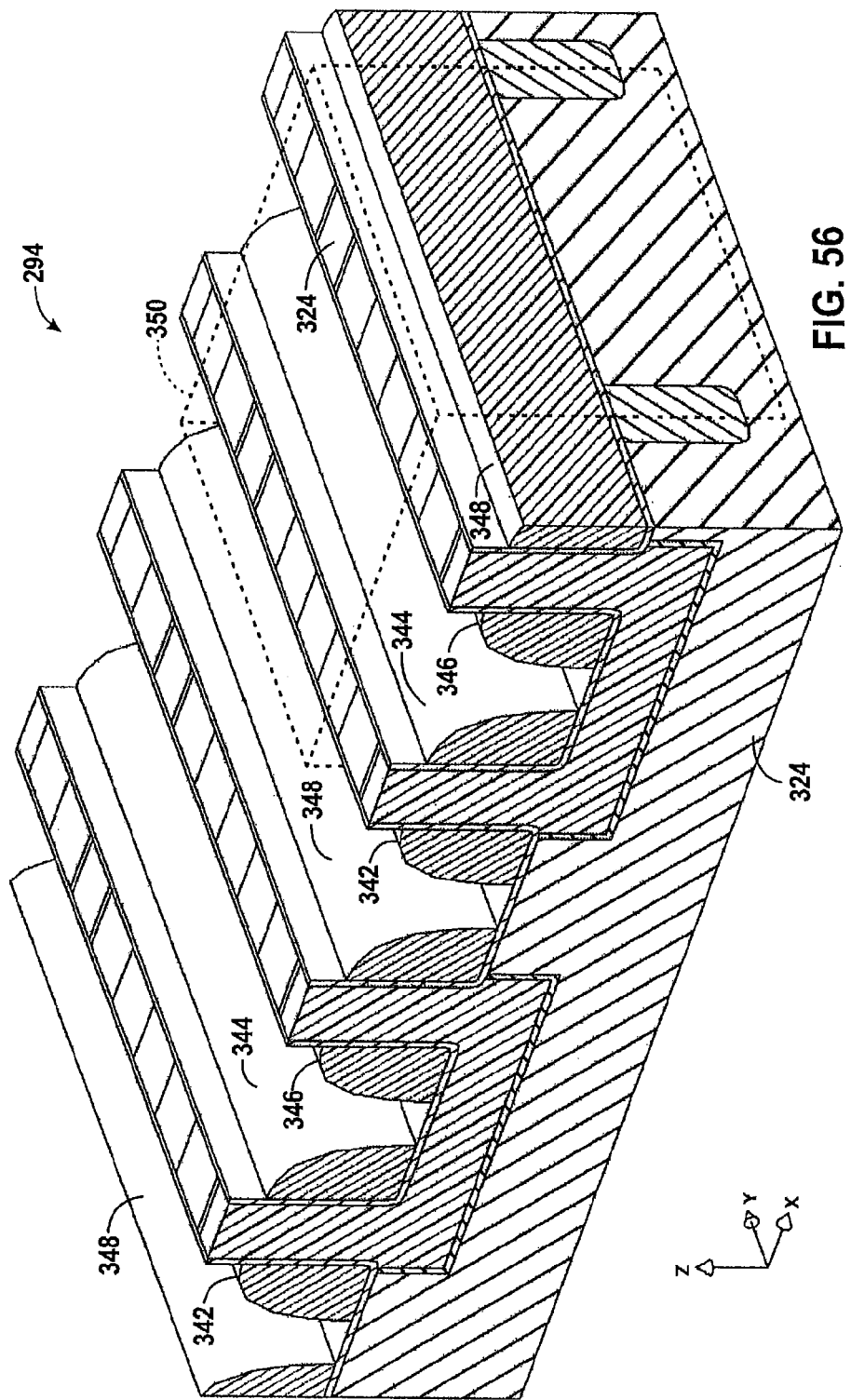

Next, row gates 342, 344, 346, and 348 may be formed, as illustrated by FIG. 56. The row gates 342, 344, 346, and 348 may be formed with a sidewall-spacer process, e.g., by depositing a blanket film of a conductive material and, then, generally anisotropically etching the conductive material to remove the conductive material from horizontal surfaces, while leaving some conductive material adjacent generally vertical surfaces. The row gates 342, 344, 346, and 348 may be made of or include a variety of conductive materials, such as metals (e.g., TiN) or doped polysilicon. The illustrated row gates 342, 344, 346, and 348 generally extend in the X-direction and may be generally perpendicular to the column-gate segments 324.

Figure 57:
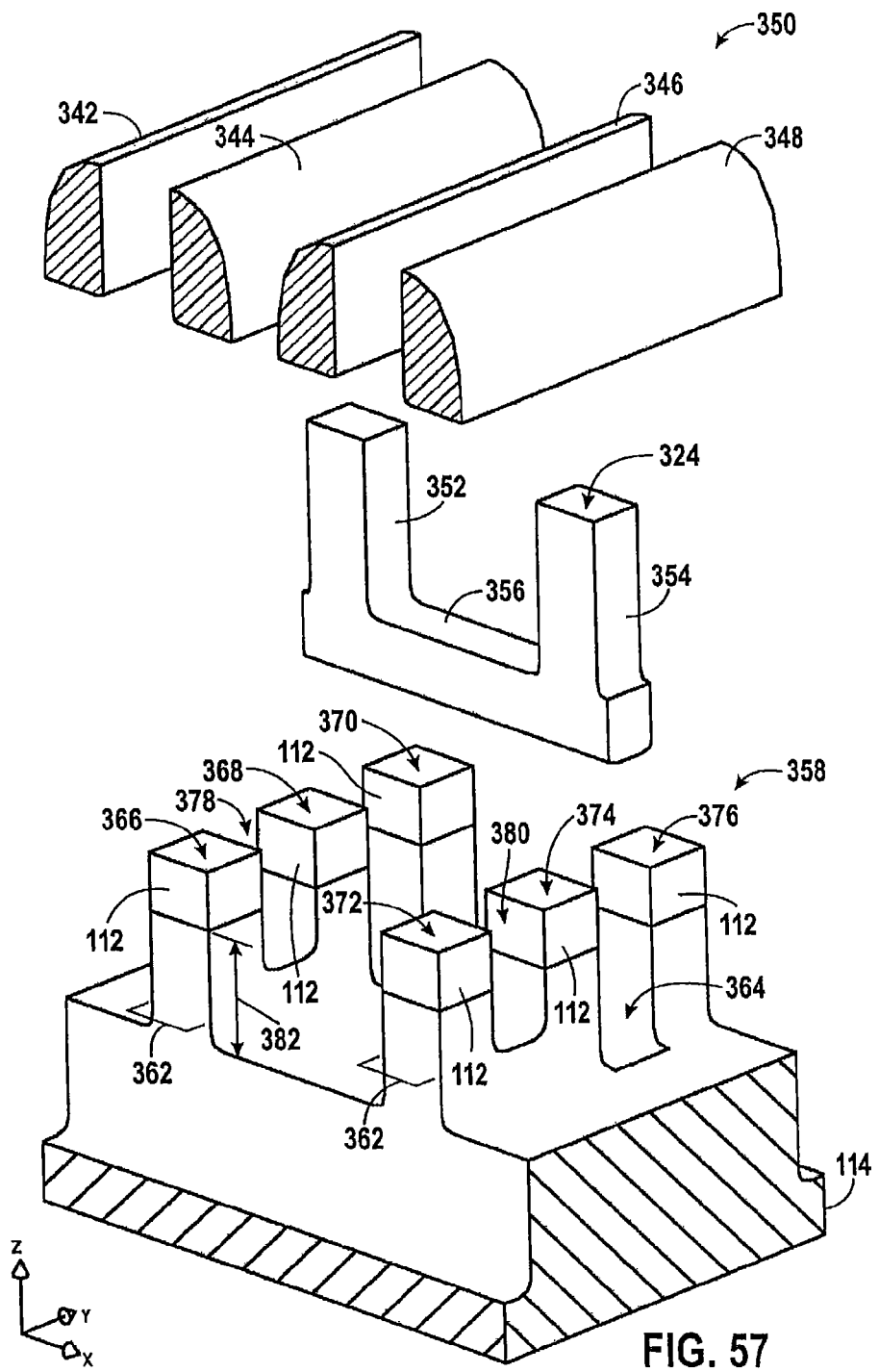

FIG. 56 illustrates an array of cells 350, and portions of an individual cell 350 are illustrated in greater detail by FIG. 57. Specifically, FIG. 57 illustrates an exploded view of the row gates 342, 344, 346, and 348, the column-gate segment 324, and a semiconductive portion 358 of the cell 350, which may be formed by the upper doped region 112 and the lower doped region 114. To clearly display these features, the insulating portions of the cell 350 are not shown in FIG. 57. The cells 350 may consume a horizontal surface area of generally equal to or less than 30 $F^2$, 25 $F^2$, or 18 $F^2$.

The column-gate segment 324 may be generally symmetric and may include risers 352 and 354 joined by a buried member 356. In some embodiments, the risers 352 and 354 may be disposed at or near opposite distal portions of the buried member 356. The risers 352 and 354 may be generally perpendicular to the buried member 356, which may extend generally horizontally in the X-direction. In some embodiments, the column-gate segment 324 may be characterized as generally having a U-shape. The column-gate segment 324 may be generally electrically isolated from other column-gate segments in other cells 350, with the exception of subsequently-formed connections. Further, in some embodiments, the column-gate segment 324 may also be generally electrically isolated from the row gates 342, 344, 346, and 348, again with the exception of some subsequently-formed connections.

The semiconductive portion 350 may include two fins 360 and 362 and a cavity 364. Each of the fins 360 and 362 may include three legs 366, 368, 370, 372, 374, and 376. In other embodiments, the fins 360 and 362 may include more or fewer legs within a single cell 350. The legs 366 and 368 and the legs 372 and 374 may be separated from one another by notches 378 and 380. These notches 378 and 380 may be deeper than the upper doped region 112, but in some embodiments, not as deep as a height 382 of the fins 360 and 362. The other legs 368 and 370 and 374 and 376 may be separated from one another by the cavity 364, which may extend beyond the height 382 of the fins 360 and 362. The shape of the cavity 364 may be generally complementary to the shape of the column-gate segment 324.

FIGS. 58-63 illustrate one way in which the cell 350 may be connected to a data element, such as the capacitor plate 274. In some embodiments, the cell 350 may be connected to the capacitor plate 274, the digit lines 260, and the voltage-source connector 268 with a modified version the process described above with reference to FIGS. 31-38. In this embodiment, the positions of the contact 266 and the lower contact 278 may be shifted relative to the data line 260 to align the contacts 266 and 278 with certain portions of the cell 350. Specifically, the data line 260 may be connected to the legs 366 and 372, and the contact 266 may connect the voltage-source connector 268 to the leg 370. The lower contact 278 may connect the cup-shaped portion 276 of the capacitor plate 274 to both the legs 374 and 376 and the riser 354 of the column-gate segment 324. Although not shown in FIGS. 58-63, the cell 350 may also include the dielectric bodies 262 and 270 and other insulators illustrated by FIG. 37.

In operation, the cell 350 may behave similar or identically to the circuit illustrated by FIG. 30. The row gates 342 and 344 may function as read control lines CL READ, and the row gates 346 and 348 may function as a write control lines CL WRITE. The fin 360 may function as the driver 252, and the fin 362 may function as the transistor 250.

Figure 61:
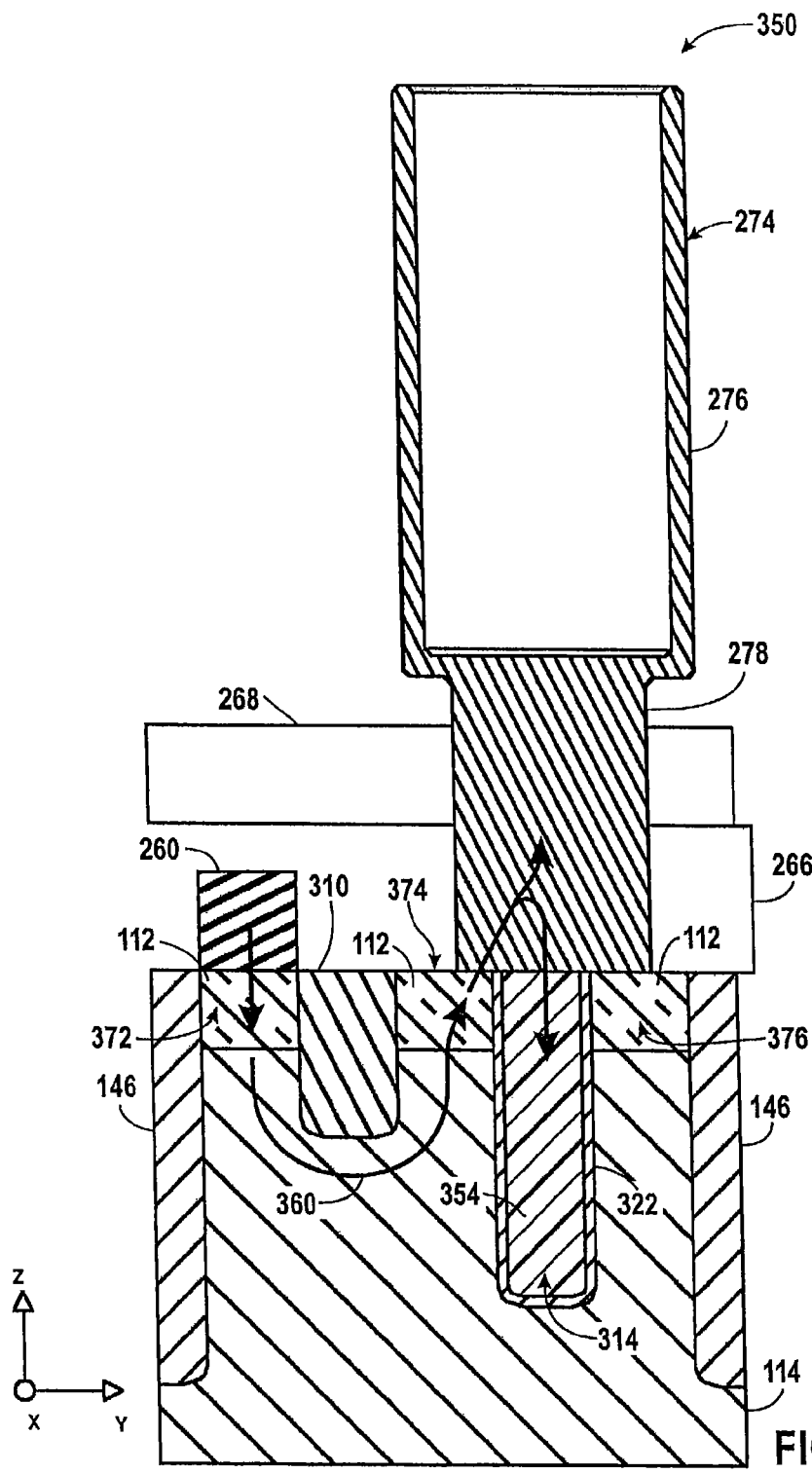
Figure 62:
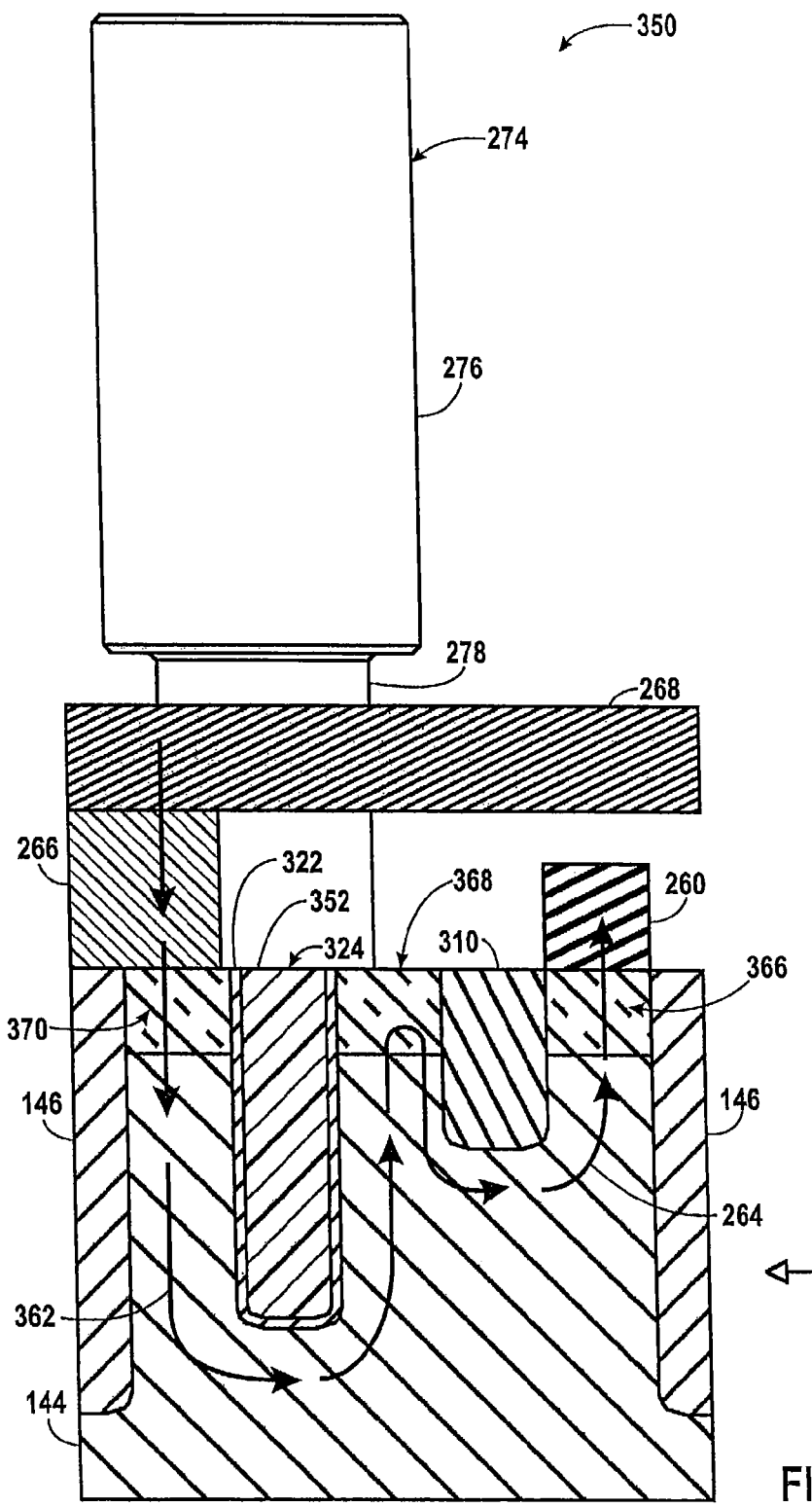
Figure 63:
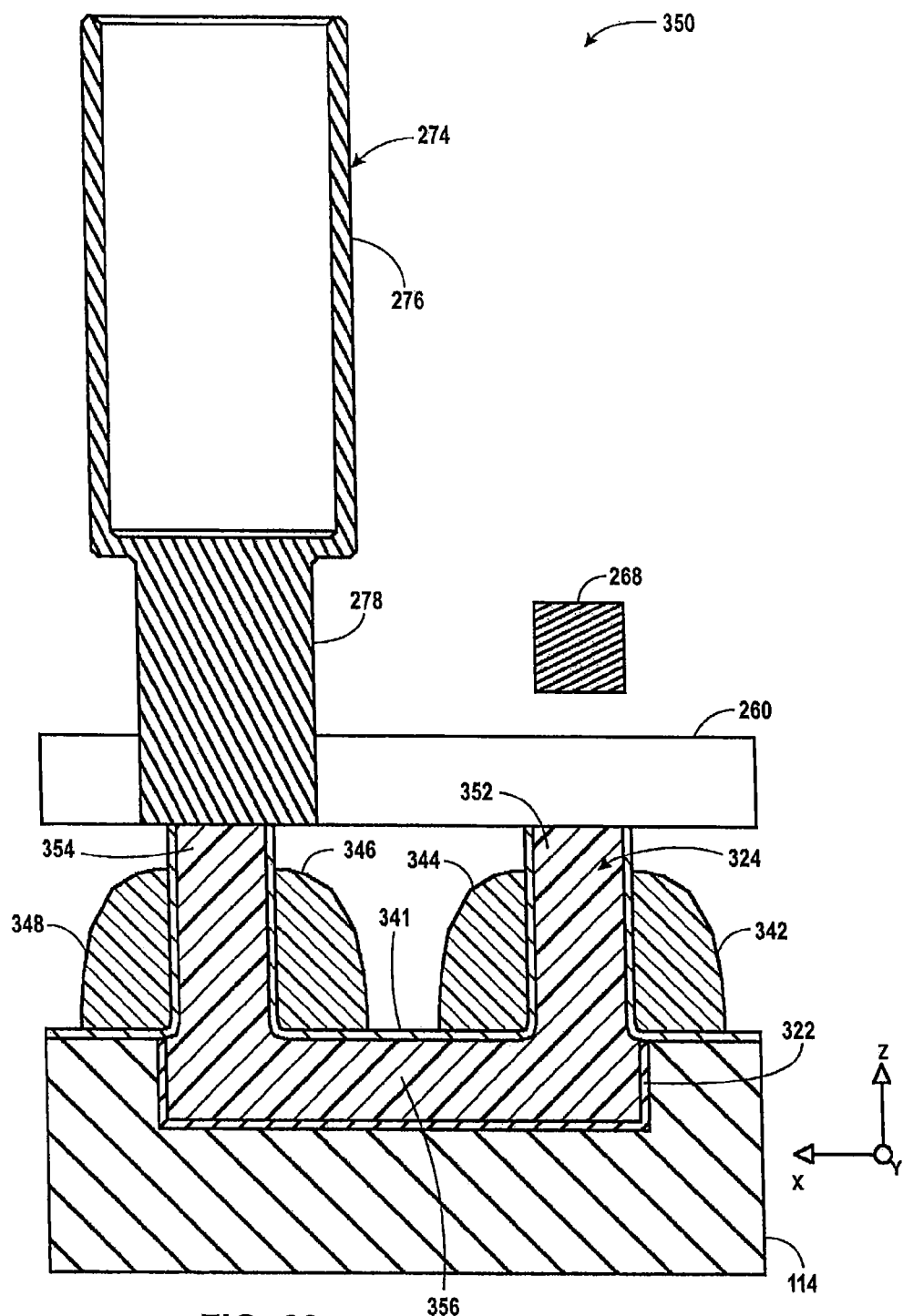

The cross-sectional views of FIGS. 61-63 illustrate current through the cell 350. To write data to the cell 350, the row gates 346 and 348 may be energized, and the capacitor plate 274 may be charged or discharged, as illustrated by FIG. 61. The charge of the capacitor plate 274 may be adjusted by a current between the capacitor plate 274 and the data line 260, as indicated by the arrow 360. The current 360 may flow from the upper doped portion 112 of the leg 372, through a channel in the lower doped portion 114, to the upper doped portion 112 of the leg 374.

Figure 58:
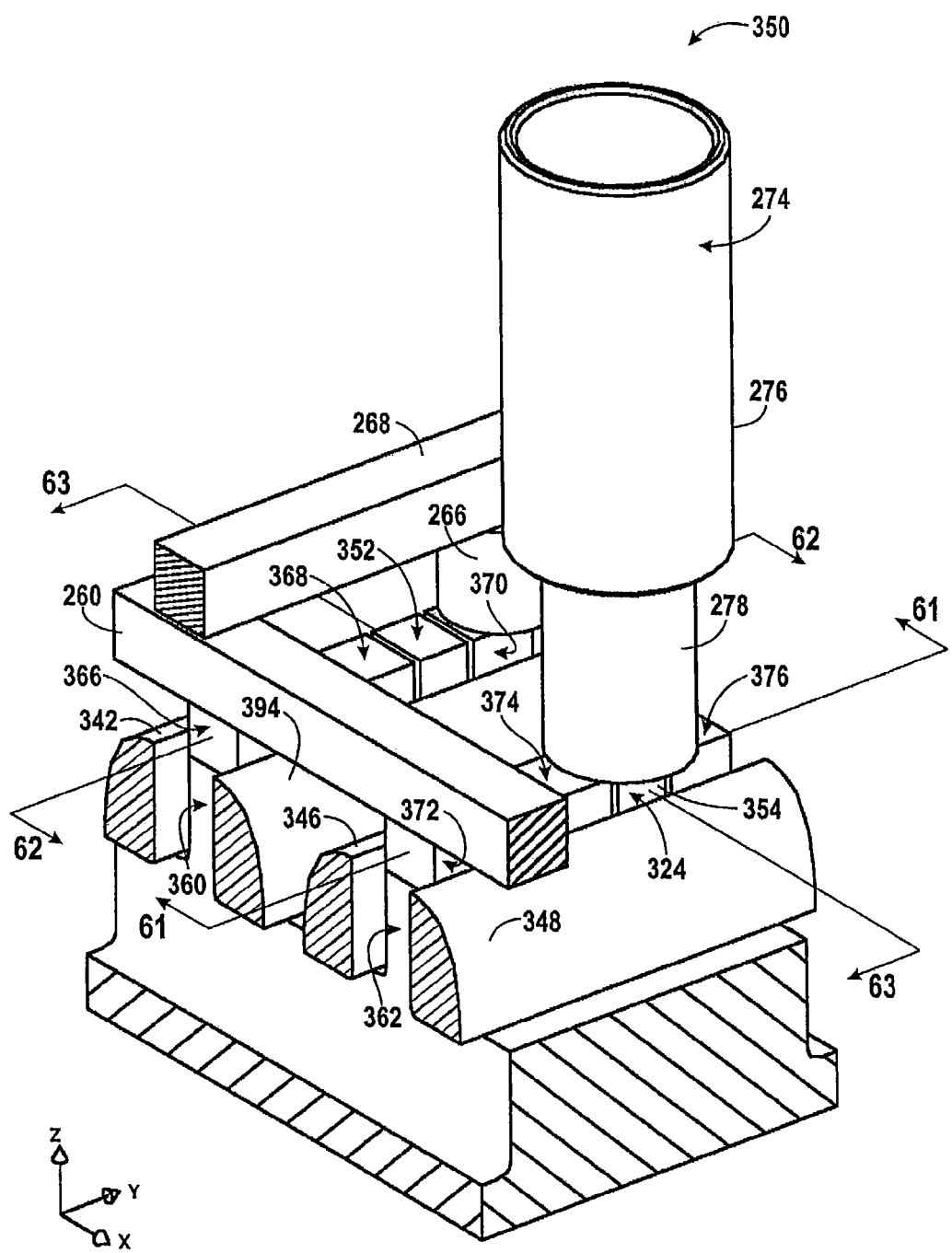
FIGS. 58-63 illustrate a data cell formed with the access device and the driver produced by the process of FIGS. 41-57.
Figure 59:
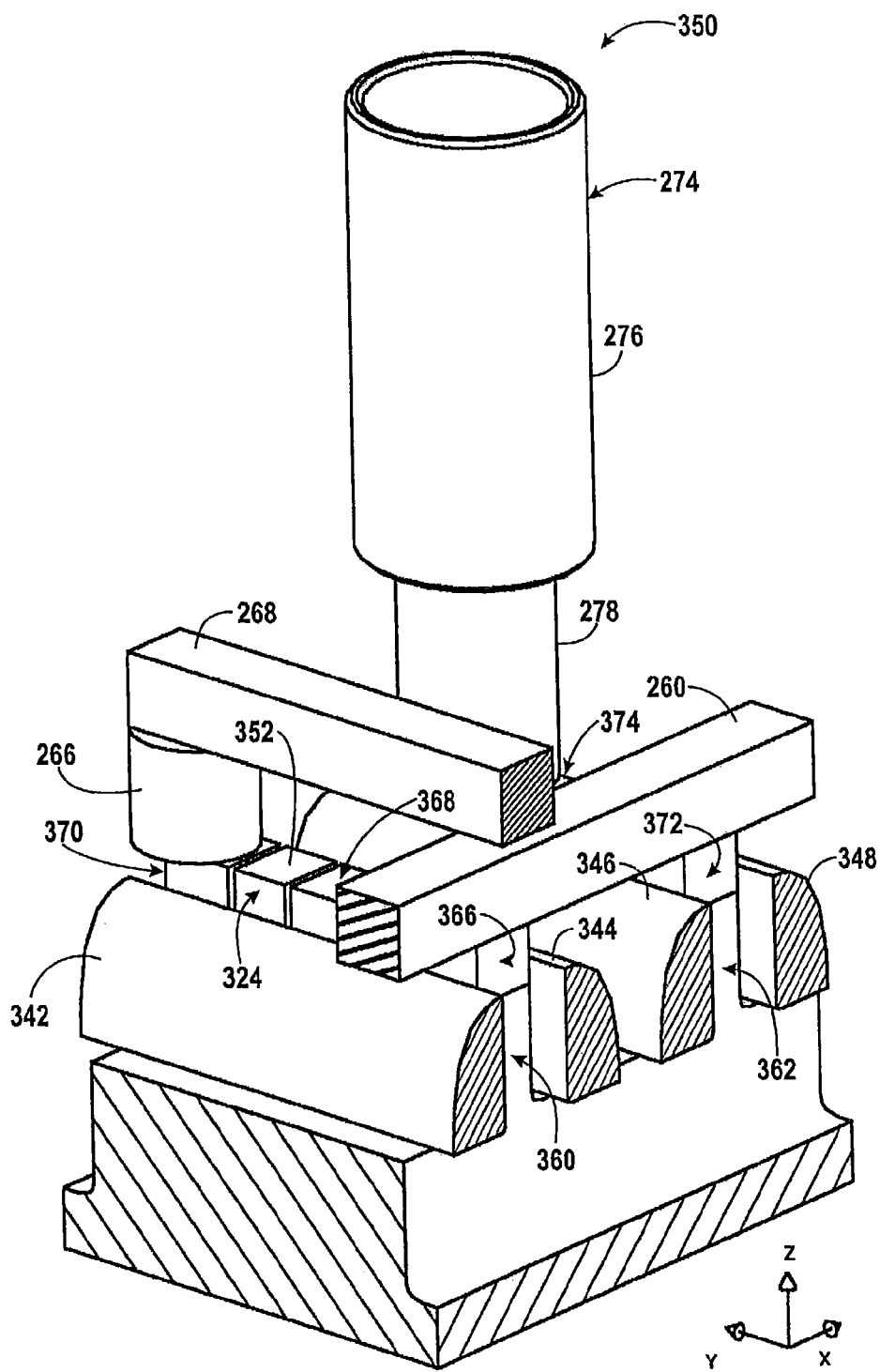
Figure 60:
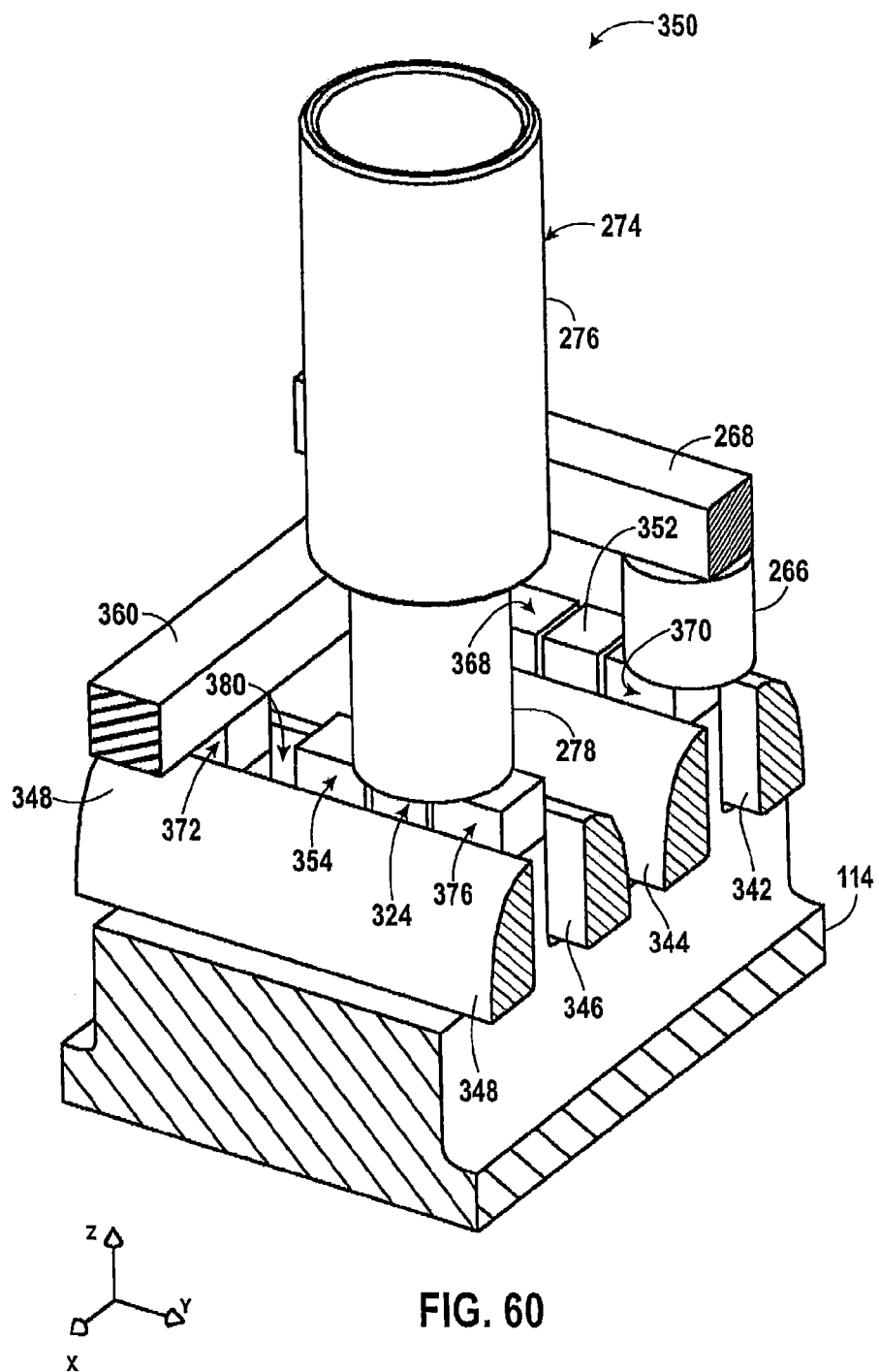

The channel in the lower doped portion 114 may be formed by electric fields emanating from the row gates 346 and 348 (FIG. 58). In some embodiments, the cell 350 may form two, generally parallel channels each adjacent one of the row gates 346 and 348 on either side of the fin 362. These channels may generally have a U-shape, as indicated by the arrow 360 in FIG. 61, and they may form a conductive path around the column-notch dielectric 310, joining the upper doped regions 112 of the legs 372 and 374.

The current 360 (FIG. 61) may flow towards or away from the capacitor plate 274, depending on the embodiment, the data value being written to the capacitor plate 274, and the data value formerly written to the capacitor plate 274. In some embodiments, a portion of this current 360 may also charge, or discharge, the column-gate segment 324. Once the charge of the capacitor 274 is adjusted to reflect the data value being written, the row gates 346 and 340 at may be de-energized, closing the conductive channel between the legs 372 and 374 and impeding the charge on the capacitor plate 274 from changing.

An example of a read operation will now be described with reference to FIGS. 62 and 63. To read data, a current between the voltage-source connector 268 and the data line 260 (or a change in voltage produced by this current) may be categorized as corresponding to a data value, e.g., 0, 1, or a multi-bit digital value. The magnitude of this current may be affected by data stored by the capacitor plate 274. The voltage of the capacitor plate 274 may correspond to (e.g., be generally the same as) the voltage of the column-gate segment 324, as this voltage may propagate through the lower contact portion 278 of the capacitor plate 274, through the riser 354 of the column-gate segment 324, across the buried member 356, and into the riser 352. This path is illustrated by the cross-sectional view of FIG. 63.

An electric field emanating from the column-gate segment 324, and more specifically, the riser 352, may establish a conductive channel that extends between the upper doped region 112 of the leg 372 and the upper doped region 112 of the leg 368. As illustrated by FIG. 62, this conductive channel may carry a current between the voltage-source connector 268 and the leg 368, as indicated by arrow 362.

When reading data, the row gates 342 and 344 may be energized, and electric fields from the use or row gates 342 and 344 may establish a channel that carries a current between the leg 368 and the leg 366, as illustrated by arrow 364. In some embodiments, energizing the row gates 342 and 344 may establish two conductive channels on either side of the fin 360, and these conductive channels may connect the upper doped regions 112 of the legs 366 and 368 by extending around the column-notch dielectric 310. The channels from the row gates 342 and 344 and the channel from the column-gate segment 324 may both generally have a U-shape, and the channels from the row gates 342 and 344 may be generally orthogonal to the channel from the column-gate segment 324.

During a read operation, current may flow between the voltage-source connector 268 and the data line 260 depending, in part, on the charge of the capacitor plate 274. If the capacitor plate 274 is charged, the column-gate segment 324 may also be charged, and an electric field from the column-gate segment 324 may form a conductive channel for the current 362. If the capacitor plate 274 is not charged, then, in some embodiments, the column-gate segment 324 may not establish a conductive channel between the legs 368 and 370, and current may not flow between the voltage-source connector 268 and the data line 260. Current flow during a read operation may also depend, in part, on the transistors formed by the legs 368 and 370, as they may establish the part of the conductive path between the voltage-source connector 268 and the data line 260 that carries the current 364.

The structure illustrated by FIGS. 58-63 may be one example of the circuit illustrated by FIG. 30. The column-gate segment 324 may drive the current 362 (FIG. 62) based on the voltage of the capacitor plate 274, functioning as the amplifying transistor 258 in the driver 215 illustrated by FIG. 30. Similarly, transistors formed by the legs 366 and 368 and the row gates 342 and 344 may function as the access transistors 254 and 256 in the driver 252 illustrated by FIG. 30. Together, they may form an AND gate.

As noted above, using a driver circuit to transmit a signal indicative of a data value is believed to facilitate the use of smaller data elements, allow for faster detection of signals from data elements, and allow for finer resolution of signals from data elements storing multi-bit data values. In some embodiments, the read is non-destrucive, e.g., the charge and corresponding data remains on the capacitor even after reading. Further, some embodiments may operate at a speed similar to SRAM. The added signal strength may also be used to lengthen the digit lines, which may reduce the number of sense amplifiers on a chip and reduce die size. In some embodiments, multiple bits may be stored on a single memory element, and the driver may amplify smaller differences in signals corresponding to the different data values. Not all embodiments will provide all of these benefits, and some embodiments may be useful for other reasons and may provide none of these benefits.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method, comprising:
   forming a plurality of trenches into semiconductive material of a substrate, and forming dielectric material in the trenches;
   after forming the dielectric material in the trenches, etching into the semiconductive material to form a plurality of trench segments in the semiconductive material between the trenches; and
   forming a plurality of fins, wherein the trench segments extend between pairs of adjacent fins but not between more than four fins.

2. The method of claim 1, wherein the trench segments do not extend between more than two adjacent fins.

3. A method, comprising:
   forming a plurality of isolation trenches in a substrate;
   forming a plurality of trench segments between the isolation trenches;
   forming a plurality of fins, wherein the trench segments extend between pairs of adjacent fins but not between more than four fins; and
   forming column gates in the trench segments before forming the plurality of fins.

4. The method of claim 3, comprising forming a notch between the isolation trenches.

5. The method of claim 1, comprising forming gates adjacent sides of the plurality of fins.

6. A method, comprising:
   forming a plurality of trenches into semiconductive material of a substrate, and forming dielectric material in the trenches;
   after forming the dielectric material in the trenches, forming a plurality of trench segments into the semiconductive material between the trenches;
   forming a plurality of fins, wherein the trench segments extend between pairs of adjacent fins but not between more than four fins; and
   forming gates adjacent sides of the plurality of fins, wherein forming the gates comprises depositing conductive material over horizontal surfaces and adjacent sides of the plurality of fins, followed by anisotropically etching the conductive material to remove the conductive material from horizontal surfaces and leave the conductive material adjacent sides of the plurality of fins.

7. The method of claim 1 comprising forming the plurality of trench segments and the plurality of trenches to be longitudinally elongated parallel one another.

8. The method of claim 3 comprising forming gate dielectric in the trench segments before forming the plurality of fins.

9. A method, comprising:
   forming a plurality of trenches into semiconductive material of a substrate, and forming dielectric material in the trenches;
   after forming the dielectric material in the trenches, forming a plurality of trench segments into the semiconductive material between the trenches; and
   forming a plurality of fins, wherein the trench segments extend between pairs of adjacent fins but not between more than four fins, the trench segments individually having a bottom comprising semiconductive material, and comprising angle ion implanting into semiconductive material at the bottoms of the plurality of trench segments to suppress formation of parasitic devices.

10. The method of claim 4 wherein the trenches are longitudinally elongated parallel one another, the notch being longitudinally elongated perpendicular the trenches.

11. The method of claim 1 wherein the etching is conducted using multiple etching steps.

12. The method of claim 1 wherein the trench segments are longitudinally elongated and the dielectric material projects outwardly of the trenches, the forming of the trench segments comprising self-aligning the trench segments laterally using spacers that are laterally against the dielectric material that projects outward of the trenches.

13. The method of claim 1 comprising conducting a threshold voltage implant into a bottom of at least one sidewall of the trench segments.

14. The method of claim 13 wherein the implant is conducted before forming the plurality of fins.

15. The method of claim 1 comprising conducting a threshold voltage implant into a bottom of opposing sidewalls of the trench segments.

16. The method of claim 15 wherein the implant is conducted before forming the plurality of fins.

17. A method, comprising:
   forming a plurality of longitudinally elongated and parallel isolation trenches into semiconductive material of a substrate, and forming dielectric material in the trenches;
   after forming the dielectric material in the trenches, etching into the semiconductive material to form a plurality of longitudinally elongated and spaced trench segments in the semiconductive material between the trenches, the trench segments extending longitudinally parallel the isolation trenches; and
   forming a plurality of fins, wherein the trench segments extend between pairs of adjacent fins but not between more than four fins.

18. The method of claim 11 wherein the etching comprises use of TMAH.

* * * * *